US009274333B2

(12) United States Patent
Hagood, IV et al.

(10) Patent No.: US 9,274,333 B2
(45) Date of Patent: *Mar. 1, 2016

(54) ALIGNMENT METHODS IN FLUID-FILLED MEMS DISPLAYS

(75) Inventors: Nesbitt W. Hagood, IV, Wellesley, MA (US); John J. Fijol, Shrewsbury, MA (US); Jasper Lodewyk Steyn, Winchester, MA (US); Richard S. Payne, Andover, MA (US); Jignesh Gandhi, Burlington, MA (US)

(73) Assignee: Pixtronix, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/599,734

(22) Filed: Aug. 30, 2012

(65) Prior Publication Data

US 2013/0010341 A1     Jan. 10, 2013

Related U.S. Application Data

(63) Continuation of application No. 11/975,397, filed on Oct. 19, 2007, and a continuation-in-part of application No. 11/656,307, filed on Jan. 19, 2007, now Pat. No. 7,502,159, which is a (Continued)

(51) Int. Cl.
*H01L 33/00* (2010.01)
*G09G 3/34* (2006.01)
(Continued)

(52) U.S. Cl.
CPC ............ *G02B 26/0841* (2013.01); *B81C 3/004* (2013.01); *G09G 3/3473* (2013.01);
(Continued)

(58) Field of Classification Search
CPC .................... H01L 2924/1461; G02B 26/00

USPC ................... 257/88, 98, E33.071; 359/230
See application file for complete search history.

(56) References Cited

U.S. PATENT DOCUMENTS 3,864,582 A   2/1975   Keeler
4,067,043 A   1/1978   Perry (Continued)

FOREIGN PATENT DOCUMENTS

CA   2241823 A1   8/1997
CA   2334403 A1   12/1999

(Continued)

OTHER PUBLICATIONS

Akimoto O. et al., "15.1: A 0.9-in UXGA/HDTV FLC Microdisplay," Society for Information Display, 2000, pp. 194-197.

(Continued)

*Primary Examiner* — Zandra Smith
*Assistant Examiner* — Jamie C Niesz
(74) *Attorney, Agent, or Firm* — Edward A. Gordon; Foley & Lardner LLP

(57) ABSTRACT

This application relates to a display including a first layer of material including a first aperture having at least one side, a first substrate separated from the first layer of material by a gap, where the first substrate is arranged to pass through a portion of light emitted from a light source into the gap. The display further includes a movable shutter arranged within the gap, where the shutter is movable to at least a first position and a second position, to obstruct passage of the portion of light through the first aperture at the first position. The movable shutter has a first edge, and in the first position, the movable shutter is aligned with the first aperture such that the first edge extends a first length past the at least one side of the first aperture.

18 Claims, 29 Drawing Sheets

Related U.S. Application Data continuation-in-part of application No. 11/251,035, filed on Oct. 14, 2005, now Pat. No. 7,271,945, which is a continuation-in-part of application No. 11/218,690, filed on Sep. 2, 2005, now Pat. No. 7,417,782, said application No. 11/975,397 is a continuation-in-part of application No. 11/218,690.

(60) Provisional application No. 60/930,872, filed on May 18, 2007, provisional application No. 60/676,053, filed on Apr. 29, 2005, provisional application No. 60/655,827, filed on Feb. 23, 2005.

(51) Int. Cl.
*G02B 26/08* (2006.01)
*B81C 3/00* (2006.01)

(52) U.S. Cl.
CPC ... *B81B2201/047* (2013.01); *B81B 2203/0315* (2013.01); *B81C 2203/019* (2013.01); *B81C 2203/0118* (2013.01); *B81C 2203/051* (2013.01); *G09G 2300/023* (2013.01); *G09G 2300/0426* (2013.01); *G09G 2300/0443* (2013.01); *G09G 2300/0842* (2013.01)

(56) References Cited

U.S. PATENT DOCUMENTS

| | | |
|---|---|---|
| 4,074,253 A | 2/1978 | Nadir |
| 4,421,381 A | 12/1983 | Ueda et al. |
| 4,559,535 A | 12/1985 | Watkins et al. |
| 4,563,836 A | 1/1986 | Woodruff et al. |
| 4,564,836 A | 1/1986 | Vuilleumier et al. |
| 4,582,396 A | 4/1986 | Bos et al. |
| 4,673,253 A | 6/1987 | Tanabe et al. |
| 4,728,936 A | 3/1988 | Guscott et al. |
| 4,744,640 A | 5/1988 | Phillips |
| 4,889,603 A | 12/1989 | DiSanto et al. |
| 4,958,911 A | 9/1990 | Beiswenger et al. |
| 4,991,941 A | 2/1991 | Kalmanash |
| 5,005,108 A | 4/1991 | Pristash et al. |
| 5,025,346 A | 6/1991 | Tang et al. |
| 5,025,356 A | 6/1991 | Gawad |
| 5,042,900 A | 8/1991 | Parker |
| 5,044,734 A | 9/1991 | Sperl et al. |
| 5,050,946 A | 9/1991 | Hathaway et al. |
| 5,061,049 A | 10/1991 | Hornbeck |
| 5,062,689 A * | 11/1991 | Koehler ............ 359/230 |
| 5,078,479 A | 1/1992 | Vuilleumier |
| 5,093,652 A | 3/1992 | Bull et al. |
| 5,096,279 A | 3/1992 | Hornbeck et al. |
| 5,128,787 A | 7/1992 | Blonder |
| 5,136,480 A | 8/1992 | Pristash et al. |
| 5,136,751 A | 8/1992 | Coyne et al. |
| 5,142,405 A | 8/1992 | Hornbeck |
| 5,184,248 A | 2/1993 | De Vaan et al. |
| 5,184,428 A | 2/1993 | Feldt et al. |
| 5,198,730 A | 3/1993 | Vancil |
| 5,202,950 A | 4/1993 | Arego et al. |
| 5,233,385 A | 8/1993 | Sampsell |
| 5,233,459 A | 8/1993 | Bozler et al. |
| 5,245,454 A | 9/1993 | Blonder |
| 5,266,612 A | 11/1993 | Kim et al. |
| 5,278,652 A | 1/1994 | Urbanus et al. |
| 5,280,277 A | 1/1994 | Hornbeck |
| 5,319,061 A | 6/1994 | Ramaswamy |
| 5,319,491 A | 6/1994 | Selbrede |
| 5,339,116 A | 8/1994 | Urbanus et al. |
| 5,339,179 A | 8/1994 | Rudisill et al. |
| 5,359,345 A | 10/1994 | Hunter |
| 5,379,135 A | 1/1995 | Nakagaki et al. |
| 5,393,710 A | 2/1995 | Park et al. |
| 5,396,350 A | 3/1995 | Beeson et al. |
| 5,405,490 A | 4/1995 | Park et al. |
| 5,416,631 A | 5/1995 | Yagi |
| 5,440,197 A | 8/1995 | Gleckman |
| 5,452,024 A | 9/1995 | Sampsell |
| 5,461,411 A | 10/1995 | Florence et al. |
| 5,465,175 A | 11/1995 | Woodgate et al. |
| 5,467,104 A | 11/1995 | Furness, III |
| 5,477,086 A | 12/1995 | Rostoker et al. |
| 5,479,279 A | 12/1995 | Barbier et al. |
| 5,491,347 A | 2/1996 | Allen et al. |
| 5,493,439 A | 2/1996 | Engle |
| 5,497,172 A | 3/1996 | Doherty et al. |
| 5,497,258 A | 3/1996 | Ju et al. |
| 5,499,127 A | 3/1996 | Tsubota et al. |
| 5,504,389 A | 4/1996 | Dickey |
| 5,504,614 A | 4/1996 | Webb et al. |
| 5,510,824 A | 4/1996 | Nelson |
| 5,517,341 A | 5/1996 | Kim et al. |
| 5,517,347 A | 5/1996 | Sampsell |
| 5,519,240 A | 5/1996 | Suzuki |
| 5,519,565 A | 5/1996 | Kalt et al. |
| 5,523,803 A | 6/1996 | Urbanus et al. |
| 5,526,051 A | 6/1996 | Gove et al. |
| 5,528,262 A | 6/1996 | McDowall et al. |
| 5,548,301 A | 8/1996 | Kornher et al. |
| 5,548,670 A | 8/1996 | Koike |
| 5,552,925 A | 9/1996 | Worley |
| 5,559,389 A | 9/1996 | Spindt et al. |
| 5,568,964 A | 10/1996 | Parker et al. |
| 5,578,185 A | 11/1996 | Bergeron et al. |
| 5,579,035 A | 11/1996 | Beiswenger |
| 5,579,240 A | 11/1996 | Buus |
| 5,591,049 A | 1/1997 | Dohnishi |
| 5,596,339 A | 1/1997 | Furness, III |
| 5,596,369 A | 1/1997 | Chau |
| 5,613,751 A | 3/1997 | Parker et al. |
| 5,618,096 A | 4/1997 | Parker et al. |
| 5,619,266 A | 4/1997 | Tomita et al. |
| 5,622,612 A | 4/1997 | Mihara et al. |
| 5,629,784 A | 5/1997 | Abileah et al. |
| 5,629,787 A | 5/1997 | Tsubota et al. |
| 5,655,832 A | 8/1997 | Pelka et al. |
| 5,655,838 A | 8/1997 | Ridley et al. |
| 5,659,327 A | 8/1997 | Furness, III |
| 5,663,917 A | 9/1997 | Oka et al. |
| 5,666,226 A | 9/1997 | Ezra et al. |
| 5,677,749 A | 10/1997 | Tsubota et al. |
| 5,684,354 A | 11/1997 | Gleckman |
| 5,687,465 A | 11/1997 | Hinata et al. |
| 5,691,695 A | 11/1997 | Lahiff |
| 5,694,227 A | 12/1997 | Starkweather |
| 5,724,062 A | 3/1998 | Hunter |
| 5,731,802 A | 3/1998 | Aras et al. |
| 5,745,193 A | 4/1998 | Urbanus et al. |
| 5,745,203 A | 4/1998 | Valliath et al. |
| 5,745,281 A * | 4/1998 | Yi et al. ............ 359/290 |
| 5,745,284 A | 4/1998 | Goldberg et al. |
| 5,771,321 A | 6/1998 | Stern |
| 5,781,331 A | 7/1998 | Carr et al. |
| 5,781,333 A | 7/1998 | Lanzillotta et al. |
| 5,784,189 A | 7/1998 | Bozler et al. |
| 5,794,761 A | 8/1998 | Renaud et al. |
| 5,798,746 A | 8/1998 | Koyama |
| 5,801,792 A | 9/1998 | Smith et al. |
| 5,808,800 A | 9/1998 | Handschy et al. |
| 5,810,469 A | 9/1998 | Weinreich |
| 5,815,134 A | 9/1998 | Nishi |
| 5,835,255 A | 11/1998 | Miles |
| 5,835,256 A | 11/1998 | Huibers |
| 5,854,872 A | 12/1998 | Tai |
| 5,867,302 A | 2/1999 | Fleming |
| 5,876,107 A | 3/1999 | Parker et al. |
| 5,884,872 A | 3/1999 | Greenhalgh |
| 5,889,625 A | 3/1999 | Chen et al. |
| 5,894,686 A | 4/1999 | Parker et al. |
| 5,895,115 A | 4/1999 | Parker et al. |
| 5,917,692 A | 6/1999 | Schmitz et al. |
| 5,921,652 A | 7/1999 | Parker et al. |
| 5,923,480 A | 7/1999 | Labeye |
| 5,926,591 A | 7/1999 | Labeye et al. |

(56) References Cited

U.S. PATENT DOCUMENTS

| | | | |
|---|---|---|---|
| 5,936,596 A | 8/1999 | Yoshida et al. |
| 5,943,223 A | 8/1999 | Pond |
| 5,953,469 A | 9/1999 | Zhou |
| 5,959,763 A | 9/1999 | Bozler et al. |
| 5,963,367 A | 10/1999 | Aksyuk et al. |
| 5,973,727 A | 10/1999 | McGrew et al. |
| 5,975,711 A | 11/1999 | Parker et al. |
| 5,986,628 A | 11/1999 | Tuenge et al. |
| 5,986,796 A | 11/1999 | Miles |
| 5,986,828 A | 11/1999 | Wood et al. |
| 5,990,990 A | 11/1999 | Crabtree |
| 5,994,204 A | 11/1999 | Young et al. |
| 5,995,688 A | 11/1999 | Aksyuk et al. |
| 6,008,781 A | 12/1999 | Furness, III |
| 6,008,929 A | 12/1999 | Akimoto et al. |
| 6,028,656 A | 2/2000 | Buhrer et al. |
| 6,030,089 A | 2/2000 | Parker et al. |
| 6,034,807 A | 3/2000 | Little et al. |
| 6,040,796 A | 3/2000 | Matsugatani et al. |
| 6,040,937 A | 3/2000 | Miles |
| 6,046,836 A | 4/2000 | Tuchman |
| 6,046,840 A | 4/2000 | Huibers |
| 6,049,317 A | 4/2000 | Thompson et al. |
| 6,055,090 A | 4/2000 | Miles |
| 6,069,676 A | 5/2000 | Yuyama |
| 6,079,838 A | 6/2000 | Parker et al. |
| 6,111,560 A | 8/2000 | May |
| 6,130,527 A | 10/2000 | Bontempo et al. |
| 6,130,735 A | 10/2000 | Hatanaka et al. |
| 6,137,313 A | 10/2000 | Wong et al. |
| 6,154,586 A | 11/2000 | MacDonald et al. |
| 6,158,867 A | 12/2000 | Parker et al. |
| 6,162,657 A | 12/2000 | Schiele et al. |
| 6,168,395 B1 | 1/2001 | Quenzer et al. |
| 6,172,657 B1 | 1/2001 | Kamakura et al. |
| 6,172,797 B1 | 1/2001 | Huibers |
| 6,174,064 B1 | 1/2001 | Kalantar et al. |
| 6,195,196 B1 | 2/2001 | Kimura et al. |
| 6,201,633 B1 | 3/2001 | Peeters et al. |
| 6,201,664 B1 | 3/2001 | Le et al. |
| 6,206,550 B1 | 3/2001 | Fukushima et al. |
| 6,215,536 B1 | 4/2001 | Ebihara et al. |
| 6,219,119 B1 | 4/2001 | Nakai |
| 6,225,991 B1 | 5/2001 | McKnight |
| 6,227,677 B1 | 5/2001 | Willis |
| 6,239,777 B1 | 5/2001 | Sugahara et al. |
| 6,249,169 B1 | 6/2001 | Okada |
| 6,249,269 B1 | 6/2001 | Blalock et al. |
| 6,249,370 B1 | 6/2001 | Takeuchi et al. |
| 6,266,240 B1 | 7/2001 | Urban et al. |
| 6,275,320 B1 | 8/2001 | Dhuler et al. |
| 6,282,951 B1 | 9/2001 | Loga et al. |
| 6,285,270 B1 | 9/2001 | Lane et al. |
| 6,288,824 B1 * | 9/2001 | Kastalsky ............. 359/254 |
| 6,288,829 B1 | 9/2001 | Kimura |
| 6,295,054 B1 | 9/2001 | McKnight |
| 6,296,383 B1 | 10/2001 | Henningsen |
| 6,296,838 B1 | 10/2001 | Bindra et al. |
| 6,300,154 B2 | 10/2001 | Clark et al. |
| 6,300,294 B1 | 10/2001 | Robbins et al. |
| 6,317,103 B1 | 11/2001 | Furness, III |
| 6,323,834 B1 | 11/2001 | Colgan et al. |
| 6,329,967 B1 | 12/2001 | Little et al. |
| 6,329,971 B2 | 12/2001 | McKnight |
| 6,329,974 B1 | 12/2001 | Walker et al. |
| 6,360,033 B1 | 3/2002 | Lee et al. |
| 6,367,940 B1 | 4/2002 | Parker et al. |
| 6,388,661 B1 | 5/2002 | Richards |
| 6,392,736 B1 | 5/2002 | Furukawa et al. |
| 6,402,335 B1 | 6/2002 | Kalantar et al. |
| 6,402,355 B1 | 6/2002 | Kinouchi |
| 6,404,942 B1 | 6/2002 | Edwards et al. |
| 6,407,851 B1 | 6/2002 | Islam et al. |
| 6,411,423 B2 | 6/2002 | Ham |
| 6,424,329 B1 | 7/2002 | Okita |
| 6,424,388 B1 | 7/2002 | Colgan et al. |
| 6,428,173 B1 | 8/2002 | Dhuler et al. |
| 6,429,625 B1 | 8/2002 | LeFevre et al. |
| 6,429,628 B2 | 8/2002 | Nakagawa |
| 6,459,467 B1 | 10/2002 | Hashimoto et al. |
| 6,471,879 B2 | 10/2002 | Hanson et al. |
| 6,473,220 B1 | 10/2002 | Clikeman et al. |
| 6,476,886 B2 | 11/2002 | Krusius et al. |
| 6,483,613 B1 | 11/2002 | Woodgate et al. |
| 6,486,997 B1 | 11/2002 | Bruzzone et al. |
| 6,498,685 B1 | 12/2002 | Johnson |
| 6,504,985 B2 | 1/2003 | Parker et al. |
| 6,507,138 B1 | 1/2003 | Rodgers et al. |
| 6,508,563 B2 | 1/2003 | Parker et al. |
| 6,514,111 B2 | 2/2003 | Ebihara et al. |
| 6,523,961 B2 | 2/2003 | Ilkov et al. |
| 6,529,250 B1 | 3/2003 | Murakami et al. |
| 6,529,265 B1 | 3/2003 | Henningsen |
| 6,531,329 B2 | 3/2003 | Asakura et al. |
| 6,531,947 B1 | 3/2003 | Weaver et al. |
| 6,532,044 B1 | 3/2003 | Conner et al. |
| 6,535,256 B1 | 3/2003 | Ishihara et al. |
| 6,535,311 B1 | 3/2003 | Lindquist |
| 6,556,258 B1 | 4/2003 | Yoshida et al. |
| 6,556,261 B1 | 4/2003 | Krusius et al. |
| RE38,108 E | 5/2003 | Chee et al. |
| 6,559,827 B1 | 5/2003 | Mangerson |
| 6,567,063 B1 | 5/2003 | Okita |
| 6,567,138 B1 | 5/2003 | Krusius et al. |
| 6,574,033 B1 | 6/2003 | Chui et al. |
| 6,576,887 B2 | 6/2003 | Whitney et al. |
| 6,582,095 B1 | 6/2003 | Toyoda |
| 6,583,915 B1 | 6/2003 | Hong et al. |
| 6,589,625 B1 | 7/2003 | Kothari et al. |
| 6,591,049 B2 | 7/2003 | Williams et al. |
| 6,593,677 B2 | 7/2003 | Behin et al. |
| 6,600,474 B1 | 7/2003 | Heines et al. |
| 6,621,488 B1 | 9/2003 | Takeuchi et al. |
| 6,626,540 B2 | 9/2003 | Ouchi et al. |
| 6,633,301 B1 | 10/2003 | Dallas et al. |
| 6,639,570 B2 | 10/2003 | Furness, III et al. |
| 6,639,572 B1 | 10/2003 | Little et al. |
| 6,650,455 B2 | 11/2003 | Miles |
| 6,650,822 B1 | 11/2003 | Zhou |
| 6,664,779 B2 | 12/2003 | Lopes et al. |
| 6,666,561 B1 | 12/2003 | Blakley |
| 6,671,078 B2 | 12/2003 | Flanders et al. |
| 6,674,562 B1 | 1/2004 | Miles |
| 6,677,709 B1 | 1/2004 | Ma et al. |
| 6,677,936 B2 | 1/2004 | Jacobsen et al. |
| 6,678,029 B2 | 1/2004 | Suzuki |
| 6,680,792 B2 | 1/2004 | Miles |
| 6,687,040 B2 | 2/2004 | Kimura |
| 6,687,896 B1 | 2/2004 | Royce et al. |
| 6,690,422 B1 | 2/2004 | Daly et al. |
| 6,697,035 B2 | 2/2004 | Sugahara et al. |
| 6,698,348 B1 | 3/2004 | Bloss |
| 6,698,349 B2 | 3/2004 | Komata |
| 6,700,554 B2 | 3/2004 | Ham et al. |
| 6,701,039 B2 | 3/2004 | Bourgeois et al. |
| 6,707,176 B1 | 3/2004 | Rodgers |
| 6,710,008 B2 | 3/2004 | Chang et al. |
| 6,710,538 B1 | 3/2004 | Ahn et al. |
| 6,710,908 B2 | 3/2004 | Miles et al. |
| 6,710,920 B1 | 3/2004 | Mashitani et al. |
| 6,712,071 B1 | 3/2004 | Parker |
| 6,712,481 B2 | 3/2004 | Parker et al. |
| 6,731,355 B2 | 5/2004 | Miyashita |
| 6,731,492 B2 | 5/2004 | Goodwin-Johansson |
| 6,733,354 B1 | 5/2004 | Cathey et al. |
| 6,738,177 B1 | 5/2004 | Gutierrez et al. |
| 6,741,377 B2 | 5/2004 | Miles |
| 6,746,886 B2 | 6/2004 | Duncan et al. |
| 6,749,312 B2 | 6/2004 | Parker et al. |
| 6,750,930 B2 | 6/2004 | Yoshii et al. |
| 6,752,505 B2 | 6/2004 | Parker et al. |
| 6,755,534 B2 | 6/2004 | Veligdan et al. |
| 6,755,547 B2 | 6/2004 | Parker |
| 6,760,081 B2 | 7/2004 | Takagi |

(56) References Cited

U.S. PATENT DOCUMENTS

| | | |
|---|---|---|
| 6,760,505 B1 | 7/2004 | Street et al. |
| 6,762,743 B2 | 7/2004 | Yoshihara et al. |
| 6,762,868 B2 | 7/2004 | Liu et al. |
| 6,764,796 B2 | 7/2004 | Fries |
| 6,774,964 B2 | 8/2004 | Funamoto et al. |
| 6,775,048 B1 | 8/2004 | Starkweather et al. |
| 6,778,162 B2 | 8/2004 | Kimura et al. |
| 6,778,228 B2 | 8/2004 | Murakami et al. |
| 6,778,248 B1 | 8/2004 | Ootaguro et al. |
| 6,785,454 B2 | 8/2004 | Abe |
| 6,787,969 B2 | 9/2004 | Grade et al. |
| 6,788,371 B2 | 9/2004 | Tanada et al. |
| 6,794,119 B2 | 9/2004 | Miles |
| 6,795,064 B2 | 9/2004 | Walker et al. |
| 6,796,668 B2 | 9/2004 | Parker et al. |
| 6,798,935 B2 | 9/2004 | Bourgeois et al. |
| 6,800,996 B2 | 10/2004 | Nagai et al. |
| 6,809,851 B1 | 10/2004 | Gurcan |
| 6,819,386 B2 | 11/2004 | Roosendaal et al. |
| 6,819,465 B2 | 11/2004 | Clikeman et al. |
| 6,822,734 B1 | 11/2004 | Eidelman et al. |
| 6,825,470 B1 | 11/2004 | Bawolek et al. |
| 6,825,499 B2 | 11/2004 | Nakajima et al. |
| 6,827,456 B2 | 12/2004 | Parker et al. |
| 6,831,678 B1 | 12/2004 | Travis |
| 6,832,511 B2 | 12/2004 | Samoto et al. |
| 6,835,111 B2 | 12/2004 | Ahn et al. |
| 6,844,959 B2 | 1/2005 | Huibers et al. |
| 6,846,082 B2 | 1/2005 | Glent-Madsen et al. |
| 6,846,089 B2 | 1/2005 | Stevenson et al. |
| 6,847,425 B2 | 1/2005 | Tanada et al. |
| 6,847,428 B1 | 1/2005 | Sekiguchi et al. |
| 6,852,095 B1 | 2/2005 | Ray |
| 6,857,751 B2 | 2/2005 | Penn et al. |
| 6,859,625 B2 | 2/2005 | Sawada |
| 6,862,072 B2 | 3/2005 | Liu et al. |
| 6,863,219 B1 | 3/2005 | Jacobsen et al. |
| 6,864,618 B2 | 3/2005 | Miller et al. |
| 6,867,192 B1 | 3/2005 | Armour et al. |
| 6,867,896 B2 | 3/2005 | Miles |
| 6,873,311 B2 | 3/2005 | Yoshihara et al. |
| 6,879,307 B1 | 4/2005 | Stern |
| 6,886,956 B2 | 5/2005 | Parker et al. |
| 6,887,202 B2 | 5/2005 | Currie et al. |
| 6,888,678 B2 | 5/2005 | Nishiyama et al. |
| 6,889,565 B2 | 5/2005 | DeConde et al. |
| 6,893,677 B2 | 5/2005 | Yamada et al. |
| 6,897,164 B2 | 5/2005 | Baude et al. |
| 6,897,843 B2 | 5/2005 | Ayres et al. |
| 6,900,072 B2 | 5/2005 | Patel et al. |
| 6,906,847 B2 | 6/2005 | Huibers et al. |
| 6,911,891 B2 | 6/2005 | Qiu et al. |
| 6,911,964 B2 | 6/2005 | Lee et al. |
| 6,912,082 B1 | 6/2005 | Lu et al. |
| 6,919,981 B2 | 7/2005 | Clikeman et al. |
| 6,934,080 B2 | 8/2005 | Saccomanno et al. |
| 6,936,013 B2 | 8/2005 | Pevoto |
| 6,936,968 B2 | 8/2005 | Cross et al. |
| 6,939,013 B2 | 9/2005 | Asao |
| 6,940,631 B2 | 9/2005 | Ishikawa |
| 6,943,495 B2 | 9/2005 | Ma et al. |
| 6,947,107 B2 | 9/2005 | Yoshii et al. |
| 6,947,195 B2 | 9/2005 | Ohtaka et al. |
| 6,950,240 B2 | 9/2005 | Matsuo |
| 6,952,301 B2 | 10/2005 | Huibers |
| 6,953,375 B2 | 10/2005 | Ahn et al. |
| 6,961,167 B2 | 11/2005 | Prins et al. |
| 6,962,418 B2 | 11/2005 | Utsumi et al. |
| 6,962,419 B2 | 11/2005 | Huibers |
| 6,963,330 B2 | 11/2005 | Sugahara et al. |
| 6,965,375 B1 | 11/2005 | Gettemy et al. |
| 6,967,698 B2 | 11/2005 | Tanoue et al. |
| 6,967,763 B2 | 11/2005 | Fujii et al. |
| 6,969,635 B2 | 11/2005 | Patel et al. |
| 6,970,227 B2 | 11/2005 | Kida et al. |
| 6,977,710 B2 | 12/2005 | Akiyama et al. |
| 6,980,349 B1 | 12/2005 | Huibers et al. |
| 6,985,205 B2 | 1/2006 | Chol et al. |
| 6,992,375 B2 | 1/2006 | Robbins et al. |
| 6,996,306 B2 | 2/2006 | Chen et al. |
| 7,004,610 B2 | 2/2006 | Yamashita et al. |
| 7,004,611 B2 | 2/2006 | Parker et al. |
| 7,012,726 B1 | 3/2006 | Miles |
| 7,012,732 B2 | 3/2006 | Miles |
| 7,014,349 B2 | 3/2006 | Shinohara et al. |
| 7,019,809 B2 | 3/2006 | Sekiguchi |
| 7,026,821 B2 | 4/2006 | Martin et al. |
| 7,038,758 B2 | 5/2006 | Suzuki |
| 7,042,618 B2 | 5/2006 | Selbrede et al. |
| 7,042,643 B2 | 5/2006 | Miles |
| 7,046,221 B1 | 5/2006 | Malzbender |
| 7,046,905 B1 | 5/2006 | Gardiner et al. |
| 7,048,905 B2 | 5/2006 | Paparatto et al. |
| 7,050,035 B2 | 5/2006 | Iisaka |
| 7,050,141 B2 | 5/2006 | Yokoue |
| 7,050,219 B2 | 5/2006 | Kimura |
| 7,050,790 B2 | 5/2006 | Yamaga |
| 7,057,790 B2 | 6/2006 | Selbrede |
| 7,060,895 B2 | 6/2006 | Kothari et al. |
| 7,071,611 B2 | 7/2006 | Yonekubo et al. |
| 7,072,096 B2 | 7/2006 | Holman et al. |
| 7,075,702 B2 | 7/2006 | Huibers et al. |
| 7,092,142 B2 | 8/2006 | Selebrede et al. |
| 7,110,158 B2 | 9/2006 | Miles |
| 7,116,464 B2 | 10/2006 | Osawa |
| 7,119,944 B2 | 10/2006 | Patel et al. |
| 7,123,216 B1 | 10/2006 | Miles |
| 7,123,796 B2 | 10/2006 | Steckl et al. |
| 7,126,738 B2 | 10/2006 | Miles |
| 7,140,751 B2 | 11/2006 | Lin |
| 7,156,548 B2 | 1/2007 | Teng et al. |
| 7,161,094 B2 | 1/2007 | Kothari et al. |
| 7,164,250 B2 | 1/2007 | Boscolo et al. |
| 7,164,520 B2 | 1/2007 | Palmateer et al. |
| 7,180,677 B2 | 2/2007 | Fujii et al. |
| 7,184,202 B2 | 2/2007 | Miles et al. |
| 7,196,837 B2 | 3/2007 | Sampsell et al. |
| 7,198,982 B2 | 4/2007 | Patel et al. |
| 7,199,916 B2 | 4/2007 | Faase et al. |
| 7,215,459 B2 | 5/2007 | Huibers et al. |
| 7,217,588 B2 | 5/2007 | Hartzell et al. |
| 7,218,437 B2 | 5/2007 | Selbrede |
| 7,227,677 B2 | 6/2007 | Ravnkilde et al. |
| 7,233,304 B1 | 6/2007 | Aratani et al. |
| 7,271,945 B2 | 9/2007 | Hagood et al. |
| 7,274,416 B2 | 9/2007 | Feenstra et al. |
| 7,291,363 B2 | 11/2007 | Miller |
| 7,292,235 B2 | 11/2007 | Nose |
| 7,298,448 B2 | 11/2007 | Wu |
| 7,304,785 B2 | 12/2007 | Hagood et al. |
| 7,304,786 B2 | 12/2007 | Hagood et al. |
| 7,315,294 B2 | 1/2008 | Richards |
| 7,345,805 B2 | 3/2008 | Chui |
| 7,359,108 B2 | 4/2008 | Hayes et al. |
| 7,365,897 B2 | 4/2008 | Hagood et al. |
| 7,374,328 B2 | 5/2008 | Kuroda et al. |
| 7,391,493 B2 | 6/2008 | Kim |
| 7,391,552 B2 | 6/2008 | Barton et al. |
| 7,405,852 B2 | 7/2008 | Hagood et al. |
| 7,417,735 B2 | 8/2008 | Cummings et al. |
| 7,417,782 B2 | 8/2008 | Hagood et al. |
| 7,460,290 B2 | 12/2008 | Hagood, IV et al. |
| 7,463,227 B2 | 12/2008 | Van Gorkom |
| 7,463,398 B2 | 12/2008 | Feenstra et al. |
| 7,502,159 B2 | 3/2009 | Hagood, IV et al. |
| 7,529,012 B2 | 5/2009 | Hayes et al. |
| 7,551,344 B2 | 6/2009 | Hagood et al. |
| 7,573,547 B2 | 8/2009 | Palmateer et al. |
| 7,601,942 B2 | 10/2009 | Underwood et al. |
| 7,616,368 B2 | 11/2009 | Hagood, IV |
| 7,619,806 B2 | 11/2009 | Hagood, IV et al. |
| 7,636,189 B2 | 12/2009 | Hagood, IV et al. |
| 7,666,049 B2 | 2/2010 | Saito et al. |
| 7,675,665 B2 | 3/2010 | Hagood et al. |

(56) References Cited

U.S. PATENT DOCUMENTS

| | | |
|---|---|---|
| 7,715,080 B2 | 5/2010 | Natarajan et al. |
| 7,729,037 B2 | 6/2010 | Hagood, IV et al. |
| 7,742,016 B2 | 6/2010 | Hagood et al. |
| 7,742,215 B2 | 6/2010 | Hagood, IV |
| 7,746,529 B2 | 6/2010 | Hagood et al. |
| 7,755,582 B2 | 7/2010 | Hagood et al. |
| 7,826,127 B2 | 11/2010 | Khonsari et al. |
| 7,839,356 B2 | 11/2010 | Hagood et al. |
| 7,852,546 B2 | 12/2010 | Fijol et al. |
| 7,876,489 B2 | 1/2011 | Gandhi et al. |
| 7,898,714 B2 | 3/2011 | Hagood, IV et al. |
| 7,920,317 B2 | 4/2011 | Lee et al. |
| 7,927,654 B2 | 4/2011 | Hagood et al. |
| 7,975,665 B2 | 7/2011 | Mori |
| 7,999,994 B2 | 8/2011 | Hagood, IV et al. |
| 8,159,428 B2 | 4/2012 | Hagood et al. |
| 8,169,679 B2 | 5/2012 | Wu et al. |
| 8,310,442 B2 | 11/2012 | Hagood et al. |
| 8,599,463 B2 | 12/2013 | Wu et al. |
| 8,698,980 B2 | 4/2014 | Chao et al. |
| 2001/0001260 A1 | 5/2001 | Parker et al. |
| 2001/0028422 A1 | 10/2001 | Tsujimura et al. |
| 2001/0028993 A1 | 10/2001 | Sanford |
| 2001/0030488 A1 | 10/2001 | Jerman et al. |
| 2001/0040538 A1 | 11/2001 | Quanrud |
| 2001/0043177 A1 | 11/2001 | Huston et al. |
| 2001/0043208 A1 | 11/2001 | Furness, III |
| 2001/0048265 A1 | 12/2001 | Miller et al. |
| 2001/0048431 A1 | 12/2001 | Laffargue et al. |
| 2001/0050661 A1 | 12/2001 | Noda et al. |
| 2001/0053075 A1 | 12/2001 | Parker et al. |
| 2002/0000959 A1 | 1/2002 | Colgan et al. |
| 2002/0001051 A1 | 1/2002 | Krusius et al. |
| 2002/0009275 A1 | 1/2002 | Williams et al. |
| 2002/0012159 A1 | 1/2002 | Tew |
| 2002/0015215 A1 | 2/2002 | Miles |
| 2002/0024641 A1 | 2/2002 | Ilkov et al. |
| 2002/0024711 A1 | 2/2002 | Miles |
| 2002/0030566 A1 | 3/2002 | Bozler et al. |
| 2002/0047172 A1 | 4/2002 | Reid |
| 2002/0051096 A1 | 5/2002 | Yamazaki et al. |
| 2002/0054424 A1 | 5/2002 | Miles |
| 2002/0054487 A1 | 5/2002 | Parker et al. |
| 2002/0056900 A1 | 5/2002 | Liu et al. |
| 2002/0063218 A1 | 5/2002 | Maydanich et al. |
| 2002/0063661 A1 | 5/2002 | Comiskey et al. |
| 2002/0070931 A1 | 6/2002 | Ishikawa |
| 2002/0075555 A1 | 6/2002 | Miles |
| 2002/0080598 A1 | 6/2002 | Parker et al. |
| 2002/0093722 A1 | 7/2002 | Chan et al. |
| 2002/0109903 A1 | 8/2002 | Kaeriyama |
| 2002/0113281 A1 | 8/2002 | Cunningham et al. |
| 2002/0126364 A1 | 9/2002 | Miles |
| 2002/0126387 A1 | 9/2002 | Ishikawa et al. |
| 2002/0132389 A1 | 9/2002 | Patel et al. |
| 2002/0135553 A1 | 9/2002 | Nagai et al. |
| 2002/0141174 A1 | 10/2002 | Parker et al. |
| 2002/0149828 A1 | 10/2002 | Miles et al. |
| 2002/0150698 A1 | 10/2002 | Kawabata |
| 2002/0163482 A1 | 11/2002 | Sullivan |
| 2002/0163484 A1 | 11/2002 | Furness, III |
| 2002/0163709 A1 | 11/2002 | Mirza |
| 2002/0171327 A1 | 11/2002 | Miller et al. |
| 2002/0181597 A1 | 12/2002 | Okada |
| 2002/0185699 A1 | 12/2002 | Reid |
| 2002/0191267 A1 | 12/2002 | Flanders et al. |
| 2002/0195423 A1 | 12/2002 | Patel et al. |
| 2002/0196522 A1 | 12/2002 | Little et al. |
| 2003/0001815 A1 | 1/2003 | Cui |
| 2003/0007344 A1 | 1/2003 | Parker |
| 2003/0009898 A1 | 1/2003 | Slocum et al. |
| 2003/0010894 A1 | 1/2003 | Yoshihara et al. |
| 2003/0021004 A1 | 1/2003 | Cunningham et al. |
| 2003/0023110 A1 | 1/2003 | Tam et al. |
| 2003/0029705 A1 | 2/2003 | Qiu et al. |
| 2003/0036215 A1 | 2/2003 | Reid |
| 2003/0042157 A1 | 3/2003 | Mays |
| 2003/0043157 A1 | 3/2003 | Miles |
| 2003/0043337 A1 | 3/2003 | Takabayashi |
| 2003/0048036 A1 | 3/2003 | Lemkin |
| 2003/0048370 A1 | 3/2003 | Koyama |
| 2003/0058543 A1 | 3/2003 | Sheedy et al. |
| 2003/0063233 A1 | 4/2003 | Takagi |
| 2003/0063234 A1 | 4/2003 | Oda et al. |
| 2003/0067565 A1 | 4/2003 | Yamamura |
| 2003/0068118 A1 | 4/2003 | Bourgeois et al. |
| 2003/0071686 A1 | 4/2003 | Lemkin |
| 2003/0072070 A1 | 4/2003 | Miles |
| 2003/0076649 A1 | 4/2003 | Speakman |
| 2003/0081315 A1 | 5/2003 | Kobayashi |
| 2003/0081402 A1 | 5/2003 | Jeon et al. |
| 2003/0085650 A1 | 5/2003 | Cathey et al. |
| 2003/0085867 A1 | 5/2003 | Grabert |
| 2003/0095081 A1 | 5/2003 | Furness, III |
| 2003/0095398 A1 | 5/2003 | Parker et al. |
| 2003/0102810 A1 | 6/2003 | Cross et al. |
| 2003/0123245 A1 | 7/2003 | Parker et al. |
| 2003/0123246 A1 | 7/2003 | Parker |
| 2003/0123247 A1 | 7/2003 | Parker et al. |
| 2003/0128218 A1 | 7/2003 | Struyk |
| 2003/0128416 A1 | 7/2003 | Caracci et al. |
| 2003/0133284 A1 | 7/2003 | Chipchase et al. |
| 2003/0137499 A1 | 7/2003 | Iisaka |
| 2003/0152872 A1 | 8/2003 | Miles |
| 2003/0156422 A1 | 8/2003 | Tatewaki et al. |
| 2003/0164814 A1 | 9/2003 | Starkweather et al. |
| 2003/0174422 A1 | 9/2003 | Miller et al. |
| 2003/0174931 A1 | 9/2003 | Rodgers et al. |
| 2003/0183008 A1 | 10/2003 | Bang et al. |
| 2003/0184189 A1 | 10/2003 | Sinclair |
| 2003/0190535 A1 | 10/2003 | Fries |
| 2003/0190536 A1 | 10/2003 | Fries |
| 2003/0196590 A1 | 10/2003 | Hartzell |
| 2003/0202338 A1 | 10/2003 | Parker |
| 2003/0210811 A1 | 11/2003 | Dubowsky et al. |
| 2003/0218793 A1 | 11/2003 | Soneda et al. |
| 2003/0231160 A1 | 12/2003 | Yoshihara et al. |
| 2004/0001033 A1 | 1/2004 | Goodwin-Johansson et al. |
| 2004/0012946 A1 | 1/2004 | Parker et al. |
| 2004/0027636 A1 | 2/2004 | Miles |
| 2004/0036668 A1 | 2/2004 | Nakanishi |
| 2004/0051929 A1 | 3/2004 | Sampsell et al. |
| 2004/0058532 A1 | 3/2004 | Miles et al. |
| 2004/0076008 A1 | 4/2004 | Ikeda |
| 2004/0080240 A1 | 4/2004 | Miller et al. |
| 2004/0080484 A1 | 4/2004 | Heines et al. |
| 2004/0080927 A1 | 4/2004 | Parker et al. |
| 2004/0085608 A1 | 5/2004 | Theil et al. |
| 2004/0085749 A1 | 5/2004 | Parker et al. |
| 2004/0088629 A1 | 5/2004 | Ott |
| 2004/0090144 A1 | 5/2004 | Miller et al. |
| 2004/0090599 A1 | 5/2004 | Kowarz et al. |
| 2004/0095739 A1 | 5/2004 | Parker et al. |
| 2004/0100677 A1 | 5/2004 | Huibers et al. |
| 2004/0113903 A1 | 6/2004 | Mikami et al. |
| 2004/0114346 A1 | 6/2004 | Parker et al. |
| 2004/0122328 A1 | 6/2004 | Wang et al. |
| 2004/0125062 A1 | 7/2004 | Yamamoto et al. |
| 2004/0125346 A1 | 7/2004 | Huibers |
| 2004/0135273 A1 | 7/2004 | Parker et al. |
| 2004/0135951 A1 | 7/2004 | Stumbo et al. |
| 2004/0136204 A1 | 7/2004 | Asao |
| 2004/0136680 A1 | 7/2004 | Medina et al. |
| 2004/0141700 A1 | 7/2004 | Yang |
| 2004/0145580 A1 | 7/2004 | Perlman |
| 2004/0145793 A1 | 7/2004 | Barbour et al. |
| 2004/0145854 A1 | 7/2004 | Tamura |
| 2004/0156246 A1 | 8/2004 | Nakamura |
| 2004/0157664 A1 | 8/2004 | Link |
| 2004/0165372 A1 | 8/2004 | Parker |
| 2004/0171206 A1 | 9/2004 | Rodgers |
| 2004/0173872 A1 | 9/2004 | Park et al. |
| 2004/0179146 A1 | 9/2004 | Nilsson |
| 2004/0184710 A1 | 9/2004 | Kubby et al. |

(56) References Cited

U.S. PATENT DOCUMENTS

| | | |
|---|---|---|
| 2004/0196215 A1 | 10/2004 | Duthaler et al. |
| 2004/0196525 A1 | 10/2004 | Fujii et al. |
| 2004/0207768 A1 | 10/2004 | Liu |
| 2004/0207815 A1 | 10/2004 | Allen et al. |
| 2004/0212759 A1 | 10/2004 | Hayashi |
| 2004/0212907 A1 | 10/2004 | Mala et al. |
| 2004/0217919 A1 | 11/2004 | Piehl et al. |
| 2004/0218149 A1 | 11/2004 | Huibers |
| 2004/0218154 A1 | 11/2004 | Huibers |
| 2004/0218292 A1 | 11/2004 | Huibers |
| 2004/0218293 A1 | 11/2004 | Huibers |
| 2004/0223088 A1 | 11/2004 | Huibers |
| 2004/0223240 A1 | 11/2004 | Huibers |
| 2004/0227428 A1 | 11/2004 | Sinclair |
| 2004/0233354 A1 | 11/2004 | Uehara et al. |
| 2004/0233392 A1 | 11/2004 | Huibers |
| 2004/0233498 A1 | 11/2004 | Starkweather et al. |
| 2004/0233503 A1 | 11/2004 | Kimura |
| 2004/0240032 A1 | 12/2004 | Miles |
| 2004/0240138 A1 | 12/2004 | Martin et al. |
| 2004/0246275 A1 | 12/2004 | Yoshihara et al. |
| 2004/0263076 A1 | 12/2004 | De Zwart et al. |
| 2004/0263502 A1 | 12/2004 | Dallas et al. |
| 2004/0263944 A1 | 12/2004 | Miles et al. |
| 2005/0002082 A1 | 1/2005 | Miles |
| 2005/0002086 A1 | 1/2005 | Starkweather et al. |
| 2005/0007671 A1 | 1/2005 | Onvlee |
| 2005/0007759 A1 | 1/2005 | Parker |
| 2005/0012197 A1 | 1/2005 | Smith et al. |
| 2005/0018322 A1 | 1/2005 | Ben-Gad et al. |
| 2005/0024849 A1 | 2/2005 | Parker et al. |
| 2005/0052681 A1 | 3/2005 | Kogi |
| 2005/0052723 A1 | 3/2005 | Watanabe et al. |
| 2005/0059184 A1 | 3/2005 | Sniegowski et al. |
| 2005/0062708 A1 | 3/2005 | Yoshihara et al. |
| 2005/0063037 A1 | 3/2005 | Selebrede et al. |
| 2005/0072032 A1 | 4/2005 | McCollum et al. |
| 2005/0073471 A1 | 4/2005 | Selbrede |
| 2005/0088404 A1 | 4/2005 | Heines et al. |
| 2005/0093465 A1 | 5/2005 | Yonekubo et al. |
| 2005/0094240 A1 | 5/2005 | Huibers et al. |
| 2005/0094418 A1 | 5/2005 | Parker |
| 2005/0104804 A1 | 5/2005 | Feenstra et al. |
| 2005/0111238 A1 | 5/2005 | Parker |
| 2005/0111241 A1 | 5/2005 | Parker |
| 2005/0116798 A1 | 6/2005 | Bintoro et al. |
| 2005/0122560 A1 | 6/2005 | Sampsell et al. |
| 2005/0122591 A1 | 6/2005 | Parker et al. |
| 2005/0123243 A1 | 6/2005 | Steckl et al. |
| 2005/0123249 A1 | 6/2005 | Yun et al. |
| 2005/0123349 A1 | 6/2005 | Koch |
| 2005/0128370 A1 | 6/2005 | Moon |
| 2005/0134768 A1* | 6/2005 | Sugiura et al. ............... 349/113 |
| 2005/0134805 A1 | 6/2005 | Conner et al. |
| 2005/0139542 A1 | 6/2005 | Dickensheets et al. |
| 2005/0140636 A1 | 6/2005 | Chung et al. |
| 2005/0141076 A1 | 6/2005 | Bausenwein et al. |
| 2005/0151940 A1 | 7/2005 | Asao |
| 2005/0157365 A1 | 7/2005 | Ravnkilde et al. |
| 2005/0157376 A1 | 7/2005 | Huibers et al. |
| 2005/0168431 A1 | 8/2005 | Chui |
| 2005/0168789 A1 | 8/2005 | Glent-Madsen |
| 2005/0171408 A1 | 8/2005 | Parker |
| 2005/0172625 A1 | 8/2005 | Starkweather et al. |
| 2005/0179977 A1 | 8/2005 | Chui et al. |
| 2005/0195467 A1 | 9/2005 | Kothari et al. |
| 2005/0195468 A1 | 9/2005 | Sampsell |
| 2005/0206991 A1 | 9/2005 | Chui et al. |
| 2005/0207154 A1 | 9/2005 | Parker |
| 2005/0207178 A1 | 9/2005 | Parker |
| 2005/0212734 A1 | 9/2005 | Kimura |
| 2005/0212738 A1 | 9/2005 | Gally |
| 2005/0213183 A9 | 9/2005 | Miles |
| 2005/0213322 A1 | 9/2005 | Parker |
| 2005/0213323 A1 | 9/2005 | Parker |
| 2005/0213349 A1 | 9/2005 | Parker |
| 2005/0219676 A1 | 10/2005 | Kimura et al. |
| 2005/0219679 A1 | 10/2005 | Ishikawa |
| 2005/0219680 A1 | 10/2005 | Ishikawa |
| 2005/0225501 A1 | 10/2005 | Srinivasan et al. |
| 2005/0225519 A1 | 10/2005 | Naugler |
| 2005/0225732 A1 | 10/2005 | Conner et al. |
| 2005/0225827 A1 | 10/2005 | Kastalsky |
| 2005/0231790 A1 | 10/2005 | Miles |
| 2005/0231791 A1 | 10/2005 | Sampsell et al. |
| 2005/0236928 A1 | 10/2005 | Kurozuka et al. |
| 2005/0237596 A1 | 10/2005 | Selbrede |
| 2005/0242710 A1 | 11/2005 | Yamazaki et al. |
| 2005/0243023 A1 | 11/2005 | Reddy et al. |
| 2005/0244099 A1 | 11/2005 | Pasch et al. |
| 2005/0244949 A1 | 11/2005 | Miles |
| 2005/0245313 A1 | 11/2005 | Yoshino et al. |
| 2005/0247477 A1 | 11/2005 | Kothari et al. |
| 2005/0249966 A1 | 11/2005 | Tung et al. |
| 2005/0253779 A1 | 11/2005 | Feenstra et al. |
| 2005/0254115 A1 | 11/2005 | Palmateer et al. |
| 2005/0258571 A1 | 11/2005 | Dumond et al. |
| 2005/0259198 A1 | 11/2005 | Lubart et al. |
| 2005/0263866 A1 | 12/2005 | Wan |
| 2005/0265029 A1 | 12/2005 | Epstein et al. |
| 2005/0275072 A1 | 12/2005 | Haluzak et al. |
| 2005/0275930 A1 | 12/2005 | Patel et al. |
| 2005/0285816 A1 | 12/2005 | Glass |
| 2005/0286113 A1 | 12/2005 | Miles |
| 2005/0286114 A1 | 12/2005 | Miles |
| 2006/0001942 A1 | 1/2006 | Chui et al. |
| 2006/0003676 A1 | 1/2006 | Bernard et al. |
| 2006/0004928 A1 | 1/2006 | Hess et al. |
| 2006/0007514 A1 | 1/2006 | Desai |
| 2006/0007701 A1 | 1/2006 | Schoellmann et al. |
| 2006/0012781 A1 | 1/2006 | Fradkin et al. |
| 2006/0023287 A1 | 2/2006 | Przybyla et al. |
| 2006/0028708 A1 | 2/2006 | Miles |
| 2006/0028811 A1 | 2/2006 | Ross et al. |
| 2006/0028817 A1 | 2/2006 | Parker |
| 2006/0028840 A1 | 2/2006 | Parker |
| 2006/0028841 A1 | 2/2006 | Parker |
| 2006/0028843 A1 | 2/2006 | Parker |
| 2006/0028844 A1 | 2/2006 | Parker |
| 2006/0033676 A1 | 2/2006 | Faase et al. |
| 2006/0033975 A1 | 2/2006 | Miles |
| 2006/0038766 A1 | 2/2006 | Morita |
| 2006/0038768 A1 | 2/2006 | Sagawa et al. |
| 2006/0044246 A1 | 3/2006 | Mignard |
| 2006/0044298 A1 | 3/2006 | Mignard et al. |
| 2006/0044508 A1 | 3/2006 | Mochizuki |
| 2006/0044928 A1 | 3/2006 | Chui et al. |
| 2006/0061559 A1 | 3/2006 | King |
| 2006/0066504 A1 | 3/2006 | Sampsell et al. |
| 2006/0066540 A1 | 3/2006 | Hewlett et al. |
| 2006/0066560 A1 | 3/2006 | Gally et al. |
| 2006/0066598 A1 | 3/2006 | Floyd |
| 2006/0066934 A1 | 3/2006 | Selbrede |
| 2006/0066937 A1 | 3/2006 | Chui |
| 2006/0077125 A1 | 4/2006 | Floyd |
| 2006/0077153 A1 | 4/2006 | Cummings et al. |
| 2006/0077533 A1 | 4/2006 | Miles et al. |
| 2006/0092490 A1 | 5/2006 | McCollum et al. |
| 2006/0104061 A1 | 5/2006 | Lerner et al. |
| 2006/0132383 A1 | 6/2006 | Gally et al. |
| 2006/0132404 A1 | 6/2006 | Hayes et al. |
| 2006/0139734 A1 | 6/2006 | Selebrede et al. |
| 2006/0146389 A1 | 7/2006 | Selbrede |
| 2006/0152476 A1 | 7/2006 | Van Gorkom et al. |
| 2006/0154078 A1 | 7/2006 | Watanabe et al. |
| 2006/0172745 A1 | 8/2006 | Knowles |
| 2006/0187190 A1 | 8/2006 | Hagood et al. |
| 2006/0187191 A1 | 8/2006 | Hagood et al. |
| 2006/0187290 A1 | 8/2006 | Nakashima |
| 2006/0187528 A1 | 8/2006 | Hagood et al. |
| 2006/0209000 A1 | 9/2006 | Sumiyoshi et al. |
| 2006/0209012 A1 | 9/2006 | Hagood |
| 2006/0215540 A1 | 9/2006 | Krishnamoorthi et al. |
| 2006/0238443 A1 | 10/2006 | Derichs |

(56) References Cited

U.S. PATENT DOCUMENTS

| | | |
|---|---|---|
| 2006/0250325 A1 | 11/2006 | Hagood et al. |
| 2006/0250676 A1 | 11/2006 | Hagood, IV |
| 2006/0256039 A1 | 11/2006 | Hagood et al. |
| 2006/0262060 A1 | 11/2006 | Amundson |
| 2006/0262380 A1 | 11/2006 | Miles |
| 2006/0268386 A1 | 11/2006 | Selbrede et al. |
| 2006/0268568 A1 | 11/2006 | Oku et al. |
| 2006/0270179 A1 | 11/2006 | Yang |
| 2006/0280319 A1 | 12/2006 | Wang et al. |
| 2006/0291034 A1 | 12/2006 | Patry et al. |
| 2006/0291771 A1 | 12/2006 | Braunisch et al. |
| 2006/0291774 A1 | 12/2006 | Schoellmann et al. |
| 2007/0002156 A1 | 1/2007 | Hagood et al. |
| 2007/0002413 A1 | 1/2007 | Psaltis et al. |
| 2007/0003055 A1 | 1/2007 | Bark et al. |
| 2007/0007889 A1 | 1/2007 | Bongaerts et al. |
| 2007/0024701 A1 | 2/2007 | Prechtl et al. |
| 2007/0030555 A1 | 2/2007 | Barton et al. |
| 2007/0031097 A1 | 2/2007 | Heikenfeld et al. |
| 2007/0035808 A1 | 2/2007 | Amundson et al. |
| 2007/0040982 A1 | 2/2007 | Nakano et al. |
| 2007/0047051 A1 | 3/2007 | Selbrede et al. |
| 2007/0047887 A1 | 3/2007 | Selbrede |
| 2007/0052636 A1 | 3/2007 | Kalt et al. |
| 2007/0052660 A1 | 3/2007 | Montbach et al. |
| 2007/0053652 A1 | 3/2007 | Mignard et al. |
| 2007/0091011 A1 | 4/2007 | Selbrede |
| 2007/0091038 A1 | 4/2007 | Hagood, IV et al. |
| 2007/0103209 A1 | 5/2007 | Lee |
| 2007/0127108 A1 | 6/2007 | Hayes et al. |
| 2007/0132680 A1 | 6/2007 | Kagawa et al. |
| 2007/0150813 A1 | 6/2007 | Selebrede et al. |
| 2007/0159679 A1 | 7/2007 | Hagood et al. |
| 2007/0172171 A1 | 7/2007 | Van Ostrand et al. |
| 2007/0190265 A1 | 8/2007 | Aoki et al. |
| 2007/0195026 A1 | 8/2007 | Hagood et al. |
| 2007/0205969 A1 | 9/2007 | Hagood, IV et al. |
| 2007/0216987 A1 | 9/2007 | Hagood et al. |
| 2007/0217108 A1 | 9/2007 | Ozawa et al. |
| 2007/0223080 A1 | 9/2007 | Hagood, IV et al. |
| 2007/0247401 A1 | 10/2007 | Sasagawa et al. |
| 2007/0279727 A1 | 12/2007 | Gandhi et al. |
| 2007/0297747 A1 | 12/2007 | Biernath et al. |
| 2008/0014557 A1 | 1/2008 | Kuhn et al. |
| 2008/0026066 A1 | 1/2008 | Roser |
| 2008/0030827 A1 | 2/2008 | Hagood et al. |
| 2008/0037104 A1 | 2/2008 | Hagood et al. |
| 2008/0043726 A1 | 2/2008 | Herrero-Veron et al. |
| 2008/0062500 A1 | 3/2008 | Hagood, IV |
| 2008/0094853 A1 | 4/2008 | Kim et al. |
| 2008/0123175 A1 | 5/2008 | Hagood et al. |
| 2008/0129681 A1 | 6/2008 | Hagood et al. |
| 2008/0145527 A1 | 6/2008 | Hagood et al. |
| 2008/0158635 A1 | 7/2008 | Hagood et al. |
| 2008/0158636 A1 | 7/2008 | Hagood et al. |
| 2008/0165122 A1 | 7/2008 | Duthaler et al. |
| 2008/0174532 A1 | 7/2008 | Lewis |
| 2008/0278798 A1 | 11/2008 | Hagood et al. |
| 2008/0279727 A1 | 11/2008 | Haushalter |
| 2008/0283175 A1 | 11/2008 | Hagood et al. |
| 2008/0297880 A1 | 12/2008 | Steckl et al. |
| 2009/0034052 A1 | 2/2009 | Hagood et al. |
| 2009/0091561 A1 | 4/2009 | Koyama |
| 2009/0103164 A1 | 4/2009 | Fijol et al. |
| 2009/0103281 A1 | 4/2009 | Koh |
| 2009/0141335 A1 | 6/2009 | Feenstra et al. |
| 2009/0195855 A1 | 8/2009 | Steyn et al. |
| 2009/0284824 A1 | 11/2009 | Feenstra et al. |
| 2010/0328608 A1 | 12/2010 | Fujii et al. |
| 2011/0122474 A1 | 5/2011 | Payne et al. |
| 2011/0148948 A1 | 6/2011 | Gandhi et al. |
| 2011/0164067 A1 | 7/2011 | Lewis et al. |
| 2011/0205259 A1 | 8/2011 | Hagood, IV |
| 2011/0255146 A1 | 10/2011 | Brosnihan et al. |
| 2011/0267668 A1 | 11/2011 | Hagood, IV et al. |
| 2012/0133006 A1 | 5/2012 | Hasselbach et al. |
| 2012/0169795 A1 | 7/2012 | Hagood et al. |
| 2012/0200906 A1 | 8/2012 | Wu et al. |
| 2012/0229226 A1 | 9/2012 | Oja et al. |
| 2012/0280971 A1 | 11/2012 | Hagood et al. |
| 2012/0320111 A1 | 12/2012 | Hagood, IV et al. |
| 2012/0320112 A1 | 12/2012 | Hagood, IV et al. |
| 2012/0320113 A1 | 12/2012 | Hagood, IV et al. |
| 2013/0010341 A1 | 1/2013 | Hagood et al. |
| 2013/0010342 A1 | 1/2013 | Hagood, IV et al. |
| 2013/0010344 A1 | 1/2013 | Hagood et al. |
| 2013/0335806 A1 | 12/2013 | Steyn et al. |
| 2013/0342522 A1 | 12/2013 | Hagood |
| 2014/0078154 A1 | 3/2014 | Payne et al. |
| 2014/0085698 A1 | 3/2014 | Wu et al. |
| 2014/0145926 A1 | 5/2014 | Wu et al. |
| 2014/0184573 A1 | 7/2014 | Nemchuki, I et al. |
| 2014/0184621 A1 | 7/2014 | Brosnihan et al. |
| 2014/0267196 A1 | 9/2014 | Villarreal et al. |
| 2014/0267331 A1 | 9/2014 | Villarreal et al. |
| 2014/0268293 A1 | 9/2014 | Chleirigh et al. |

FOREIGN PATENT DOCUMENTS

| | | |
|---|---|---|
| CN | 1206218 A | 1/1999 |
| CN | 1309782 A | 8/2001 |
| CN | 1390045 A | 1/2003 |
| CN | 1402033 A | 3/2003 |
| CN | 1476664 A | 2/2004 |
| CN | 1491030 A | 4/2004 |
| CN | 1498408 A | 5/2004 |
| CN | 1541483 A | 10/2004 |
| CN | 1542499 A | 11/2004 |
| CN | 1555472 A | 12/2004 |
| CN | 1573525 A | 2/2005 |
| CN | 1584731 A | 2/2005 |
| CN | 1599522 A | 3/2005 |
| CN | 1623111 A | 6/2005 |
| CN | 1898969 A | 1/2007 |
| DE | 10332647 A1 | 2/2005 |
| EP | 0366847 A2 | 5/1990 |
| EP | 0415625 | 3/1991 |
| EP | 0438614 A1 | 7/1991 |
| EP | 0359450 B1 | 11/1994 |
| EP | 0495273 B1 | 9/1996 |
| EP | 0415625 B1 | 1/1997 |
| EP | 0751340 | 1/1997 |
| EP | 0757958 A1 | 2/1997 |
| EP | 0786679 A2 | 7/1997 |
| EP | 0884525 A2 | 12/1998 |
| EP | 0889458 A2 | 1/1999 |
| EP | 0751340 B1 | 5/2000 |
| EP | 1022598 A2 | 7/2000 |
| EP | 1091342 A2 | 4/2001 |
| EP | 1091343 A2 | 4/2001 |
| EP | 1091842 A1 | 4/2001 |
| EP | 1093142 A2 | 4/2001 |
| EP | 1168051 A1 | 1/2002 |
| EP | 1202096 A2 | 5/2002 |
| EP | 1202244 A1 | 5/2002 |
| EP | 1426190 A1 | 6/2004 |
| EP | 1429310 A2 | 6/2004 |
| EP | 1471495 A2 | 10/2004 |
| EP | 1522883 A1 | 4/2005 |
| EP | 1533853 A2 | 5/2005 |
| EP | 1551002 A2 | 7/2005 |
| EP | 1674893 | 6/2006 |
| EP | 1674893 A1 | 6/2006 |
| EP | 1734502 A1 | 12/2006 |
| EP | 1757958 A1 | 2/2007 |
| EP | 2263968 | 12/2010 |
| EP | 1858796 | 1/2011 |
| EP | 2287110 | 2/2011 |
| EP | 1640770 | 4/2012 |
| EP | 2459777 A1 | 6/2012 |
| FR | 2726135 A1 | 4/1996 |
| GB | 2071896 A | 9/1981 |
| GB | 2343980 A | 5/2000 |
| JP | 556137386 A | 10/1981 |

(56) References Cited

FOREIGN PATENT DOCUMENTS

| | | |
|---|---|---|
| JP | 57062028 A | 4/1982 |
| JP | S5774730 A | 5/1982 |
| JP | 57127264 U | 8/1982 |
| JP | S5933077 U | 2/1984 |
| JP | S62275230 A | 11/1987 |
| JP | 3142409 A | 6/1991 |
| JP | 4249203 A | 9/1992 |
| JP | 5045648 A | 2/1993 |
| JP | H06174929 A | 6/1994 |
| JP | 6194649 A | 7/1994 |
| JP | H06202009 A | 7/1994 |
| JP | H06222290 A | 8/1994 |
| JP | H06250593 A | 9/1994 |
| JP | H0836161 A | 2/1996 |
| JP | H0895526 A | 4/1996 |
| JP | 8234158 A | 9/1996 |
| JP | 8334752 A | 12/1996 |
| JP | H08334752 A | 12/1996 |
| JP | 9080386 A | 3/1997 |
| JP | 09189869 A | 7/1997 |
| JP | 9198906 A | 7/1997 |
| JP | H09218360 A | 8/1997 |
| JP | H09292576 A | 11/1997 |
| JP | H1054916 A | 2/1998 |
| JP | H1054947 A | 2/1998 |
| JP | 10282474 A | 10/1998 |
| JP | H10282521 A | 10/1998 |
| JP | H10333145 A | 12/1998 |
| JP | 11015393 A | 1/1999 |
| JP | 11024038 A | 1/1999 |
| JP | H1184419 A | 3/1999 |
| JP | H1195693 A | 4/1999 |
| JP | H11126118 A | 5/1999 |
| JP | H11202325 A | 7/1999 |
| JP | 2000028933 A | 1/2000 |
| JP | 2000028938 | 1/2000 |
| JP | 2000057832 A | 2/2000 |
| JP | 2000-121970 | 4/2000 |
| JP | 2000105547 A | 4/2000 |
| JP | 2000111813 A | 4/2000 |
| JP | 2000131627 A | 5/2000 |
| JP | 2000172219 A | 6/2000 |
| JP | 2000214393 A | 8/2000 |
| JP | 2000214394 A | 8/2000 |
| JP | 2000214395 A | 8/2000 |
| JP | 2000214397 A | 8/2000 |
| JP | 2000214831 A | 8/2000 |
| JP | 2000235152 A | 8/2000 |
| JP | 2000259116 A | 9/2000 |
| JP | 2000321566 A | 11/2000 |
| JP | 2001067010 A | 3/2001 |
| JP | 2001075534 A | 3/2001 |
| JP | 2001100121 A | 4/2001 |
| JP | 2001125014 A | 5/2001 |
| JP | 2001154642 A | 6/2001 |
| JP | 2001175216 A | 6/2001 |
| JP | 2001201698 A | 7/2001 |
| JP | 2001201767 A | 7/2001 |
| JP | 2001242826 A | 9/2001 |
| JP | 2001281563 A | 10/2001 |
| JP | 2001318377 A | 11/2001 |
| JP | 2001331142 A | 11/2001 |
| JP | 2001331144 A | 11/2001 |
| JP | 2001337649 A | 12/2001 |
| JP | 2001356281 A | 12/2001 |
| JP | 2001356327 A | 12/2001 |
| JP | 2002040336 A | 2/2002 |
| JP | 2002040337 A | 2/2002 |
| JP | 2002139683 A | 5/2002 |
| JP | 2002140038 A | 5/2002 |
| JP | 2002214543 A | 7/2002 |
| JP | 2002279812 A | 9/2002 |
| JP | 2002528763 A | 9/2002 |
| JP | 2002287718 A | 10/2002 |
| JP | 2002297085 A | 10/2002 |
| JP | 2002318564 A | 10/2002 |
| JP | 2002333619 A | 11/2002 |
| JP | 2002341343 A | 11/2002 |
| JP | 2002351431 A | 12/2002 |
| JP | 2002365650 A | 12/2002 |
| JP | 2003029295 A | 1/2003 |
| JP | 2003036057 A | 2/2003 |
| JP | 2003506755 A | 2/2003 |
| JP | 2003084314 A | 3/2003 |
| JP | 2003086233 A | 3/2003 |
| JP | 2003098984 A | 4/2003 |
| JP | 2003121824 A | 4/2003 |
| JP | 2003162904 A | 6/2003 |
| JP | 2003202519 A | 7/2003 |
| JP | 2003248463 A | 9/2003 |
| JP | 2003344785 A | 12/2003 |
| JP | 2004004216 A | 1/2004 |
| JP | 2004053839 A | 2/2004 |
| JP | 2004069788 A | 3/2004 |
| JP | 2004117833 A | 4/2004 |
| JP | 2004140800 A | 5/2004 |
| JP | 2004151722 A | 5/2004 |
| JP | 2004163915 A | 6/2004 |
| JP | 2004191736 A | 7/2004 |
| JP | 2004205973 A | 7/2004 |
| JP | 2004212673 A | 7/2004 |
| JP | 2004221051 A | 8/2004 |
| JP | 2004287215 A | 10/2004 |
| JP | 2004287431 A | 10/2004 |
| JP | 2004302270 A | 10/2004 |
| JP | 2004317557 A | 11/2004 |
| JP | 2004317785 A | 11/2004 |
| JP | 2004325909 A | 11/2004 |
| JP | 2004327025 A | 11/2004 |
| JP | 2004534280 A | 11/2004 |
| JP | 2004347982 A | 12/2004 |
| JP | 2005010786 A | 1/2005 |
| JP | 2005043674 A | 2/2005 |
| JP | 2005043726 A | 2/2005 |
| JP | 2005504355 A | 2/2005 |
| JP | 2005512119 A | 4/2005 |
| JP | 2005134896 A | 5/2005 |
| JP | 2005309416 A | 11/2005 |
| JP | 2006098990 A | 4/2006 |
| JP | 2006522360 A | 9/2006 |
| JP | 2007155983 A | 6/2007 |
| JP | 2007517488 A | 6/2007 |
| JP | 2008015081 A | 1/2008 |
| JP | 2008098984 A | 4/2008 |
| JP | 2008233898 A | 10/2008 |
| JP | 2009111813 A | 5/2009 |
| JP | 2010517052 A | 5/2010 |
| JP | 2012128451 A | 7/2012 |
| JP | 2012186782 A | 9/2012 |
| JP | 2012230079 | 11/2012 |
| JP | 2013061658 A | 4/2013 |
| WO | 9401716 A1 | 1/1994 |
| WO | 9528035 A1 | 10/1995 |
| WO | 9704436 A1 | 2/1997 |
| WO | 9804950 A1 | 2/1998 |
| WO | WO-9819201 A1 | 5/1998 |
| WO | 9901696 A1 | 1/1999 |
| WO | 0017695 A1 | 3/2000 |
| WO | 0050807 A1 | 8/2000 |
| WO | 0052674 A1 | 9/2000 |
| WO | 0055916 A1 | 9/2000 |
| WO | 0169584 A1 | 9/2001 |
| WO | 0189986 A1 | 11/2001 |
| WO | 0207482 A2 | 1/2002 |
| WO | 03004836 A1 | 1/2003 |
| WO | 03007049 | 1/2003 |
| WO | 03008860 A1 | 1/2003 |
| WO | WO-03029874 A2 | 4/2003 |
| WO | 03040802 A2 | 5/2003 |
| WO | 03048836 A2 | 6/2003 |
| WO | 03050448 A1 | 6/2003 |
| WO | 03061007 A1 | 7/2003 |
| WO | 03061329 A2 | 7/2003 |
| WO | 03069593 A2 | 8/2003 |

(56) References Cited

FOREIGN PATENT DOCUMENTS

| WO | 03081315 | A1 | 10/2003 |
|---|---|---|---|
| WO | 03105198 | A1 | 12/2003 |
| WO | 2004008629 | A1 | 1/2004 |
| WO | 2004019120 | A1 | 3/2004 |
| WO | 2004034136 | A1 | 4/2004 |
| WO | WO-2004038496 | A1 | 5/2004 |
| WO | 2004086098 | A2 | 10/2004 |
| WO | 2004088629 | A1 | 10/2004 |
| WO | 2004097506 | A2 | 11/2004 |
| WO | 2005001892 | A2 | 1/2005 |
| WO | 2005015287 | A1 | 2/2005 |
| WO | 2005062908 | A2 | 7/2005 |
| WO | 2005073950 | | 8/2005 |
| WO | 2005082908 | A1 | 9/2005 |
| WO | 2006017129 | A2 | 2/2006 |
| WO | 2006023077 | A2 | 3/2006 |
| WO | 2006039315 | A2 | 4/2006 |
| WO | 2006052755 | A2 | 5/2006 |
| WO | 2006091738 | A1 | 8/2006 |
| WO | 2006091791 | | 8/2006 |
| WO | 2006091904 | | 8/2006 |
| WO | WO-2006091860 | A2 | 8/2006 |
| WO | 2007075832 | | 7/2007 |
| WO | 2007123173 | A1 | 11/2007 |
| WO | 2007145973 | | 12/2007 |
| WO | 2008026066 | A1 | 3/2008 |
| WO | WO-2008091339 | A2 | 7/2008 |
| WO | 2008092859 | A1 | 8/2008 |
| WO | WO-2009102471 | A1 | 8/2009 |
| WO | 2010062647 | A2 | 6/2010 |
| WO | WO-2013032865 | A1 | 3/2013 |

OTHER PUBLICATIONS

Alt P.M., et al., "A Gray-Scale Addressing Technique for Thin-Film-Transistor/Liquid Crystal Displays," IBM J. Res. Develop., 36 (1), Jan. 1992, pp. 11-22.
AZ Displays, Inc., "Complete LCD Solutions," ATM3224C-NC-FTH, pp. 1-15 (Oct. 2, 2003).
Bergquist et al., "Field Sequential Colour Display with Adaptive Gamut", Society for Information Display, Digest of Technical Papers, 2006, pp. 1594-1597.
Birch et al, "31.1: SXGA Resolution FLC Microdisplays," SID 02 Digest, 954-957 (2002).
Feenstra, B.J., et. al. "A Reflective Display Based on Electrowetting: Principle and Properties", International Display Research Conference Proceedings 2003, p. 322.
Blackstone, "Making MEMS Reliable," SPIE's OEMagazine, 32-34 (Sep. 2002).
"BLU, " Heesung Precision Ltd., http://www.hspr.co.kr/eng/product/blu.asp Retrieved on Aug. 3, 2006.
den Boer W.D., "Active Matrix Liquid Crystal Displays", Elsevier Science & Technology Books, ISBN #0750678135, Aug. 2005.
Boeuf, J.P., "Plasma display panels: physics,recent deveopments and key issues," J. Phys. D: Appl. Phys. 36 (2003) R53-R79 (received Aug. 29, 2002: published Feb. 26, 2003).
Boucinha, M., et al., "Air-gap amorphous silicon thin film transistors," Applied Physics Letters, 73 (4): 502-4 (Jul. 27, 1998).
Bozler et al, "Arrays of gated field-emitter cones having 0.32 mm tip-to-tip spacing," J. Vec. Sci. Technol. B, 12 (2): 629-632 (Mar./Apr. 1994).
Bryan-Brown, "Ultra Low Power Bistable LCDs," SID 00, 76-79 (2000).
Chino E. et al., "25.1: Invited Paper: Development of Wide-Color-Gamut Mobile Displays with Four-primary-color LCDs," Society for Information Display, 37 (2), 2006, pp. 1221-1224.
Clark N. A., et al., "FLC Microdisplays", Ferroelectrics, 246, 2000, pp. 97-110.
Conde, J.P., et. al., "Amorphous and microcrystalline silicon deposited by hot-wire chemical vapor deposition at low substrate temperatures: application to devices and thin-film microelectromechanical systems," Thin Solid Films 395: 105-111 (2001).
Conde, J.P., et al., "Low-temperature Thin-film Silicon MEMS", in Thin Solid Films 427, p. 181 (2003).
Davis, "Light Emitting Diode Source Modeling for Optical Design," Reflexite Display Optics (Oct. 2004).
Davis, "Microstructured Optics for LED Applications," Reflexite Display Optics (2002).
Doane, et al, "Display Technologies in Russia, Ukraine, and Belarus," World Technology Evaluation Center Panel Report (Dec. 1994) http://www.wtec.org/loyola/displays/toc.htm, retrieved on Nov. 22, 2005.
Doherty D. et al., "Pulse Width Modulation Control of DLP Projectors", TI Technical Journal, Jul.-Sep. 1998, No. 3, pp. 115-121.
"Electronic Display Lighting Tutorials," 3M Corporation,file //D:/Optical/Vikuiti Tutorial.htm. retrieved on Aug. 10, 2006.
Feenstra J. et al., "Electrowetting Displays", Liquavista BV, http://www.liquavista.com/documents/electrowetting_displays_whitepaper.pdf, Retrieved on Aug. 17, 2006, pp. 1-16.
Feng, et al, "Novel Integrated Light-Guide Plates for Liquid Crystal Display Backlight," Journal of optics a Pure and applied optics, 2005, 7, 111-117.
Feng, "High Quality Light Guide Plates that Can Control the Illumination Angle Based on Microprism Structures," Applied Physics Letters, 85 (24): 6016-6018 (Dec. 2004).
Final Office Action dated May 18, 2007, U.S. Appl. No. 11/218,690.
Final Office Action dated Oct. 3, 2007 in U.S. Appl. No. 11/218,690.
Final Office Action dated Sep. 21, 2007, U.S. Appl. No. 11/546,937.
Flat Panel Display (FPD) Manufacturing Equipment that Cuts Production Costs by Half, Shibaura Mechatronics Corporation, product brochure for panel processing.
Foley, "NE04-21: Microstructured Plastic Optics for Display, Lighting, and Telecommunications Applications," Fresnel Optics (2001).
Funamoto et al, "Diffusive-sheetless Backlight System for Mobile Phone," IDW/AD, 1277-1280 (2005).
Funamoto et. al. "LED Backlight System with Double-Prism Pattern", Journal of the Society for Information Display v. 14, pp. 1045-1051 (2006).
Goddhue et al, "Bright-field analysis of field-emission cones using high-resolution tranmission electron microscopy and the effect of structural properties on current stability," J. Vac. Sci. Technol. B, 12 (2): 693-696 (Mar. Apr. 1994).
Hartman, "4.1: Invited paper: Two-Terminal Devices Technologies for AMLCDs," SID 95 Digest, 7-10 (1995).
Hewlett et al, "DLP CinemaTM projection: A hybrid frame-rate technique for flicker-free performance," Journ of the SID 9/3, 221-226 (2001).
Hornbeck J. "Digital Light Processing TM: A New MEMS-Based Display Technology," Technical Digest of the IEEJ 14th Sensor Symposium, Jun. 4-5, 1996, pp. 297-304.
J. Heikenfeld et. al., "Contrast Enhancement in Black Dielectric Electroluminescent Devices", IEEE Transactions on Electron Devices, 49: 8, 1348-52 (2002).
Jepsen et al, "4.11: 0.9" SXGA Liquid Crystal on Silicon Panel with 450 Hz. Field Rate," SID MicroDisplay Corporation, pp. 106-109 (Sep. 2001).
Joaquirn, M., "Polyphenyl Ether Lubricants" Synthetic Lubricants and High-performance Functional Fluids, R. L. Rudnick and R. L. Shubkin, Eds., p. 239, Marcel Dekker, Inc., NY, 1999.
Johnstone et al, "Theoretical limits on the freestanding length of cantilevers produced by surface micromachining technology," J. Micromech. Microeng. 12: 855-861 (Published Oct. 3, 2002).
Jones et al, "29-1: Addressing TVmin Ferroelectric Liquid Crystal Displays," (1998).
Judy, et al, "Self-Adjusting Microstructures(SAMS)," Proceedings of the Workshop on Micro Electro Mechanical Systems, New York, Jan. 30, 1991, vol. Workshop 4, pp. 51-56.
Judy, M. W., "Micromechanisms Using Sidewall Beams," Dissertation, University of California at Berkeley, 1994.
Kalantar et al, "Optical Micro Deflector Based Functional Light-Guide Plate for Backlight Unit," SID 00 Digest, 1029-1031 (2000).

(56) References Cited

OTHER PUBLICATIONS

Kalantar, K., et al., "Backlight Unit with Double Surface Light Emission Using a Single Micro-structured Light-guide Plate," p. 1182, Society for Information Display Digest (2004).
Kalantar, "Modulation of viewing angle on an LCD surface through backlight optics," Journal of the SID, 11 (4): 647-652 (2003).
Kim, C.W., et al., "Manufacturing Technologies for the Next Generation a-Si TFT-LCD," Proceedings of the Intl. Display Mfg. Cnf. Seoul, Korea (2000).
Koden et al., "Ferroelectric Liquid Crystal Display," (Sep. 17, 1997).
Kuang et al., "Dynamic characteristics of shaped micro-actuators solved using the differential quadrature method," Journal of Micromechanics and Microengineering, 14: 647-655, (2004).
Kunzman A. et al., "10.3 White Enhancement for Color Sequential DLP", Society for Information Display, Digest of Technical Papers, 1998.
Lee, et al., "40.1: Distingusihed Contributed Paper: Integrated Amorphous Silicon Color Sensor on LCD Panel for LED Backlight Feedback Control System", Society for Information Display, Digest of Technical Papers, 2005, pp. 1376-1379.
Lee et al, "P-25: A LCOS Microdisplay Driver with Frame Buffering Pixels," SID 02 Digest, 292-295 (2002).
Legtenberg, et al., "Electrostatic Curved Electrode Actuators," Journal of Microelectromechanical Systems, 6 (3): 257-265 (Sep. 1997).
Li, J., et al., "DRIE-Fabricated Curved-Electrode Zipping Actuators with Low Pull-In Voltage," 12th International Conference on Solid State Sensors, Actuators and Microsystems, IEE, 480-483 (2003).
Liang et al, "Observation of electric field gradients near field-emission cathode arrays," Appl Phys. Lett., 66 (9): 1147-1149 (Feb. 27, 1995).
Liu et al, "Scaling Laws of Microactuators and Potential Applications of Electroactive Polymers in MEMS," SPIE, 3669: 345-354 (Mar. 1999).
"Low Temperature Polysilicon TFT Reflective Color LCD" by Techno World.
Maboudian et al., "Stiction reduction processes for surface micromachines," Tribology Letters, 3: 215-221 (1997).
Markandey V. et al., "Video Processing for DLP Display Systems," Texas Instruments Corporation, Mar. 13, 1996, pp. 21-32.
Mastrangelo et al, "Mechanical Stability and Adhesion of Microstructures Under Capillary Forces—Part I: Basic Theory," Journal of Microelectromechanical Systems, 2 (1): 33-43 (Mar. 1993).
Mastrangelo et al, "Mechanical Stability and Adhesion of Microstructures Under Capillary Forces—Part II: Experiments," Journal of Microelectromechanical Systems, 2 (1): 44-55 (Mar. 1993).
McLaughlin, "Progress in Projection and Large-Area Displays," Proceedings of the IEEE, 90 (4): 521-532 (Apr. 2002).
"MicroLensTm—Re-Inventing LCD Backlighting," Global Lighting Technologies Inc., http://www.glthome.com/tech.htm, 1-2; retrieved on Aug. 3, 2006.
"Microprism Technology for Luminaires," Reflexite Display Optics (2004). Check Publication and Date.
"Nano TM Su-8 2000 Negative Tone Photoresist Formulations 2002-2025," Micro Che, Rev. 2/02m. Check Publication and Date.
Non Final Office Action Dated Mar. 22, 2007, U.S. Appl. No. 11/546,937.
Non Final Office Action dated Nov. 1, 2006, U.S. Appl. No. 11/218,690.
Notice of Allowance and Fee(s) Due, mailed Jan. 31, 2008 (U.S. Appl. No. 11/361,785).
Office Action dated Dec. 5, 2011 in Japanese Patent Application No. 2008-058190.
Office Action dated Jul. 15, 2010 in Japanese Patent Application No. 2007-556428.
Office Action dated Mar. 28, 2012 in European Patent Office Application No. 07795777.7.
Office Action dated Oct. 12, 2010 in Japanese Patent Application No. 2008-058190.
Office Action dated Sep. 16, 2011 in Japanese Patent Application No. 2007-556428.
Okumura et al, "Highly-efficient backlight for liquid crystal display having no optical films," Applied Physics Letters, 83 (13): 2515-2517 (Sep. 29, 2003).
"Optical Design Tools for Backlight Displays," Light Tools, Optical Engineering, Publication of ROCOES, 81: 90-101 (Jun. 2003).
Park, Y.I., et al., "Active Matrix OLED Displays Using Simple Poly-Si TFT Process," Society of Information Display, Digest, pp. 487-489 (2003).
Pasricha S. et al., "Dynamic Backlight Adaptation for Low Power Handheld Devices" IEEE Design and Test v. 21, 2004, pp. 398.
Perregaux, G., et al, "Arrays of Addressable High-Speed Optical Microshutters," CSEM Swiss Center for Electronics and Microtechnology Inc., Microsystems Division, pp. 232-235 (2001).
"Prism Brightness Enhancement Films," 3M Corporation, http://products3.3m.com/catalog/us/en001/electronics_mfg/vikuiti/node_V6G78RBQ5Tbe/root_GST1T4S9TCgv/vroot_S6Q2FD9X0Jge/gvel_GD378DOHGJgl/theme_us_vikuiti_3_0/command_AbcPageHandler/ output_html Retrieved on Aug. 3, 2006.
"Prism Sheet," Mitsubishi Rayon America Inc., http://www.mrany.com/data/HTML/29.htm Retrieved on Aug. 4, 2006.
Qiu et al, "A Curved-Beam Bistable Mechanism," Journal of Microelectromechanical Systems, 13 (2): 137-145 (Apr. 2004).
Qiu et al, "A High-Current Electrothermal Bistable MEMS Relay," Micro Electro Mechanical Systems, MEMS-03 Kyoto, pp. 64-67 (Jan. 19-23, 2003).
Ravnkilde J. et al. "Fabrication of Nickel Microshutter Arrays for Spatial Light Modulation", Mesomechanics, 2002, pp. 161-165. Also on their web site: http://www2.mic.dtu.dk/research/mems/publications/Papers/Dicon_Meso2002.pdf.
Roosendaal et al, "25.2: A Wide Gamut, High Aperture Mobile Spectrum Sequential Liquid Crystal Display," SID 05 Digest, 1116-1119 (2005).
Saeedi, et. al. "Molten-Alloy Driven Self-Assembly for Nano and Micro Scale System Integration" Fluid Dynamics and Materials Processing, vol. 2, No. 4, pp. 221-245 (2006).
Sato, "Research on Flexible Display Systems," Broadcast Technology, 21: 10-15 (Winter, 2005).
Sharp Specification No. LCP-03015 for Mobile Liquid Crystal Display Group, Sharp Corporation, Jun. 13, 2003.
Shikida et al, "Fabrication of an S-shaped Microactuator," Journal of Microelectromechanical Systems, 6 (1): 18-24 (Mar. 1997).
Sony Corporation, "ACX705AKM, 6.92cm Diagonal Reflective Color LCD Module".
Steyn, Lodewyck, "Electroquasistatic Zipper Actuators: A Technology Review", Dec. 2004.
Tagaya et al., "Thin Liquid-Crystal Display Backlight System with Highly Scattering Optical Transmission Polymers," Applied Optics, 40 (34): 6274-6280 (Dec. 2001).
Takatori, et al., "6.3: Field-Sequential Smectic LCD with TFT Pixel Amplifier," SID 01, 2001, Digest, pp. 48-51.
Tan et al "Soldering Technology for Optoelectronics Packaging", 1996 Electronic Components and Technology Conference, pp. 26-36 (1996).
Teijido, J.M., "Conception and Design of Illumination Light Pipes," Thesis No. 1498 for University of Neuchatel, http://www.unige.ch/cyberdocuments/unine/theses2000/TeijidoJM/these_front.htm 1: 1-99 Retrieved on Aug. 3, 2006.
Tien et al, "MEMS Actuators for Silicon Micro-Optical Elements," Proc. of SPIE, 4178: 256-269, (2000).
"Two Proprietary Technologies Supporting OMRON Backlight," OMRON Electronics Corporation, OMRON Electronics Components Web, www.omron.co.jp/ecb/products/bklight/english/genri/index.html, retrieved on Aug. 3, 2006.
Underwood, "A review of microdisplay technologies," SID © EID, (Nov. 21 to 23, 2000).
Underwood, "LCoS through the looking glass," SID (2001).
van de Biggelaar, et. al. "Passive and Active Matrix Addressed Polymer Light-emitting Diode Displays", Proc. SPIE vol. 4295, p. 134 (2001).

(56) References Cited

OTHER PUBLICATIONS

Vangbo et al, "A lateral symmetrically bistable buckled beam," J. Micromech. Microeng., 8: 29-32 (1998).
Wang et al., "A highly efficient system for automatic face region detection in MPEG video." IEEE Trans. on Circuits and Systems for Video Technology, vol. 7 Issue 4, Aug. 1997, pp. 615-628.
Wang K. et al., "Highly Space-Efficient Electrostatic Zigzag Transmissive Micro-Optic Switches for an Integrated MEMS Optical Display System", Transducers 03 Conference, Jun. 8-12, 2003, vol. 1, pp. 575-575.
Yamada et al, "52.2: Invited Paper: Color Sequential LCD Based on OCB with an LED Backlight," SID 00 Digest, 1180-1183 (2000).
Yasumura et al, "Fluid Damping of an Electrostatic Actuator for Optical Switching Applications," Transducers Research Foundation (2002).
Extended European Search Report dated Mar. 15, 2013 in EP Application No. EP12181160.8.
European Search Report—EP10004275—Search Authority—Munich—Jun. 7, 2011.
Microchem "Nano SU 8 2000", product brochure for thick polymer, Rev. 2/02.
"Microprism Technology for Liminaires," Reflexite Corporation, Technical Publication RLO-181, Rev. 2 (2003).
Boer W.D., "AMLCD Electronics", Active Matrix Liquid Crystal Displays: Fundamentals and Applications, 2005 pp. 87-111, XP055089329, U.S.A, ISBN: 978-0-75-067813-1.
Boer W.D., "Improvement of Image Quality in AMLCDs", Active Matrix Liquid Crystal Displays: Fundamentals and Applications, 2005, pp. 139-177, XP055089313, U.S.A, ISBN: 978-0-75-067813-1.
Extended European Search Report and Written Opinion dated Jun. 17, 2011 in EP10004275.
International Search Report and Written Opinion—PCT/US2007/026470, International Search Authority—European Patent Office—Sep. 26, 2008.
Uchida T. et al., "Encyclopedia of Flat Panel Displays", Japan, Kogyo Chosakai Publishing Co., Ltd./Yukio Shimura, Dec. 25, 2001, pp. 617 to 619.

* cited by examiner

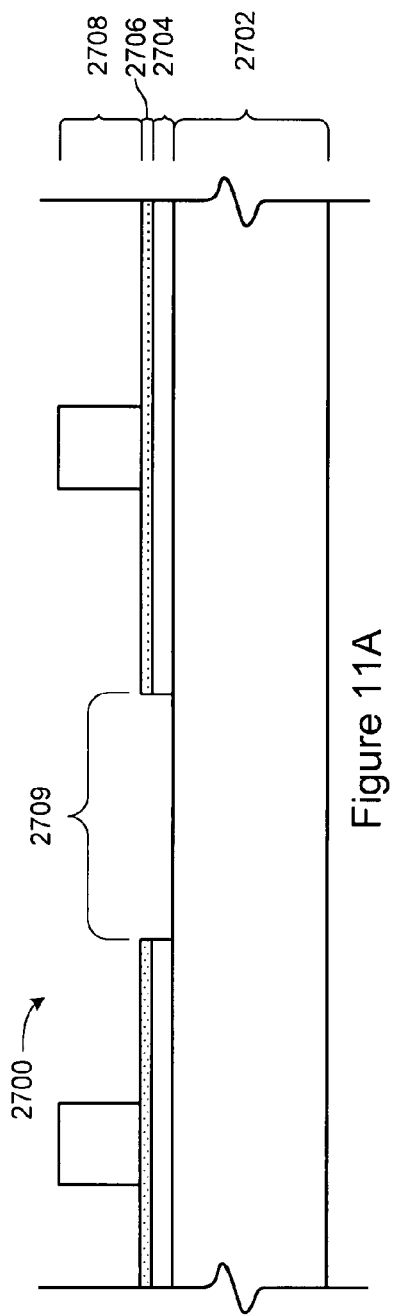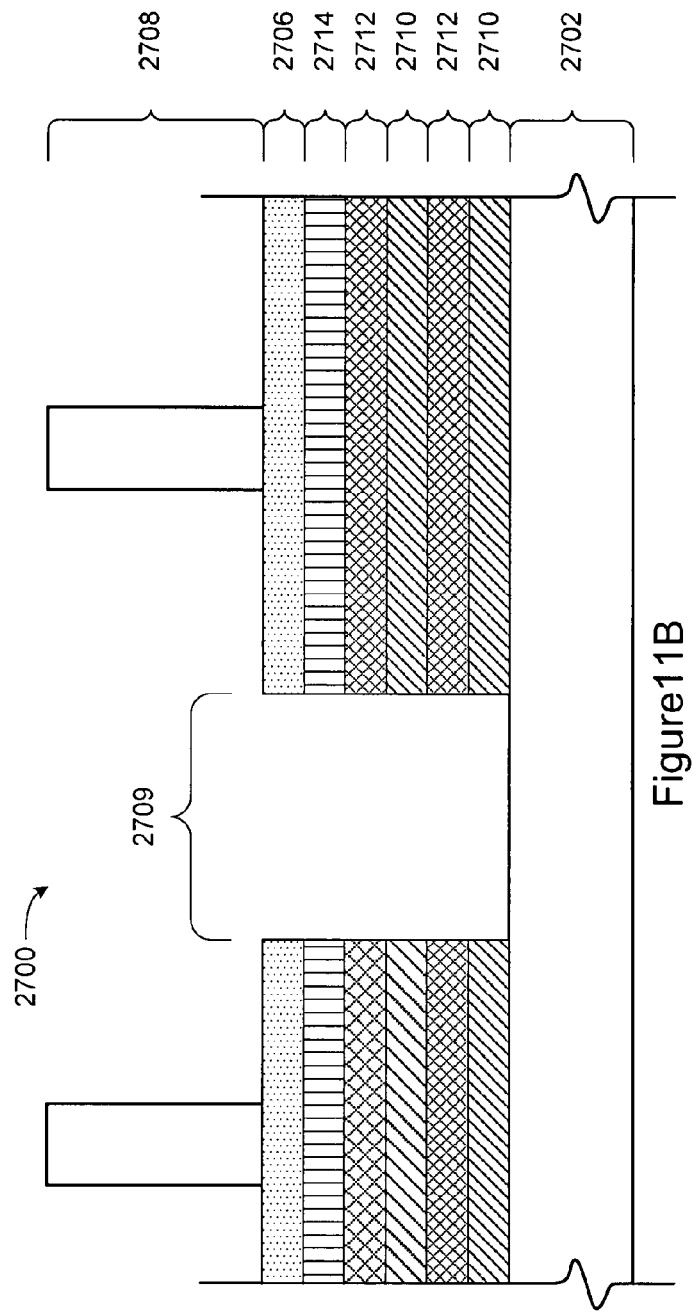

ALIGNMENT METHODS IN FLUID-FILLED MEMS DISPLAYS

CROSS-REFERENCE TO RELATED APPLICATIONS

This application is a continuation of U.S. patent application Ser. No. 11/975,397, filed on Oct. 19, 2007, which claims priority to and benefit of U.S. Provisional Patent Application No. 60/930,872, entitled "MEMS Displays and Assembly Methods" and filed on May 18, 2007, and is also a continuation-in-part of U.S. patent application Ser. No. 11/656,307, entitled "Methods and Apparatus for Actuating Displays" and filed on Jan. 19, 2007, now U.S. Pat. No. 7,502,159, which is a continuation-in-part of U.S. patent application Ser. No. 11/251,035, entitled "Methods and Apparatus for Actuating Displays" and filed on Oct. 14, 2005, now U.S. Pat. No. 7,271,945, which is a continuation-in-part of U.S. patent application Ser. No. 11/218,690, entitled "Methods and Apparatus for Spatial Light Modulation" and filed on Sep. 2, 2005, now U.S. Pat. No. 7,417,782, which claims priority to and benefit of U.S. Provisional Patent Application No. 60/676,053, entitled "MEMS Based Optical Display" and filed on Apr. 29, 2005, and U.S. Provisional Application 60/655,827, entitled "MEMS Based Display Modules" and filed on Feb. 23, 2005, and is also a continuation-in-part of U.S. patent application Ser. No. 11/218,690, entitled "Methods and Apparatus for Spatial Light Modulation" and filed on Sep. 2, 2005, now U.S. Pat. No. 7,417,782, which claims priority to and benefit of U.S. Provisional Patent Application No. 60/676,053, entitled "MEMS Based Optical Display" and filed on Apr. 29, 2005, and U.S. Provisional Application 60/655,827, entitled "MEMS Based Display Modules" and filed on Feb. 23, 2005. The entirety of each of these provisional and non-provisional applications is incorporated by reference herein.

FIELD

In general, the application relates to the field of assembly of imaging displays, in particular, the invention relates to the assembly of mechanically actuated display apparatus.

BACKGROUND

Displays built from mechanical light modulators are an attractive alternative to displays based on liquid crystal technology. Mechanical light modulators are fast enough to display video content with good viewing angles and with a wide range of color and grey scale. Mechanical light modulators have been successful in projection display applications. Backlit displays using mechanical light modulators have not yet demonstrated sufficiently attractive combinations of brightness and low power. There is a need in the art for fast, bright, low-powered mechanically actuated displays.

Unlike in liquid crystal displays, MEMS-based displays include hundreds, thousands, or in some cases, millions of moving elements. In some devices, every movement of an element provides an opportunity for stiction to disable one or more of the elements. In addition, effective operation of MEMS-based displays depends on the coupling of optical, electrical, and/or mechanical components. Misalignment of such components can lead to inferior picture quality and potentially even inoperability of the display as a whole.

SUMMARY

Thus a need exists in the art to be able to precisely align the various substrates that make up a MEMS display. At least in part to address this need, in one aspect, the invention relates to a method of manufacturing a display assembly. The method includes providing a first substrate on which a plurality of MEMS light modulators has been fabricated. The first substrate may be opaque or transparent. Each light modulator has a light and a dark state. The method also includes providing a second substrate, which is preferably transparent, that includes a layer in which a plurality of apertures is formed. In one embodiment, the layer is reflective. In other embodiments, the layer is light-absorbing. The first and second substrates are then aligned to establish a correspondence between respective light modulators and apertures.

The MEMS light modulators include modulation elements, for example, shutters, light taps, oils, or interference modulators, which have at least one edge. Each aperture also has an edge. In one embodiment, the first and substrates are aligned such that when light modulators are in a dark state, an edge of their respective light modulation elements overlap an edge of a corresponding aperture by more than 0 microns and less than about 20 microns. In another embodiment, the edges of the light modulators, in a dark state, overlap edges of the apertures by more than 0 microns but less than about 5 microns.

The alignment may be maintained in a number of ways. It can be maintained by bonding the first substrate to the second substrate with an adhesive or a heat reflowable material, or by coupling interlocking features formed on or in the first and second substrates.

The assembly process can handle the manufacture of individual display assemblies, or multiple display assemblies in parallel. In the latter case, the plurality of MEMS modulators on the first substrate includes multiple arrays of MEMS modulators positioned on a panel. The plurality of apertures on the second substrate likewise includes corresponding multiple arrays of apertures. When manufacturing multiple display assemblies from a single panel, the assembly process including singulating the display panels. The singulation of the substrates can be carried out before or after they are aligned and/or sealed.

To align the substrates, alignment marks can be formed on each of the first and second substrates. The substrates can then be loaded into an alignment apparatus that includes a vision system for monitoring misalignment between alignment marks. The alignment apparatus also includes motors or drives for adjusting the relative positions of the two substrates. The alignment apparatus may also include UV lamps for curing adhesive materials.

In one embodiment, the alignment method includes applying spacers to one of the substrates to establish a fixed separation between the substrates. The spacers may be formed from a conductive material to bridge a gap between the two substrates.

In addition, stiction can be reduced by having the surfaces of the display components (including front and rear surfaces of moving elements) wetted by a fluid, such as a lubricant. Various liquids and gases, when surrounding moving components of MEMS light modulators, in addition to reducing stiction, can also provide improved optical and electromechanical performance of a display.

Accordingly, according to another aspect, the invention relates to a display assembly that includes an array of light modulators having elements that are substantially surrounded by, and preferably move through, a liquid, such as a lubricant. The array of light modulators are formed on a first substrate. The first substrate is sealed with an adhesive to a second, transparent substrate, to contain the liquid surrounding the MEMS light modulators. The seal also acts to restrict relative motion between the two substrates. In one embodiment, the seal is formed from a polymer material.

The liquid sealed in the display assembly has a first index of refraction and the substrate on which the aperture layer is disposed has a second index of refraction. In one embodiment, the first index of refraction is greater than or substantially equal to that of the second index of refraction. The liquid is also preferably non-conductive and has a dielectric constant that is greater than 2.0.

BRIEF DESCRIPTION OF THE DRAWINGS

The foregoing discussion will be understood more readily from the following detailed description of the invention with reference to the following drawings:

FIGS. 11A and 11B are cross sectional views of an aperture plate, according to an illustrative embodiment of the invention.

DETAILED DESCRIPTION

To provide an overall understanding of the invention, certain illustrative embodiments will now be described, including apparatus and methods for displaying images. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

Figure 1A:
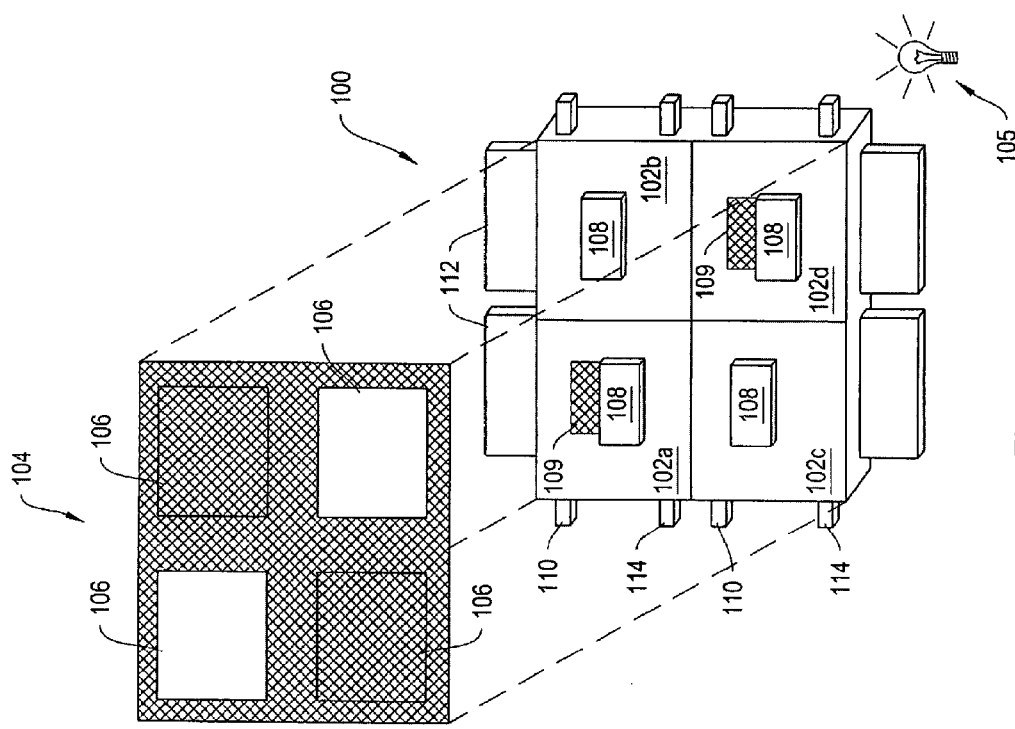
FIG. 1A is an isometric view of display apparatus, according to an illustrative embodiment of the invention.

FIG. 1A is a schematic diagram of a direct-view MEMS-based display apparatus 100, according to an illustrative embodiment of the invention. The display apparatus 100 includes a plurality of light modulators 102a-102d (generally "light modulators 102") arranged in rows and columns. In the display apparatus 100, light modulators 102a and 102d are in the open state, allowing light to pass. Light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e. by use of a frontlight. In one of the closed or open states, the light modulators 102 interfere with light in an optical path by, for example, and without limitation, blocking, reflecting, absorbing, filtering, polarizing, diffracting, or otherwise altering a property or path of the light.

In the display apparatus 100, each light modulator 102 corresponds to a pixel 106 in the image 104. In other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide grayscale in an image 104. With respect to an image, a "pixel" corresponds to the smallest picture element defined by the resolution of the image. With respect to structural components of the display apparatus 100, the term "pixel" refers to the combined mechanical and electrical components utilized to modulate the light that forms a single pixel of the image.

Display apparatus 100 is a direct-view display in that it does not require imaging optics. The user sees an image by looking directly at the display apparatus 100. In alternate embodiments the display apparatus 100 is incorporated into a projection display. In such embodiments, the display forms an image by projecting light onto a screen or onto a wall. In projection applications the display apparatus 100 is substantially smaller than the projected image 104.

Direct-view displays may operate in either a transmissive or reflective mode. In a transmissive display, the light modulators filter or selectively block light which originates from a lamp or lamps positioned behind the display. The light from the lamps is optionally injected into a light guide or "backlight". Transmissive direct-view display embodiments are often built onto transparent or glass substrates to facilitate a sandwich assembly arrangement where one substrate, containing the light modulators, is positioned directly on top of the backlight In some transmissive display embodiments, a color-specific light modulator is created by associating a color filter material with each modulator 102. In other transmissive display embodiments colors can be generated, as described below, using a field sequential color method by alternating illumination of lamps with different primary colors.

Each light modulator 102 includes a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material.

The display apparatus also includes a control matrix connected to the substrate and to the light modulators for controlling the movement of the shutters. The control matrix includes a series of electrical interconnects (e.g., interconnects 110, 112, and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, Vwe"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
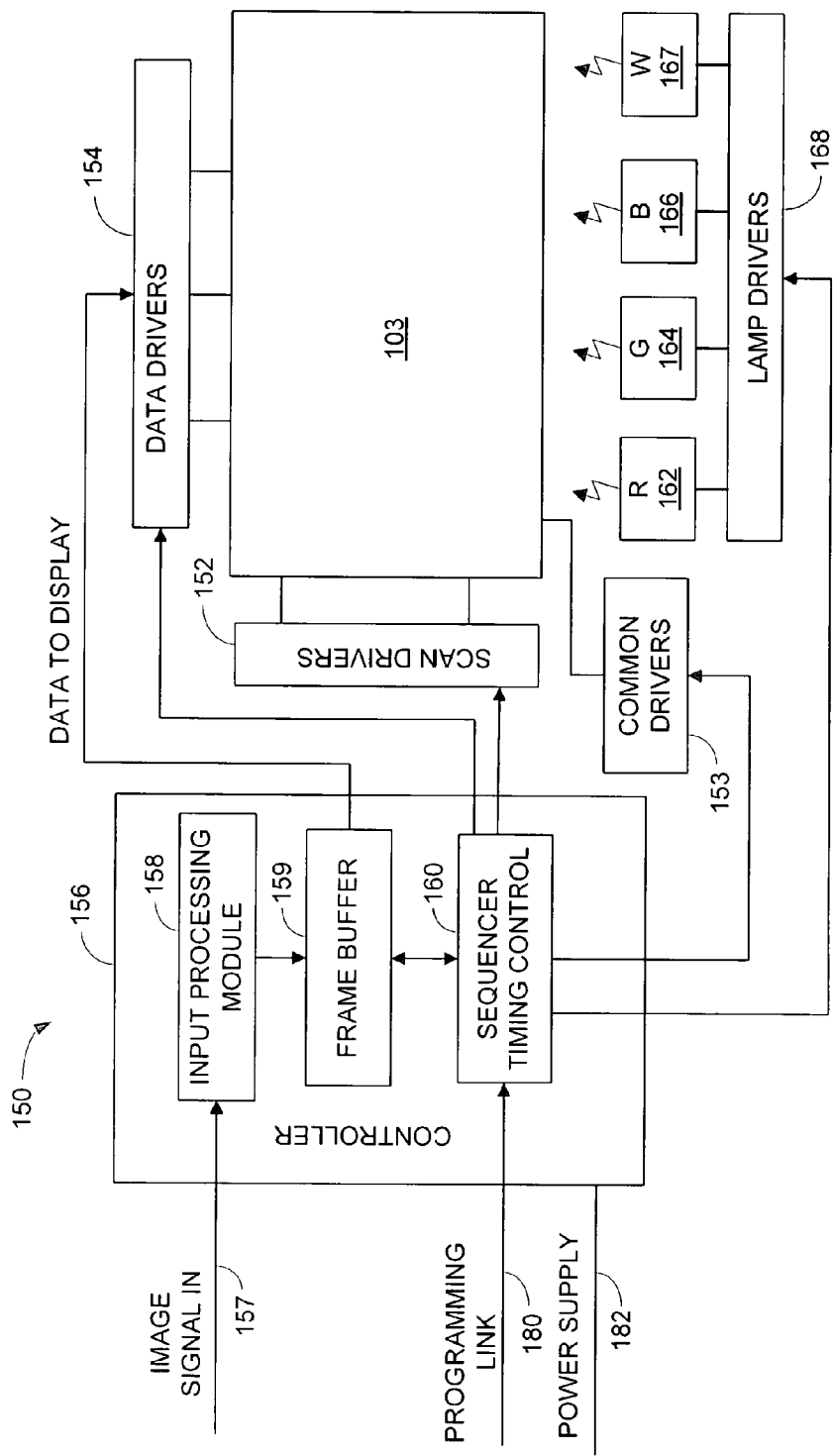
FIG. 1B is a block diagram of the display apparatus of FIG. 1A, according to an illustrative embodiment of the invention.

FIG. 1B is a block diagram 150 of the display apparatus 100. Referring to FIGS. 1A and 1B, in addition to the elements of the display apparatus 100 described above, as depicted in the block diagram 150, the display apparatus 100 includes a plurality of scan drivers 152 (also referred to as "write enabling voltage sources") and a plurality of data drivers 154 (also referred to as "data voltage sources"). The scan drivers 152 apply write enabling voltages to scan-line interconnects 110. The data drivers 154 apply data voltages to the data interconnects 112. In some embodiments of the display apparatus, the data drivers 154 are configured to provide analog data voltages to the light modulators, especially where the gray scale of the image 104 is to be derived in analog fashion. In analog operation the light modulators 102 are designed such that when a range of intermediate voltages is applied through the data interconnects 112 there results a range of intermediate open states in the shutters 108 and therefore a range of intermediate illumination states or gray scales in the image 104.

In other cases the data drivers 154 are configured to apply only a reduced set of 2, 3, or 4 digital voltage levels to the control matrix. These voltage levels are designed to set, in digital fashion, either an open state or a closed state to each of the shutters 108.

The scan drivers 152 and the data drivers 154 are connected to digital controller circuit 156 (also referred to as the "controller 156"). The controller 156 includes an input processing module 158, which processes an incoming image signal 157 into a digital image format appropriate to the spatial addressing and the gray scale capabilities of the display 100. The pixel location and gray scale data of each image is stored in a frame buffer 159 so that the data can be fed out as needed to the data drivers 154. The data is sent to the data drivers 154 in mostly serial fashion, organized in predetermined sequences grouped by rows and by image frames. The data drivers 154 can include series to parallel data converters, level shifting, and for some applications digital to analog voltage converters.

The display 100 apparatus optionally includes a set of common drivers 153, also referred to as common voltage sources. In some embodiments the common drivers 153 provide a DC common potential to all light modulators within the array of light modulators 103, for instance by supplying voltage to a series of common interconnects 114. In other embodiments the common drivers 153, following commands from the controller 156, issue voltage pulses or signals to the array of light modulators 103, for instance global actuation pulses which are capable of driving and/or initiating simultaneous actuation of all light modulators in multiple rows and columns of the array 103.

All of the drivers (e.g., scan drivers 152, data drivers 154, and common drivers 153) for different display functions are time-synchronized by a timing-control module 160 in the controller 156. Timing commands from the module 160 coordinate the illumination of red, green and blue and white lamps (162, 164, 166, and 167 respectively) via lamp drivers 168, the write-enabling and sequencing of specific rows within the array of pixels 103, the output of voltages from the data drivers 154, and the output of voltages that provide for light modulator actuation.

The controller 156 determines the sequencing or addressing scheme by which each of the shutters 108 in the array 103 can be re-set to the illumination levels appropriate to a new image 104. Details of suitable addressing, image formation, and gray scale techniques can be found in U.S. patent application Ser. Nos. 11/326,696 and 11/643,042, incorporated herein by reference. New images 104 can be set at periodic intervals. For instance, for video displays, the color images 104 or frames of video are refreshed at frequencies ranging from 10 to 300 Hertz. In some embodiments the setting of an image frame to the array 103 is synchronized with the illumination of the lamps 162, 164, and 166 such that alternate image frames are illuminated with an alternating series of colors, such as red, green, and blue The image frames for each respective color is referred to as a color sub-frame. In this method, referred to as the field sequential color method, if the color sub-frames are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 156 determines the addressing sequence and/or the time intervals between image frames to produce images 104 with appropriate gray scale. The process of generating varying levels of grayscale by controlling the amount of time a shutter 108 is open in a particular frame is referred to as time division gray scale. In one embodiment of time division gray scale, the controller 156 determines the time period or the fraction of time within each frame that a shutter 108 is allowed to remain in the open state, according to the illumination level or gray scale desired of that pixel. In other implementations, for each image frame, the controller 156 sets a plurality of sub-frame images in multiple rows and columns of the array 103, and the controller alters the duration over which each sub-frame image is illuminated in proportion to a gray scale value or significance value employed within a coded word for gray scale. For instance, the illumination times for a series of sub-frame images can be varied in proportion to the binary coding series 1, 2, 4, 8 . . . . The shutters 108 for each pixel in the array 103 are then set to either the open or closed state within a sub-frame image according to the value at a corresponding position within the pixel's binary coded word for gray level.

In other implementations, the controller alters the intensity of light from the lamps 162, 164, and 166 in proportion to the gray scale value desired for a particular sub-frame image. A number of hybrid techniques are also available for forming colors and gray scale from an array of shutters 108. For instance, the time division techniques described above can be combined with the use of multiple shutters 108 per pixel, or the gray scale value for a particular sub-frame image can be established through a combination of both sub-frame timing and lamp intensity. Details of these and other embodiments can be found in U.S. patent application Ser. No. 11/643,042, referenced above.

In some implementations the data for an image state 104 is loaded by the controller 156 to the modulator array 103 by a sequential addressing of individual rows, also referred to as scan lines. For each row or scan line in the sequence, the scan driver 152 applies a write-enable voltage to the write enable interconnect 110 for that row of the array 103, and subsequently the data driver 154 supplies data voltages, corresponding to desired shutter states, for each column in the selected row. This process repeats until data has been loaded for all rows in the array. In some implementations the sequence of selected rows for data loading is linear, proceeding from top to bottom in the array. In other implementations the sequence of selected rows is pseudo-randomized, in order to minimize visual artifacts. And in other implementations the sequencing is organized by blocks, where, for a block, the data for only a certain fraction of the image state 104 is loaded to the array, for instance by addressing only every $5^{th}$ row of the array in sequence.

In some implementations, the process for loading image data to the array 103 is separated in time from the process of actuating the shutters 108. In these implementations, the modulator array 103 may include data memory elements for each pixel in the array 103 and the control matrix may include a global actuation interconnect for carrying trigger signals, from common driver 153, to initiate simultaneous actuation of shutters 108 according to data stored in the memory elements. Various addressing sequences, many of which are described in U.S. patent application Ser. No. 11/643,042, can be coordinated by means of the timing control module 160.

In alternative embodiments, the array of pixels 103 and the control matrix that controls the pixels may be arranged in configurations other than rectangular rows and columns. For example, the pixels can be arranged in hexagonal arrays or curvilinear rows and columns. In general, as used herein, the term scan-line shall refer to any plurality of pixels that share a write-enabling interconnect.

The display 100 is comprised of a plurality of functional blocks including the timing control module 160, the frame buffer 159, scan drivers 152, data drivers 154, and drivers 153 and 168. Each block can be understood to represent either a distinguishable hardware circuit and/or a module of executable code. In some implementations the functional blocks are provided as distinct chips or circuits connected together by means of circuit boards and/or cables. Alternately, many of these circuits can be fabricated along with the pixel array 103 on the same substrate of glass or plastic. In other implementations, multiple circuits, drivers, processors, and/or control functions from block diagram 150 may be integrated together within a single silicon chip, which is then bonded directly to the transparent substrate holding pixel array 103.

The controller 156 includes a programming link 180 by which the addressing, color, and/or gray scale algorithms, which are implemented within controller 156, can be altered according to the needs of particular applications. In some embodiments, the programming link 180 conveys information from environmental sensors, such as ambient light or temperature sensors, so that the controller 156 can adjust imaging modes or backlight power in correspondence with environmental conditions. The controller 156 also comprises a power supply input 182 which provides the power needed for lamps as well as light modulator actuation. Where necessary, the drivers 152 153, 154, and/or 168 may include or be associated with DC-DC converters for transforming an input voltage at 182 into various voltages sufficient for the actuation of shutters 108 or illumination of the lamps, such as lamps 162, 164, 166, and 167.

Figure 2A:
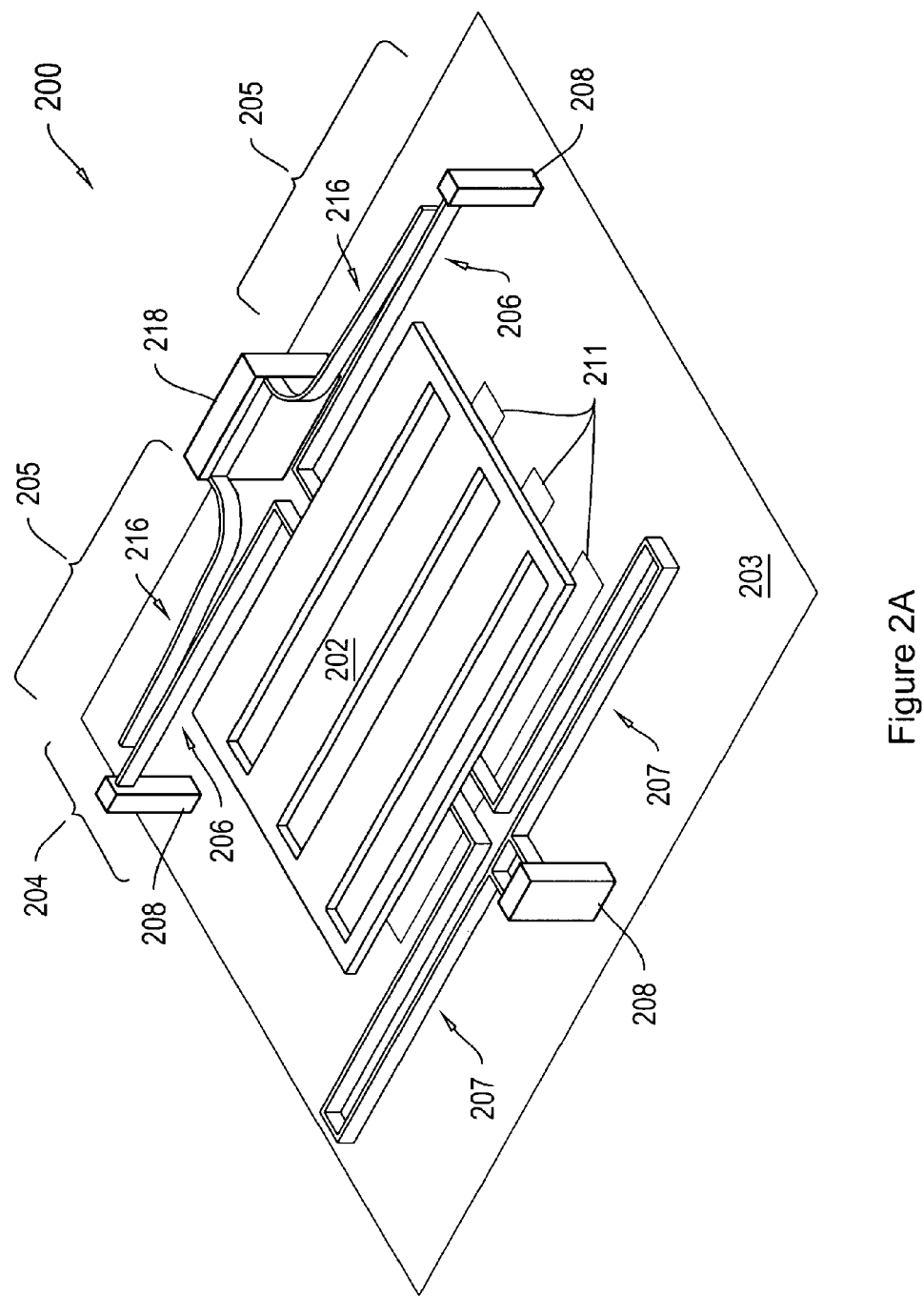
FIG. 2A is a perspective view of an illustrative shutter-based light modulator suitable for incorporation into the MEMS-based display of FIG. 1A, according to an illustrative embodiment of the invention.

FIG. 2A is a perspective view of an illustrative shutter-based light modulator 200 suitable for incorporation into the MEMS-based display apparatus 100 of FIG. 1A, according to an illustrative embodiment of the invention. The shutter-based light modulator 200 (also referred to as shutter assembly 200) includes a shutter 202 coupled to an actuator 204. The actuator 204 is formed from two separate compliant electrode beam actuators 205 (the "actuators 205"), as described in U.S. patent application Ser. No. 11/251,035, filed on Oct. 14, 2005. The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The load anchors 208 physically connect the compliant load beams 206 and the shutter 202 to the surface 203 and electrically connect the load beams 206 to a bias voltage, in some instances, ground.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

The surface 203 includes one or more apertures 211 for admitting the passage of light. If the shutter assembly 200 is formed on an opaque substrate, made for example from silicon, then the surface 203 is a surface of the substrate, and the apertures 211 are formed by etching an array of holes through the substrate. If the shutter assembly 200 is formed on a transparent substrate, made for example of glass or plastic, then the surface 203 is a surface of a light blocking layer deposited on the substrate, and the apertures are formed by etching the surface 203 into an array of holes 211. The apertures 211 can be generally circular, elliptical, polygonal, serpentine, or irregular in shape.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely towards the drive anchor 218. The compliant members 206 act as springs, such that when the voltage across the beams 206 and 216 is removed, the load beams 206 push the shutter 202 back into its initial position, releasing the stress stored in the load beams 206.

The shutter assembly 200, also referred to as an elastic shutter assembly, incorporates a passive restoring force, such as a spring, for returning a shutter to its rest or relaxed position after voltages have been removed. A number of elastic restore mechanisms and various electrostatic couplings can be designed into or in conjunction with electrostatic actuators, the compliant beams illustrated in shutter assembly 200 being just one example. Other examples are described in U.S. patent application Ser. Nos. 11/251,035 and 11/326,696, incorporated herein by reference. For instance, a highly non-linear voltage-displacement response can be provided which favors an abrupt transition between "open" vs "closed" states of operation, and which, in many cases, provides a bi-stable or hysteretic operating characteristic for the shutter assembly. Other electrostatic actuators can be designed with more incremental voltage-displacement responses and with considerably reduced hysteresis, as may be preferred for analog gray scale operation.

The actuator 205 within the elastic shutter assembly is said to operate between a closed or actuated position and a relaxed position. The designer, however, can choose to place apertures 211 such that shutter assembly 200 is in either the "open" state, i.e. passing light, or in the "closed" state, i.e. blocking light, whenever actuator 205 is in its relaxed position. For illustrative purposes, it is assumed below that elastic shutter assemblies described herein are designed to be open in their relaxed state.

In many cases it is preferable to provide a dual set of "open" and "closed" actuators as part of a shutter assembly so that the control electronics are capable of electrostatically driving the shutters into each of the open and closed states.

Figure 2B:
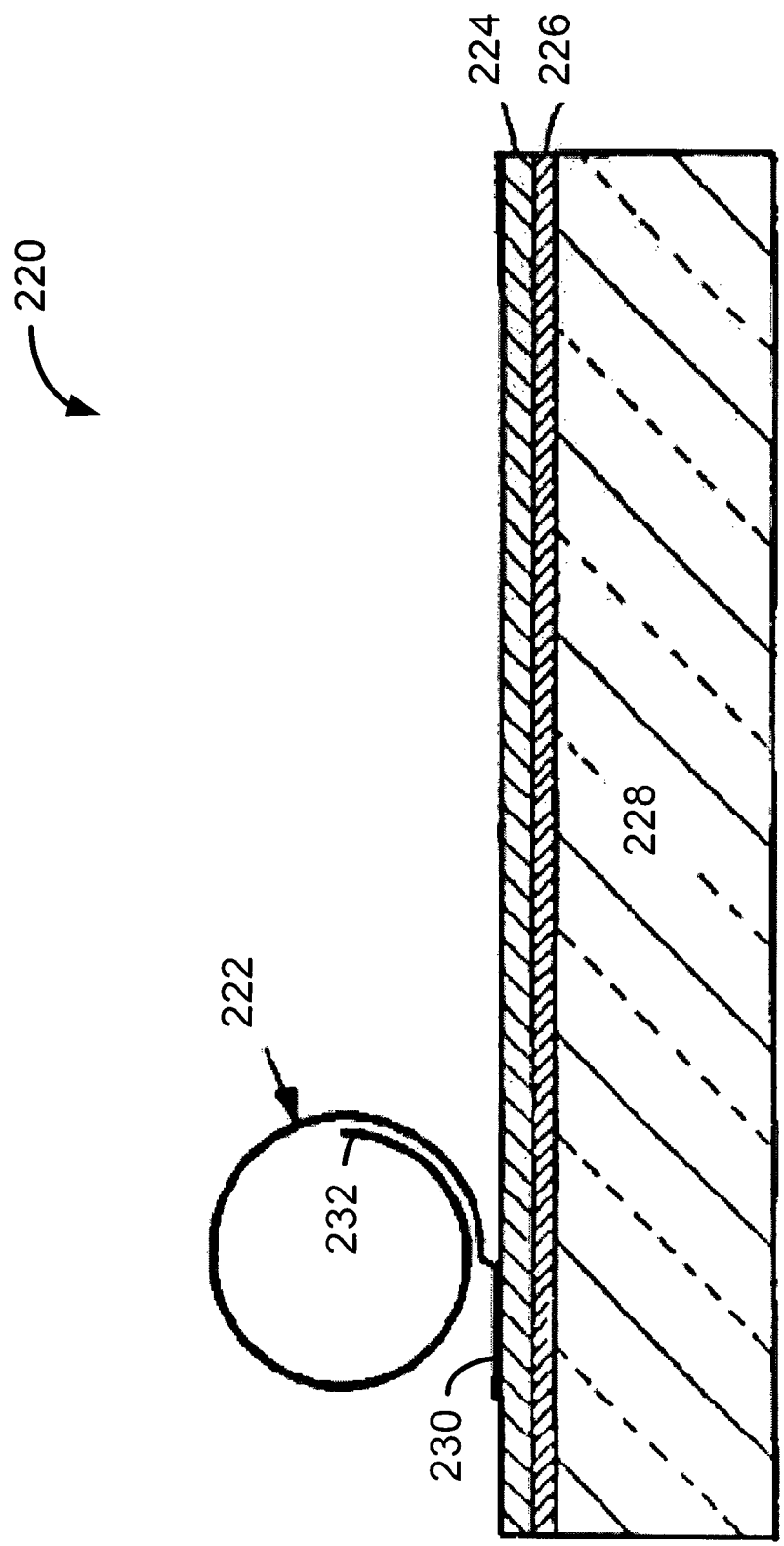
FIG. 2B is a cross-sectional view of a rollershade-based light modulator suitable for incorporation into the MEMS-based display of FIG. 1A, according to an illustrative embodiment of the invention.

Display apparatus 100, in alternative embodiments, includes light modulators other than transverse shutter-based light modulators, such as the shutter assembly 200 described above. For example, FIG. 2B is a cross-sectional view of a rolling actuator shutter-based light modulator 220 suitable for incorporation into an alternative embodiment of the MEMS-based display apparatus 100 of FIG. 1A, according to an illustrative embodiment of the invention. As described further in U.S. Pat. No. 5,233,459, entitled "Electric Display Device," and U.S. Pat. No. 5,784,189, entitled "Spatial Light Modulator," the entireties of which are incorporated herein by reference, a rolling actuator-based light modulator includes a moveable electrode disposed opposite a fixed electrode and biased to move in a preferred direction to produce a shutter upon application of an electric field. In one embodiment, the light modulator 220 includes a planar electrode 226 disposed between a substrate 228 and an insulating layer 224 and a moveable electrode 222 having a fixed end 230 attached to the insulating layer 224. In the absence of any applied voltage, a moveable end 232 of the moveable electrode 222 is free to roll towards the fixed end 230 to produce a rolled state. Application of a voltage between the electrodes 222 and 226 causes the moveable electrode 222 to unroll and lie flat against the insulating layer 224, whereby it acts as a shutter that blocks light traveling through the substrate 228. The moveable electrode 222 returns to the rolled state by means of an elastic restoring force after the voltage is removed. The bias towards a rolled state may be achieved by manufacturing the moveable electrode 222 to include an anisotropic stress state.

Figure 2C:
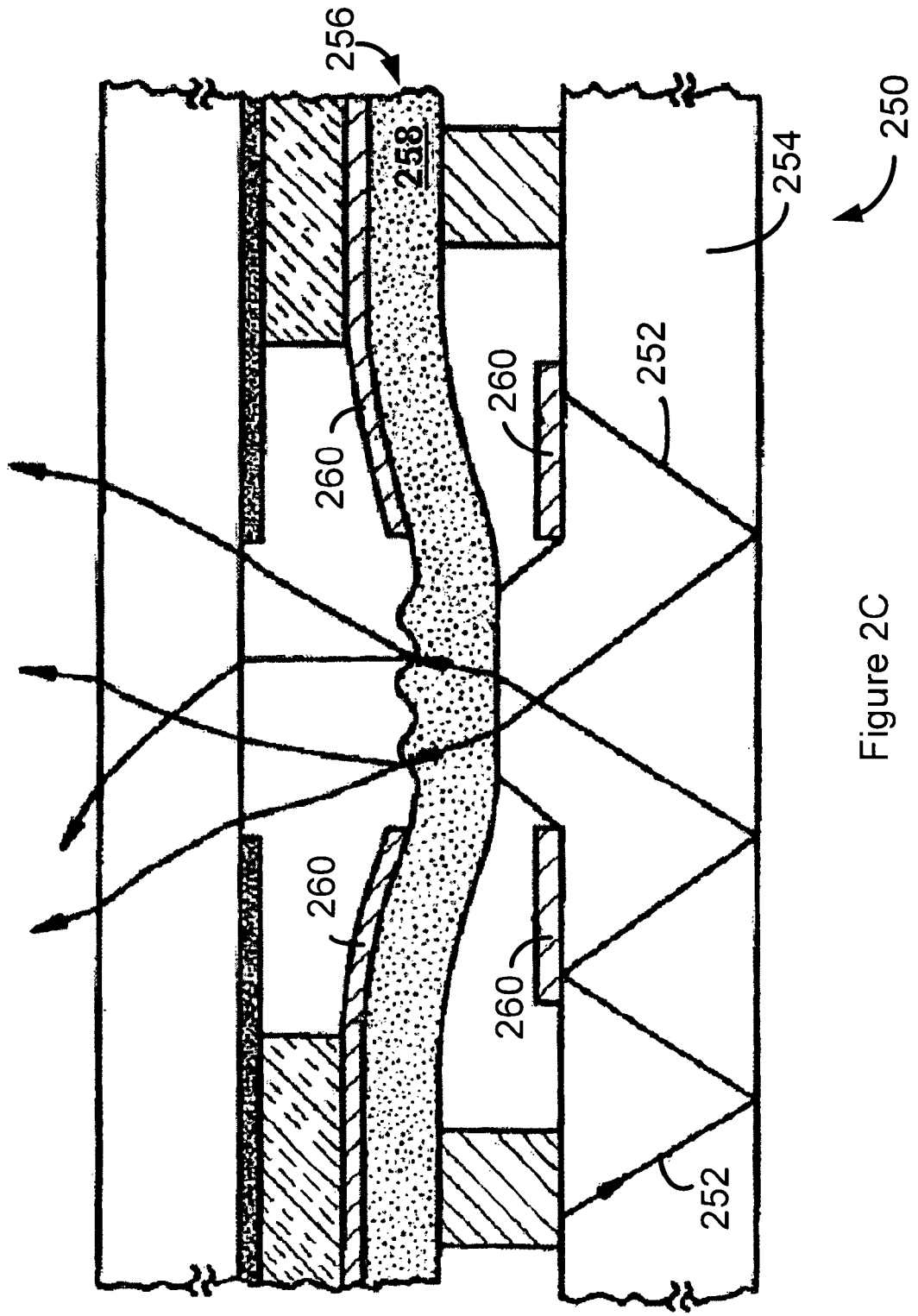
FIG. 2C is a cross sectional view of a light-tap-based light modulator suitable for incorporation into an alternative embodiment of the MEMS-based display of FIG. 1A, according to an illustrative embodiment of the invention.

FIG. 2C is a cross-sectional view of an illustrative non shutter-based MEMS light modulator 250. The light tap modulator 250 is suitable for incorporation into an alternative embodiment of the MEMS-based display apparatus 100 of FIG. 1A, according to an illustrative embodiment of the invention. As described further in U.S. Pat. No. 5,771,321, entitled "Micromechanical Optical Switch and Flat Panel Display," the entirety of which is incorporated herein by reference, a light tap works according to a principle of frustrated total internal reflection. That is, light 252 is introduced into a light guide 254, in which, without interference, light 252 is for the most part unable to escape the light guide 254 through its front or rear surfaces due to total internal reflection. The light tap 250 includes a tap element 256 that has a sufficiently high index of refraction that, in response to the tap element 256 contacting the light guide 254, light 252 impinging on the surface of the light guide 254 adjacent the tap element 256 escapes the light guide 254 through the tap element 256 towards a viewer, thereby contributing to the formation of an image.

In one embodiment, the tap element 256 is formed as part of beam 258 of flexible, transparent material. Electrodes 260 coat portions of one side of the beam 258. Opposing electrodes 260 are disposed on the light guide 254. By applying a voltage across the electrodes 260, the position of the tap element 256 relative to the light guide 254 can be controlled to selectively extract light 252 from the light guide 254.

The roller-based light modulator 220, and light tap modulator 250 are not the only examples of MEMS light modulators suitable for inclusion in various embodiments of the invention. It will be understood that other MEMS light modulators can exist and can be usefully incorporated into the invention.

U.S. patent application Ser. Nos. 11/251,035 and 11/326,696 have described a variety of methods by which an array of shutters can be controlled via a control matrix to produce images, in many cases moving images, with appropriate gray scale. In some cases, control is accomplished by means of a passive matrix array of row and column interconnects connected to driver circuits on the periphery of the display. In other cases it is appropriate to include switching and/or data storage elements within each pixel of the array (the so-called active matrix) to improve either the speed, the gray scale and/or the power dissipation performance of the display.

Figure 3:
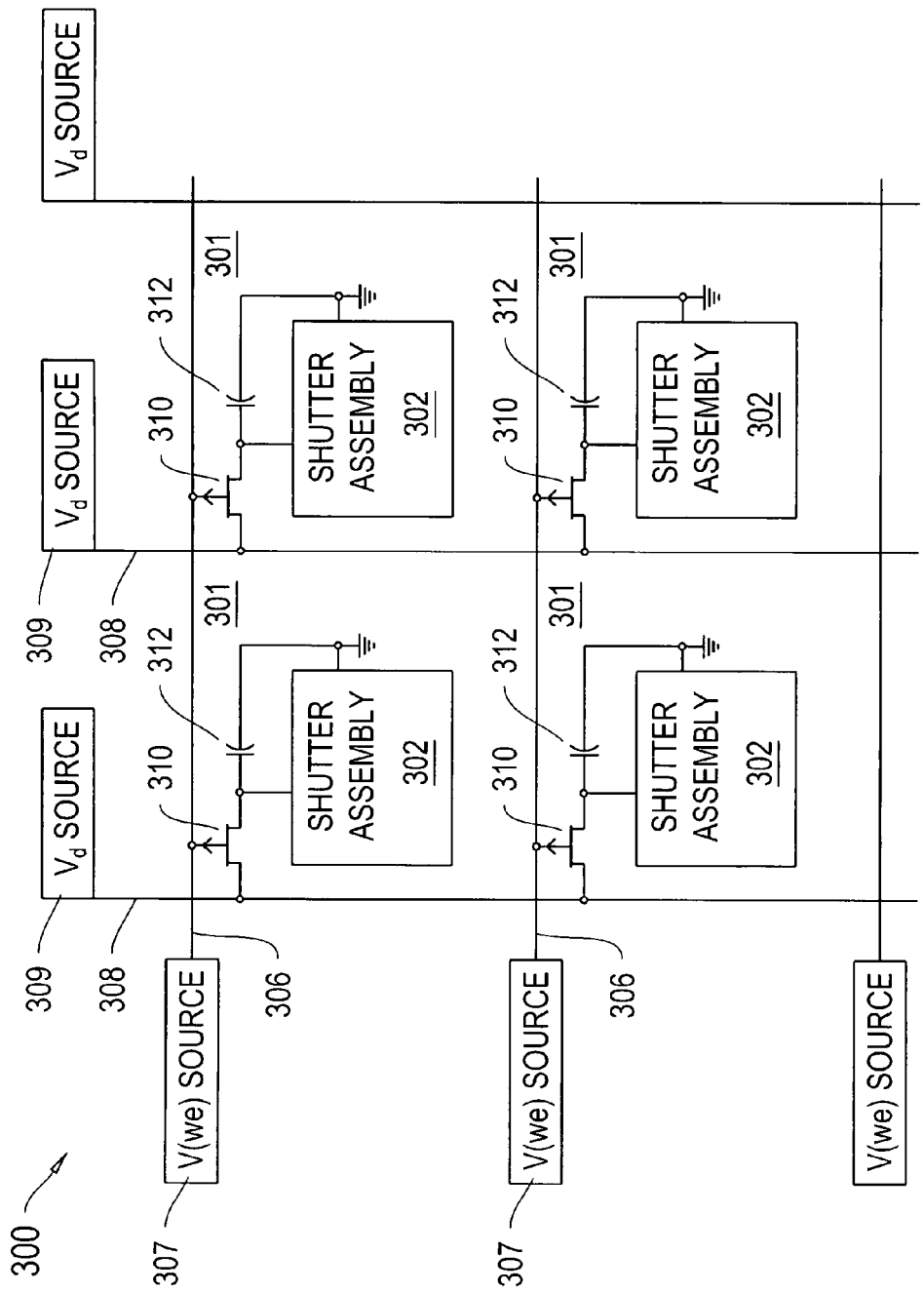
FIG. 3 is a schematic diagram of a control matrix suitable for controlling the light modulators incorporated into the MEMS-based display of FIG. 1A, according to an illustrative embodiment of the invention.
Figure 4:
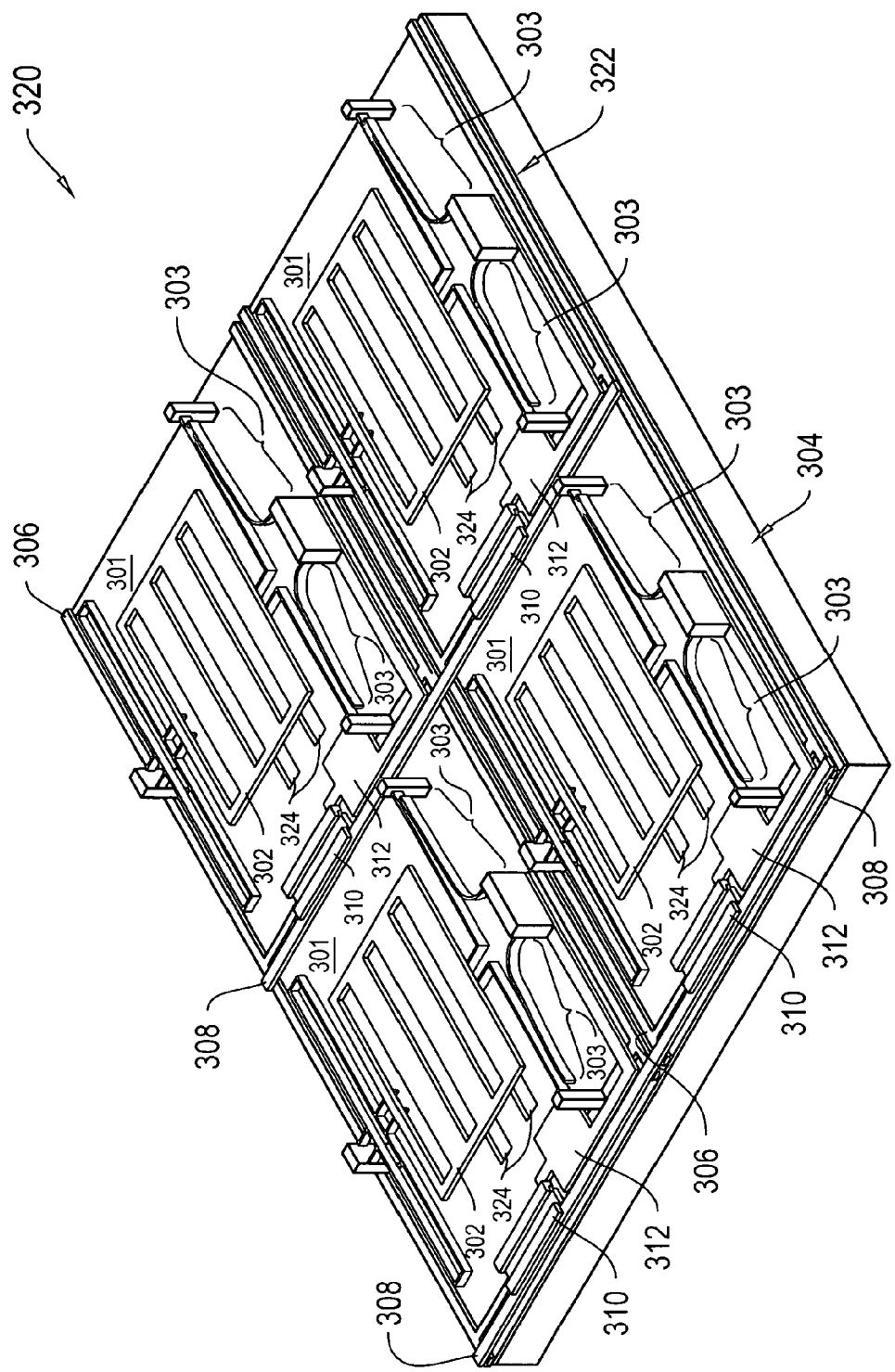
FIG. 4 is a perspective view of an array of shutter-based light modulators connected to the control matrix of FIG. 3, according to an illustrative embodiment of the invention.

FIG. 3 is a schematic diagram of a control matrix 300 suitable for controlling the light modulators incorporated into the MEMS-based display apparatus 100 of FIG. 1A, according to an illustrative embodiment of the invention. FIG. 4 is a perspective view of an array 320 of shutter-based light modulators connected to the control matrix 300 of FIG. 3, according to an illustrative embodiment of the invention. The control matrix 300 may address an array of pixels 320 (the "array 320"). Each pixel 301 includes an elastic shutter assembly 302, such as the shutter assembly 200 of FIG. 2A, controlled by an actuator 303. Each pixel also includes an aperture layer 322 that includes apertures 324. Further electrical and mechanical descriptions of shutter assemblies such as shutter assembly 302, and variations thereon, can be found in U.S. patent application Ser. Nos. 11/251,035 and 11/326,696. Descriptions of alternate control matrices can also be found in U.S. patent application Ser. No. 11/607,715.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source, ("Vd source") 309 to the pixels 301 in a corresponding column of pixels 301. In control matrix 300, the data voltage Vd provides the majority of the energy necessary for actuation of the shutter assemblies 302. Thus, the data voltage source 309 also serves as an actuation voltage source.

Referring to FIGS. 3 and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying $V_{we}$ to each scan-line interconnect 306 in turn. For a write-enabled row, the application of $V_{we}$ to the gates of the transistors 310 of the pixels 301 in the row allows the flow of current through the data interconnects 308 through the transistors 310 to apply a potential to the actuator 303 of the shutter assembly 302. While the row is write-enabled, data voltages Vd are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed $V_{at}$ (the actuation threshold voltage). In response to the application of $V_{at}$ to a data interconnect 308, the actuator 303 in the corresponding shutter assembly 302 actuates, opening the shutter in that shutter assembly 302. The voltage applied to the data interconnect 308 remains stored in the capacitor 312 of the pixel 301 even after the control matrix 300 ceases to apply V, to a row. It is not necessary, therefore, to wait and hold the voltage $V_{we}$ on a row for times long enough for the shutter assembly 302 to actuate; such actuation can proceed after the write-enabling voltage has been removed from the row. The capacitors 312 also function as memory elements within the array 320, storing actuation instructions for periods as long as is necessary for the illumination of an image frame.

The pixels 301 as well as the control matrix 300 of the array 320 are formed on a substrate 304. The array includes an aperture layer 322, disposed on the substrate 304, which includes a set of apertures 324 for respective pixels 301 in the array 320. The apertures 324 are aligned with the shutter assemblies 302 in each pixel. In one implementation the substrate 304 is made of a transparent material, such as glass or plastic. In another implementation the substrate 304 is made of an opaque material, but in which holes are etched to form the apertures 324.

Components of shutter assemblies 302 are processed either at the same time as the control matrix 300 or in subsequent processing steps on the same substrate. The electrical components in control matrix 300 are fabricated using many thin film techniques in common with the manufacture of thin film transistor arrays for liquid crystal displays. Available techniques are described in Den Boer, Active Matrix Liquid Crystal Displays (Elsevier, Amsterdam, 2005), incorporated herein by reference. The shutter assemblies are fabricated using techniques similar to the art of micromachining or from the manufacture of micromechanical (i.e., MEMS) devices. Many applicable thin film MEMS techniques are described in Rai-Choudhury, ed., Handbook of Microlithography, Micromachining & Microfabrication (SPIE Optical Engineering Press, Bellingham, Wash. 1997), incorporated herein by reference. Fabrication techniques specific to MEMS light modulators formed on glass substrates can be found in U.S. patent application Ser. Nos. 11/361,785 and 11/731,628, incorporated herein by reference. For instance, as described in those applications, the shutter assembly 302 can be formed from thin films of amorphous silicon, deposited by a chemical vapor deposition process.

The shutter assembly 302 together with the actuator 303 can be made bi-stable. That is, the shutters can exist in at least two equilibrium positions (e.g. open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 can also be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as spring 207 in shutter-based light modulator 200, or the opposing force may be exerted by an opposing actuator, such as an "open" or "closed" actuator.

The light modulator array 320 is depicted as having a single MEMS light modulator per pixel. Other embodiments are possible in which multiple MEMS light modulators are provided in each pixel, thereby providing the possibility of more than just binary "on' or "off" optical states in each pixel. Certain forms of coded area division gray scale are possible where multiple MEMS light modulators in the pixel are provided, and where apertures 324, which are associated with each of the light modulators, have unequal areas.

In other embodiments the roller-based light modulator 220 or the light tap 250, as well as other MEMS-based light modulators, can be substituted for the shutter assembly 302 within the light modulator array 320.

Figure 5:
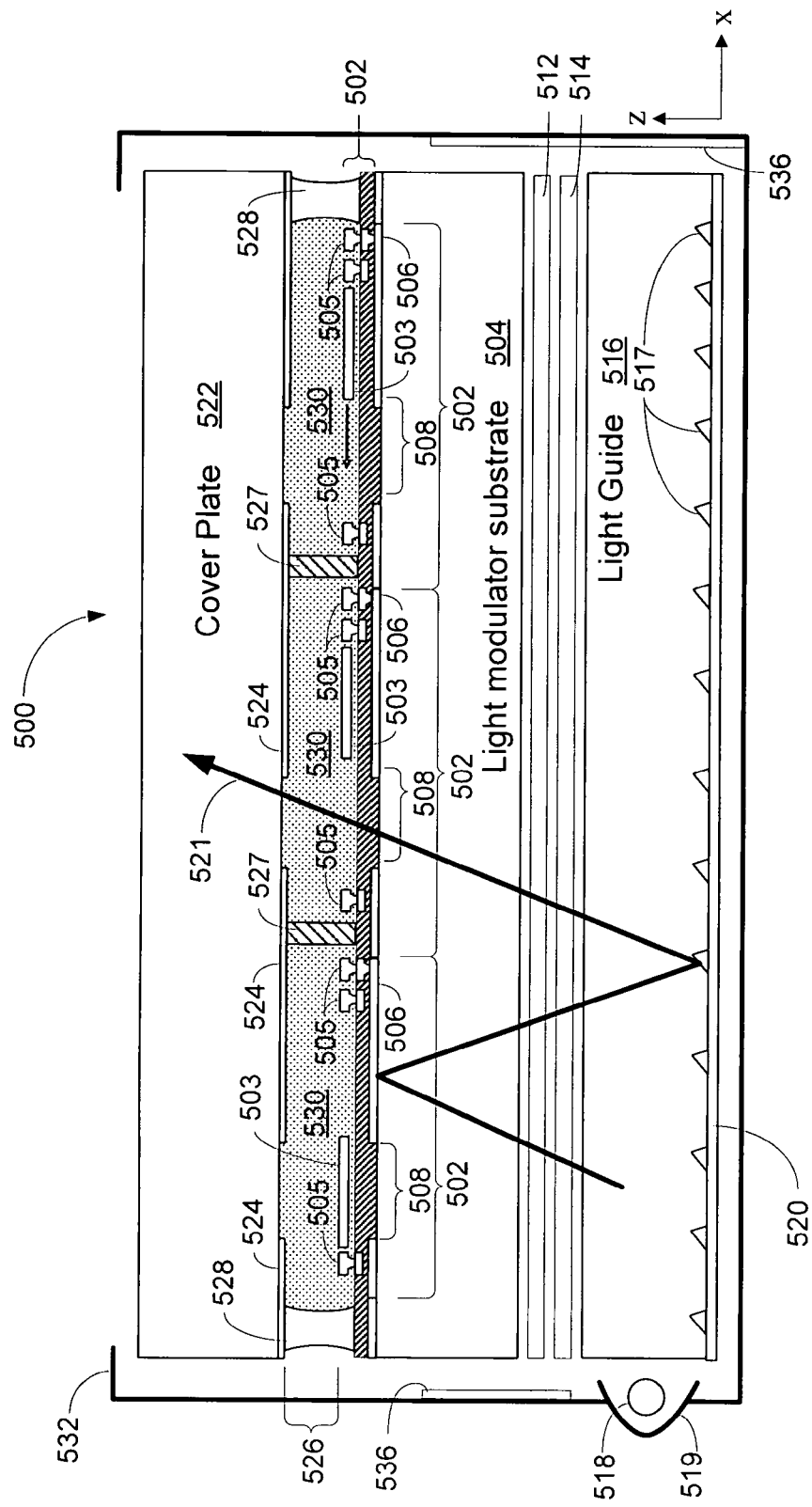
FIG. 5 is cross-sectional view of a display apparatus, according to an illustrative embodiment of the invention.

FIG. 5 is a cross sectional view of a display apparatus 500 incorporating shutter-based light modulators (shutter assemblies) 502, according to an illustrative embodiment of the invention. Each shutter assembly incorporates a shutter 503 and an anchor 505. Not shown are the compliant beam actuators which, when connected between the anchors 505 and the shutters 503, help to suspend the shutters a short distance above the surface. The shutter assemblies 502 are disposed on a transparent substrate 504, preferably made of plastic or glass. A rear-facing reflective layer, reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition. In another implementation, the rear-facing reflective layer 506 can be formed from a mirror, such as a dielectric mirror. A dielectric mirror is fabricated as a stack of dielectric thin films which alternate between materials of high and low refractive index. The vertical gap which separates the shutters 503 from the reflective film 506, within which the shutter is free to move, is in the range of 0.5 to 10 microns. The magnitude of the vertical gap is preferably less than the lateral overlap between the edge of shutters 503 and the edge of apertures 508 in the closed state.

The display apparatus 500 includes an optional diffuser 512 and/or an optional brightness enhancing film 514 which separate the substrate 504 from a planar light guide 516. The light guide is comprised of a transparent, i.e. glass or plastic material. The light guide 516 is illuminated by one or more light sources 518, forming a backlight. The light sources 518 can be, for example, and without limitation, incandescent lamps, fluorescent lamps, lasers, or light emitting diodes (LEDs). A reflector 519 helps direct light from lamp 518 towards the light guide 516. A front-facing reflective film 520 is disposed behind the backlight 516, reflecting light·towards the shutter assemblies 502. Light rays such as ray 521 from the backlight that do not pass through one of the shutter assemblies 502 will be returned to the backlight and reflected again from the film 520. In this fashion light that fails to leave the display to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light re-directors can be molded into the plastic body of light guide 516 with shapes that can be alternately triangular, trapezoidal, or curved in cross section. The density of the prisms 517 generally increases with distance from the lamp 518.

In alternate embodiments the aperture layer 506 can be made of a light absorbing material, and in alternate embodiments the surfaces of shutter 503 can be coated with either a light absorbing or a light reflecting material. In alternate embodiments the aperture layer 506 can be deposited directly on the surface of the light guide 516. In alternate embodiments the aperture layer 506 need not be disposed on the same substrate as the shutters 503 and anchors 505 (see the MEMS-down configuration described below). These and other embodiments for a display illumination system are described in detail in the U.S. patent application Ser. Nos. 11/218,690 and 11/528,191, incorporated herein by reference.

In one implementation the light sources 518 can include lamps of different colors, for instance, the colors red, green, and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps or red, green, blue, and yellow lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a predetermined distance away from the shutter assemblies 502 forming a gap 526. The gap 526 is maintained by mechanical supports or spacers 527 and/or by an adhesive seal 528 attaching the cover plate 522 to the substrate 504.

The sealing material 528 can be formed from polymer adhesives such as epoxies, acrylates, or a silicone materials. The adhesive seal 528 should have a curing temperature preferably below about 200° C., it should have a coefficient of thermal expansion preferably below about 50 ppm per degree C. and should be moisture resistant. An exemplary sealant 528 is EPO-TEK B9021-1, sold by Epoxy Technology, Inc. In an alternate embodiment the adhesive is formed from a heat reflowable material such as a solder metal or a glass frit compound.

The adhesive seal 528 seals in a working fluid 530. The working fluid 530 is engineered with viscosities preferably below about 10 centipoise and with relative dielectric constant preferably above about 2.0, and dielectric breakdown strengths above about $10^4$ V/cm. The working fluid 530 can also serve as a lubricant. In alternate implementations the working fluid 530 has a refractive index that is either greater than or less than that of the substrate 504. In one implementation the working fluid has a refractive index greater than 2.0. Suitable working fluids 530 include, without limitation, -deionized water, methanol, ethanol, silicone oils, fluorinated silicone oils, dimethylsiloxane, polydimethylsiloxane, hexamethyldisiloxane, and diethylbenzene.

In another implementation, the working fluid 530 is a hydrophobic liquid with a high surface wetting capability. Preferably, its wetting capabilities are sufficient to wet the front as well as the rear surfaces of the shutter assemblies 502. Hydrophobic fluids are capable of displacing water from the surfaces of shutter assemblies 502. In another implementation, the working fluid 530 contains a suspension of particles with diameters in the range of 0.5 to 20 microns. Such particles scatter light to increase the viewing angle of a display. In another implementation the working fluid 530 contains dye molecules in solution for absorbing some or all frequencies of visible light to increase the contrast of the display.

A sheet metal or molded plastic assembly bracket 532 holds the cover plate 522, the substrate 504, the backlight 516 and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of light guide 516 back into the light guide. Not shown in FIG. 5 are electrical interconnects which provide control signals as well as power to the shutter assemblies 502 and the lamps 518.

Further details and alternate configurations for the display apparatus 500, including manufacturing methods therefore, can be found in the U.S. patent application Ser. Nos. 11/361,785 and 11/731,628, incorporated herein by reference.

Display apparatus 500 is referred to as the MEMS-up configuration, wherein the MEMS based light modulators are formed on a front surface of substrate 504, i.e. the surface that faces toward the viewer. The shutter assemblies 502 are built directly on top of the reflective aperture layer 506. In an alternate embodiment of the invention, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in display apparatus 500 and is oriented such that the MEMS based light modulators are positioned on the rear surface of the top substrate, i.e. the surface that faces away from the viewer and toward the back light 516. The MEMS-based light modulators are thereby positioned directly opposite to and across a gap from the reflective aperture layer. The gap can be maintained by a series of spacer posts connecting the aperture plate and the substrate on which the MEMS modulators are formed. In some implementations the spacers are disposed within or between each pixel in the array. The gap or distance that separates the MEMS light modulators from their corresponding apertures is preferably less than 10 microns, or a distance that is less than the overlap between shutters and apertures.

Further details and alternate embodiments for the MEMS-down display configuration can be found in the U.S. patent application Ser. Nos. 11/361,785 and 11/528,191 referenced above.

In other embodiments, the roller-based light modulator 220 or the light tap 250, as well as other MEMS-based light modulators, can be substituted for the shutter assemblies 502 within the display assembly 500.

Figures 6A, 6B:
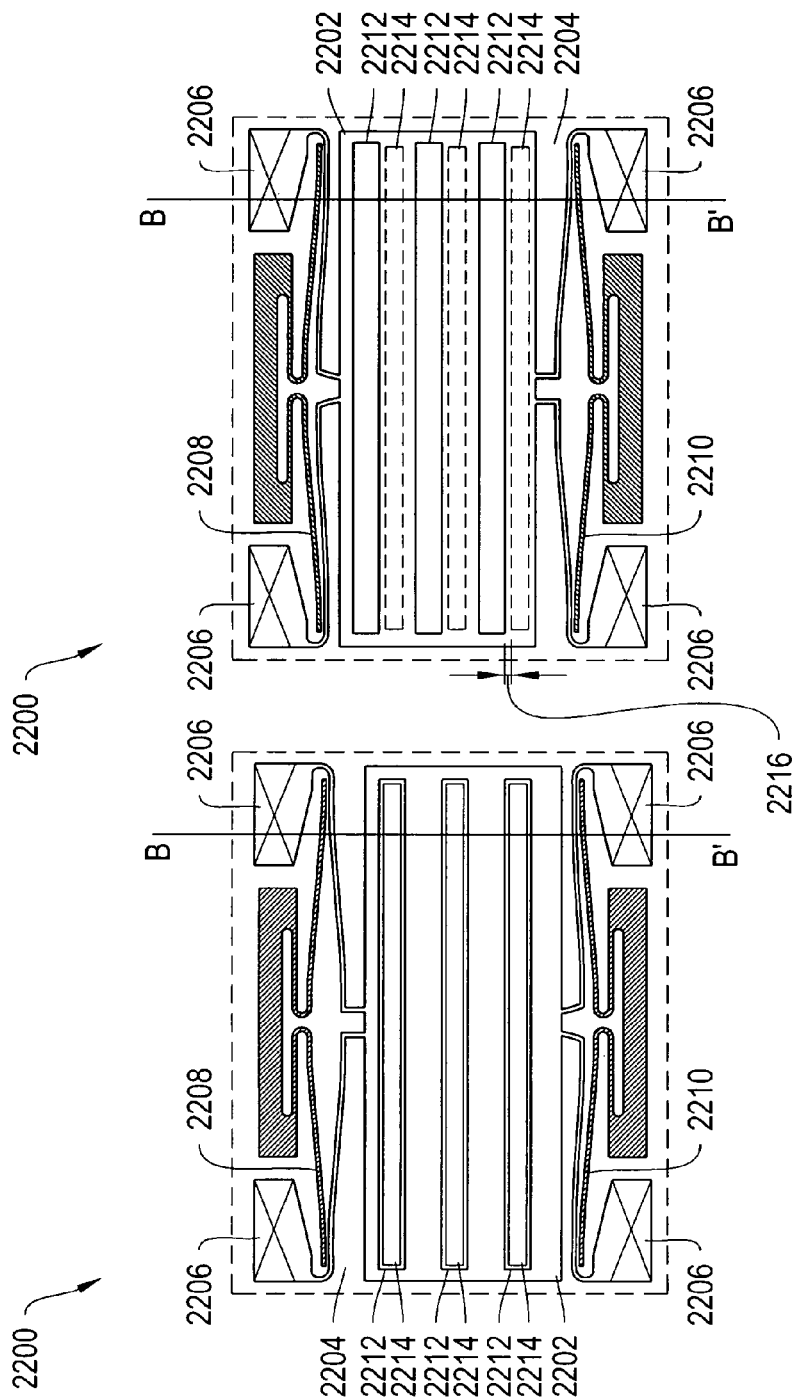
FIGS. 6A and 6B are top views of the shutter assembly of FIG. 8 in open and closed states, respectively, according to an illustrative embodiment of the invention.

FIGS. 6A and 6B illustrate an alternative shutter-based light modulator (shutter assembly) 2200 suitable for inclusion in various embodiments of the invention. The light modulator 2200 is an example of a dual actuator shutter assembly, and is shown in FIG. 6A in an open state. FIG. 6B is a view of the dual actuator shutter assembly 2200 in a closed state. Shutter assembly 2200 is described in further detail in U.S. patent application Ser. No. 11/251,035, referenced above. In contrast to the shutter assembly 200, shutter assembly 2200 includes actuators 2208 and 2210 on either side of a shutter 2202. Each actuator 2210 and 2208 is independently controlled. A first actuator, a shutter-open actuator 2210, serves to open the shutter 2202. A second opposing actuator, the shutter-close actuator 2208, serves to close the shutter 2202. Both actuators 2210 and 2208 are compliant beam electrode actuators. The actuators 2210 and 2208 open and close the shutter 2202 by driving the shutter 2202 substantially in a plane parallel to an aperture layer 2204 over which the shutter is suspended. The shutter 2202 is suspended a short distance over the aperture layer 2204 by anchors 2206 attached to the actuators 2210 and 2208. The inclusion of supports attached to both ends of the shutter 2202 along its axis of movement reduces out of plane motion of the shutter 2202 and confines the motion substantially to a plane parallel to the substrate. By analogy to the control matrix 300 of FIG. 3, a control matrix suitable for use with shutter assembly 2200 might include one transistor and one capacitor for each of the opposing shutter-open and shutter-close actuators 2210 and 2208.

The shutter 2202 includes three shutter apertures 2212, through which light can pass. The remainder of the shutter 2202 obstructs the passage of light. In various embodiments, the side of the shutter 2202 facing the reflective aperture layer 2204 is coated with a light absorbing material or a reflective material to absorb or reflect, respectively, obstructed light.

The reflective aperture layer 2204 is deposited on a transparent substrate, preferably formed from plastic or glass. The reflective aperture layer 2204 can be formed from a film of metal deposited on the substrate, a dielectric mirror, or other highly reflective material or combination of materials. The reflective aperture layer 2204 has a set of apertures 2214 formed in it to allow light to pass through the apertures, from the transparent substrate, towards the shutter 2202. The reflective aperture layer 2204 has one aperture corresponding to each shutter aperture 2212. For example, for an array of light modulators including shutter assemblies 2200, the reflective aperture layer includes three apertures 2214 for each shutter assembly 2200. Each aperture has at least one edge around its periphery. For example, the rectangular apertures 2214 have four edges. In alternative implementations in which circular, elliptical, oval, or other curved apertures are formed in the reflective aperture layer 2204, each aperture may have only a single edge. In other embodiments the apertures need not be separated or disjoint in the mathematical sense, but instead can be connected. That is to say, while portions or shaped sections of the aperture may have a correspondence to each shutter, several of these sections may be connected such that a single continuous perimeter of the aperture is shared by multiple shutters.

In FIG. 6A, the shutter assembly 2200 is in an open state. Actuator 2208 is in an open position, and actuator 2210 is in a collapsed position. Apertures 2214 are visible through the shutter apertures 2212. As visible, the shutter apertures 2212 are larger in area than the apertures 2214 formed in the reflective aperture layer 2204. The size differential increases the range of angles at which light can pass through the shutter apertures 2212 towards an intended viewer.

In various embodiments, it is advantageous for the shutters used in shutter assemblies to overlap the apertures to which they correspond, when the shutters are in the closed position.

In FIG. 6B, the shutter assembly is a closed state. Actuator 2208 is in a collapsed position and actuator 2210 is in an open position. Light blocking portions of the shutter 2202 cover the apertures 2214 in the reflective aperture layer 2204. The light blocking portions of the shutter 2202 overlap the edges of the apertures 2214 in the reflective aperture layer 2204 by a predefined overlap 2216. In some implementations, even when a shutter is in a closed state, some light, at angles far from an axis normal to the shutter 2202, may leak through the apertures 2214. The overlap included in shutter assembly 2200 reduces or eliminates this light leakage. While, as depicted in FIG. 6B, the light blocking portions of shutter 2202 overlap all four edges of the aperture, having the light blocking portions of shutter 2202 overlap even one of the edges reduces light leakage.

Figure 7A:
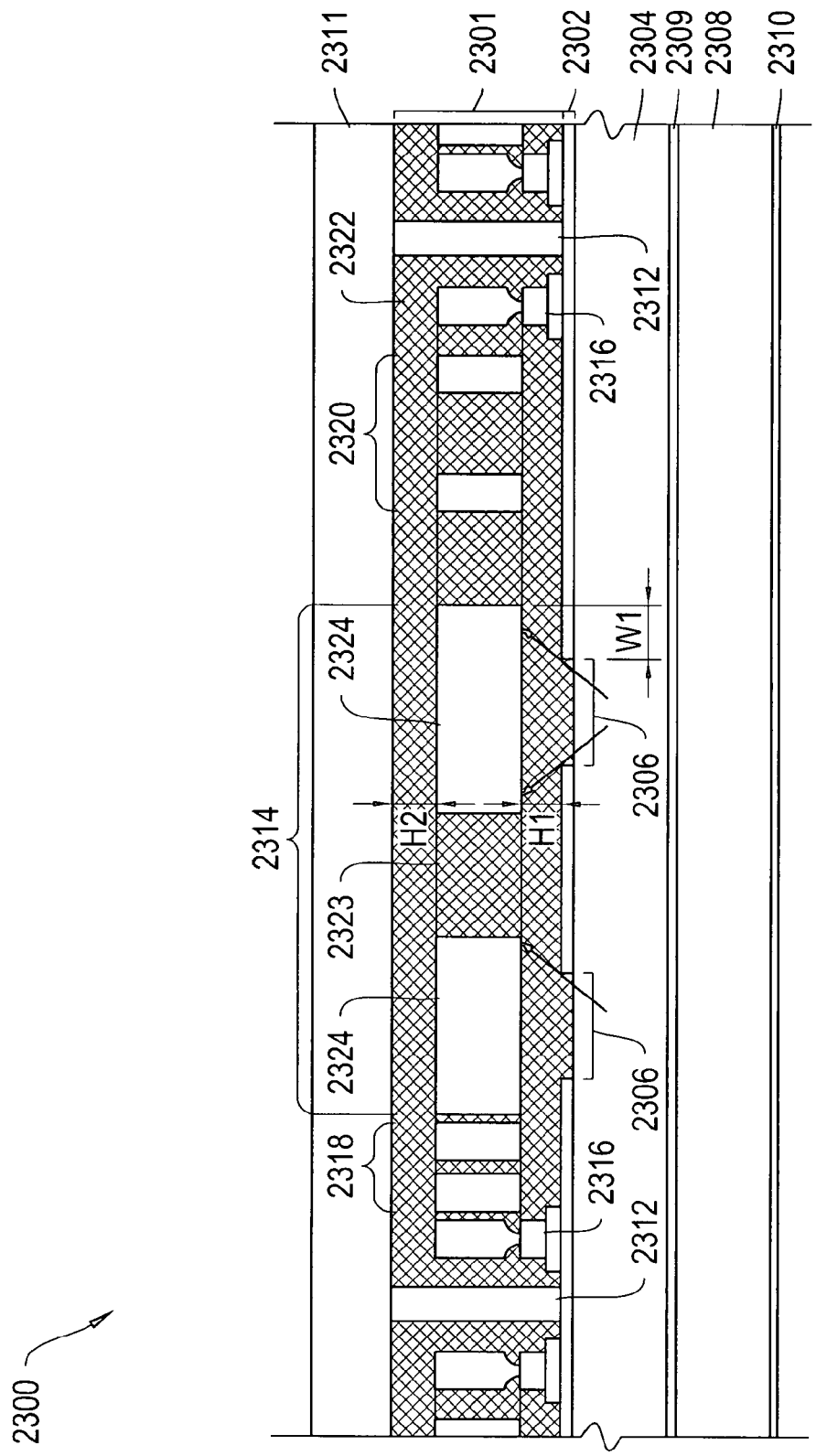
FIGS. 7A-7D are cross sectional views of shutter assemblies having shutters, which, when in a closed position, overlap apertures formed in an adjacent reflective surface, according to an illustrative embodiment of the invention.
Figure 7B:
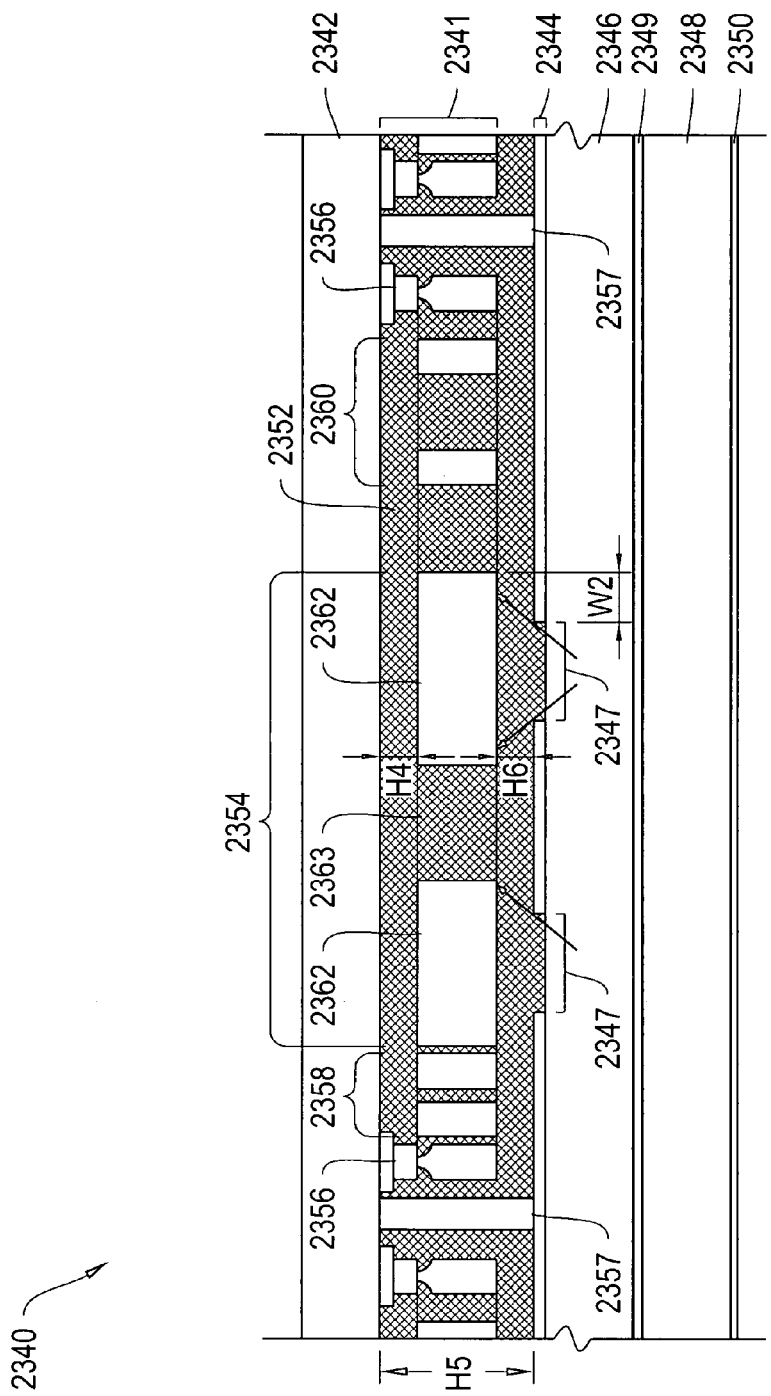
Figure 7C:
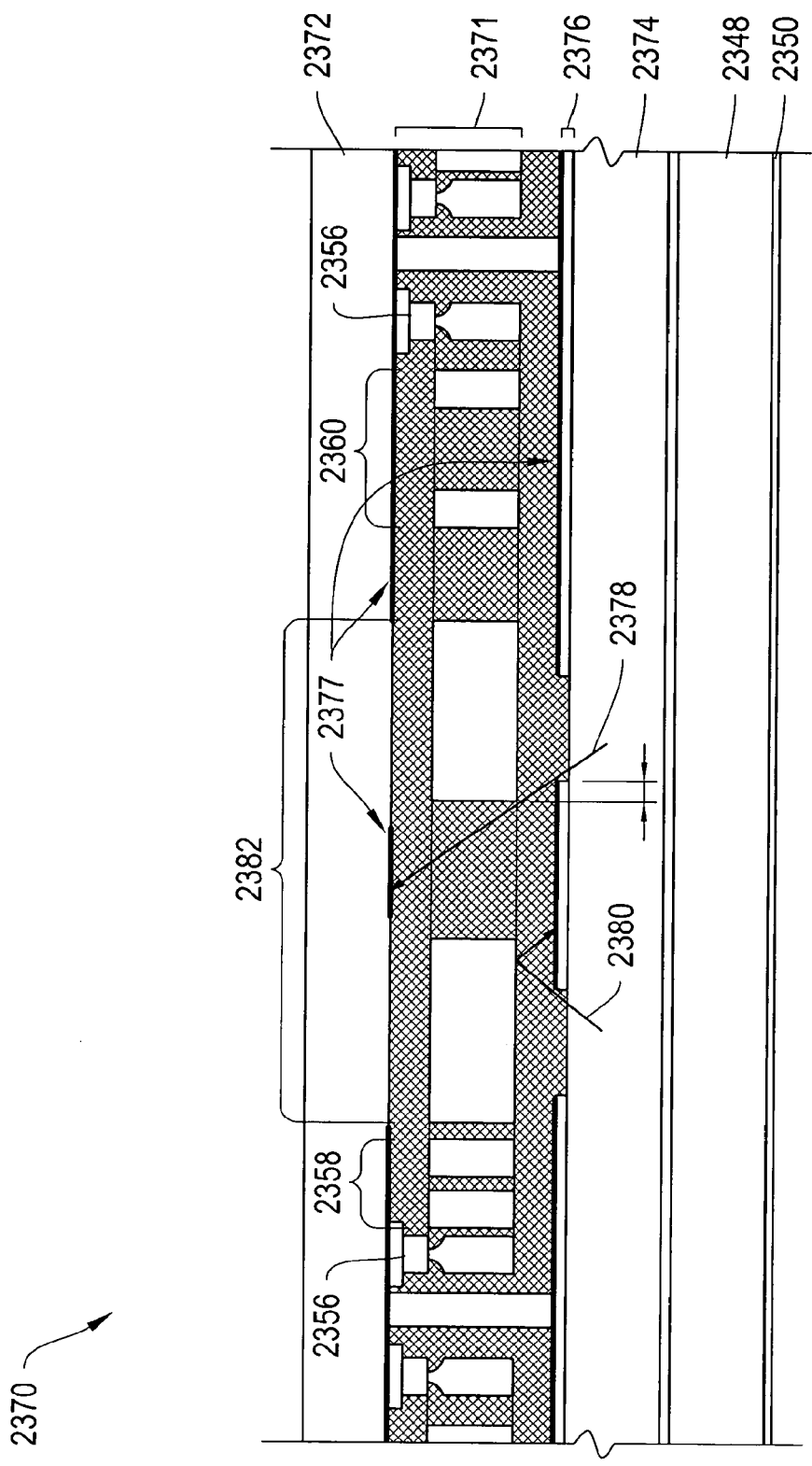

FIGS. 7A-7C are cross-sectional views of various configurations of the shutter assembly 2200 in relation to the transparent substrate on which the reflective aperture layer 2204 is formed. The cross sectional views correspond to the line labeled B-B' on FIGS. 6A and 6B. For purposes of illustration, the shutter 2202 is illustrated in FIGS. 7A-7C as having only a single shutter aperture 2323 and two light blocking portions 2324.

FIG. 7A is a cross section of a first configuration of a display apparatus 2300 including a shutter assembly 2301 similar to that depicted in FIG. 6 in the closed state taken across line B-B', according to an illustrative embodiment of the invention. In the first configuration, the shutter assembly 2301 is formed on a reflective aperture layer 2302. The reflective aperture layer 2302 is formed from a thin metal film deposited on a transparent substrate 2304. Alternately, the reflective aperture layer 2302 can be formed from a dielectric mirror, or other highly reflective material or combination of materials. The reflective aperture layer 2302 is patterned to form apertures 2306. The transparent substrate 2304 is positioned proximate a light guide 2308. The transparent substrate 2304 and the light guide 2308 are separated by a gap 2309 filled with a fluid, such as air. The refractive index of the fluid is preferably less than that of the light guide 2308. Suitable light guides 2308 for display apparatus 2300 are described further in U.S. patent application Ser. No. 11/528, 191, the entirety of which is herein incorporated by reference. The display apparatus 2300 also includes a front-facing rear reflective layer 2310 positioned adjacent the rear side of the light guide 2308.

The shutter assembly 2301 includes the shutter 2314 supported proximate to the reflective aperture layer 2302 by anchors 2316 via portions of opposing actuators 2318 and 2320. The anchors 2316 and actuators 2318 and 2320 suspend the shutter 2314 at about a constant distance H I (measured from the bottom of the shutter 2314) over the reflective aperture layer 2302. In addition, the display apparatus 2300 includes a cover plate 2311 supported over the transparent substrate 2304 by spacer posts 2312. The spacer posts 2312 keep the cover plate at about a second constant distance H2 away from the top of the shutter 2314. The substrates 2304 and 2311 can be made of a substantially rigid material, such as glass, in which case a relatively low density of spacers 2312 may be used to maintain the desired spacing H2. For example, with rigid substrates, the display apparatus 2300, in one implementation, includes one spacer 2312 for every 4 pixels, though other densities, both higher and lower, may also be employed. In an alternative implementation either substrate 2304 or 2311 can be made of a flexible material, such as plastic, in which case it is preferable to have a higher density of spacers 2312, for example, one spacer 2312 within or between each pixel in the array.

The gap between the cover plate 2311 and the transparent substrate 2304 is filled with a working fluid 2322, such as working fluid 530, described above. The working fluid 2322 preferably has a refractive index greater than that of the transparent substrate 2304. In another implementation the working fluid has a refractive index greater than 2.0. In another implementation the working fluid 2322 has a refractive index that is equal to or less than the index of refraction of the transparent substrate 2304.

As indicated above, the shutter assembly 2301 is in the closed state. Light blocking portions 2324 of the shutter 2314 overlap the edges of the apertures 2306 formed in the reflective aperture layer 2302. The light blocking properties of shutter 2314 are improved when the gap between the shutter and the aperture, i.e. the distance HI, is made as small as possible. In one implementation, H I is less than about 100 p.m. In another implementation, HI is less than about 10 pm. In still another implementation, H1 is about I pm. In an alternative embodiment the distance HI is greater than 0.5 mm, but remains smaller than the display pitch. The display pitch is defined as the distance between pixels (measured center to center), and in many cases is established as the distance between apertures, such as apertures 2306, measured center to center, in the rear-facing reflective layer 2302.

The size of the overlap W1 is preferably proportional to the distance H I. While the overlap W1 may be smaller, preferably the overlap WI is greater than or equal to the distance H I. In one implementation the overlap W1 is greater than or equal to I micron. In another implementation the overlap W1 is between about 1 micron and 10 microns. In another implementation the overlap W1 is greater than 10 microns. In one particular implementation, the shutter 2314 is about 4 r_im thick. H I is about 2 pm, H2 is about 2 pm, and W1>=2 pm. By having the overlap W1 being greater than or equal to HI, if the shutter assembly 2301 is in the closed state as depicted in FIG. 7A, most light having a sufficient angle to escape the light guide 2308 through the apertures 2306 impacts the light blocking portions 2324 of the shutter 2314, thereby improving the contrast ratio of the display apparatus 2300.

H2 is preferably about the same distance as HI. The spacer posts 2312 are preferably formed from a polymer material that is lithographically patterned, developed, and/or or etched into cylindrical shapes. The height of the spacer is determined by the cured thickness of the polymer material. Methods and materials for formation of spacers 2312 are disclosed in co-owned U.S. patent application Ser. No. 11/361,785, filed Feb. 23, 2006, incorporated herein by reference. In an alternative embodiment the spacer 2312 can be formed from a metal which is electrochemically deposited into a mold made from a sacrificial material.

FIG. 7B is a cross section of a second configuration of a display apparatus 2340 including a shutter assembly 2341 similar to that depicted in FIG. 6 in the closed state, according to an illustrative embodiment of the invention. This second configuration is referred to as the MEMS-down configuration, in which the reflective aperture layer 2344 is formed on a transparent substrate called the aperture plate 2346, which is distinct from the light modulator substrate 2342 to which shutter assembly 2341 is anchored. The shutter assembly includes a shutter 2354 having light blocking portions 2362 and shutter apertures 2363 formed therein. Like the aperture plate 2346, the light modulator substrate 2342 is also transparent. The two substrates 2342 and 2346 are separated by a gap. The two substrates 2342 and 2346 are aligned during assembly such that a one to one correspondence exists, as indicated in FIG. 6, between each of the apertures 2347 and the light blocking portions 2362 of shutter 2354 when that shutter is in the closed position, and/or between the apertures 2347 and the shutter apertures 2363 when that shutter is in the open position. In alternative embodiments, the correspondence between apertures and either light blocking portions 2362 or shutter apertures 2363 of a shutter 2354 is a one to many or many to one correspondence.

In the MEMS-down display apparatus 2340, the shutter assembly 2341 is formed on the rear-facing surface of the light modulator substrate 2342, i.e. on the side which faces the light guide 2348. In display apparatus 2340, the aperture plate 2346 is positioned between the light modulator substrate 2342 and the light guide 2348 The reflective aperture layer 2344 is formed from a thin metal film deposited on the front-facing surface of transparent aperture plate 2346. The reflective aperture layer 2344 is patterned to form apertures 2347. In another implementation, the reflective layer 2344 can be formed from a mirror, such as a dielectric mirror. A dielectric mirror is fabricated from a stack of dielectric thin films with different refractive indices, or from combinations of metal layers and dielectric layers.

The aperture plate 2346 is positioned proximate to a backlight or light guide 2348. The aperture plate 2346 is separated from the light guide 2348 by a gap 2349 filled with a fluid, such as air. The refractive index of the fluid is preferably less than that of the light guide 2348. Suitable backlights 2348 for display apparatus 2340 are described further in U.S. patent application Ser. No. 11/528,191, the entirety of which is herein incorporated by reference. The display apparatus 2340 also includes a front-facing rear reflective layer 2350 positioned adjacent the rear side of the backlight 2348. The front-facing reflective layer 2350 combined with the rear-facing reflective layer 2344 forms an optical cavity which promotes recycling of light rays which do not initially pass through apertures 2347. The shutter assembly 2341 includes the shutter 2354 supported proximate to the transparent substrate 2342 by anchors 2356 via portions of opposing actuators 2358 and 2360. The anchors 2356 and actuators 2358 and 2360 suspend the shutter 2354 at about a constant distance H4 (measured from the top of the shutter 2354) below the light modulator substrate 2342 In addition, display apparatus includes spacer posts 2357, which support the light modulator substrate 2342 over the aperture plate 2346. The spacer posts 2357 keep the light modulator substrate 2342 at about a second constant distance H5 away from the aperture plate 2346, thereby keeping the bottom surface of shutter 2354 at a third about constant distance H6 above the reflective aperture layer 2344. The spacer posts 2357 are formed in a fashion similar to those of spacers 2312.

The gap between the light modulator substrate 2342 and the aperture plate 2346 is filled with a working fluid 2352, such as working fluid 530, described above. The working fluid 2352 preferably has a refractive index greater than that of the transparent aperture plate 2346. In another implementation the working fluid has a refractive index greater than 2.0. In another implementation the working fluid 2352 preferably has a refractive index that is equal to or less than the index of refraction of the aperture plate 2346.

As indicated above, the shutter assembly 2341 is in the closed state. Light blocking portions 2362 of the shutter 2354 overlap the edges of the apertures 2347 formed in the reflective aperture layer 2344. The size of the overlap W2 is preferably proportional to the distance H6. While the overlap W2 may be smaller, preferably the overlap W2 is greater than or equal to the distance H6. In one implementation, H6 is less than about 100 um. In another implementation, H6 is less than about 10 um. In still another implementation, H6 is about 1 um. In an alternative embodiment the distance H6 is greater than 0.5 mm, but remains smaller than the display pitch. The display pitch is defined as the distance between pixels (measured center to center), and in many cases is established as the distance between the centers of apertures in the rear-facing reflective layer, such as apertures 2347. H4 is preferably about the same distance as H6. In one particular implementation, the shutter 2354 is about 4 um thick, H6 is about 2 um, H4 is about 2 um, H5 is about 8 um and W2>=2 um. By having the overlap W2 being greater than or equal to H6, if the shutter assembly 2341 is in the closed state as depicted in FIG. 7B, most light having a sufficient angle to escape the backlight 2348 through the apertures 2347 impacts the light blocking portions 2362 of the shutter 2354, thereby improving the contrast ratio of the display apparatus 2340.

FIG. 7C is a cross section of a third configuration of a display apparatus 2370 including a shutter assembly 2371 similar to that depicted in FIG. 6 in the closed state, according to an illustrative embodiment of the invention. In comparison to the second configuration of the display apparatus 2340 described above, the display apparatus 2370 is designed to account for minor misalignments that may occur during the aligning and bonding of a light modulator substrate 2372 (similar to light modulator substrate 2342) on which a shutter assembly 2371 is formed to an aperture plate 2374 (similar to the aperture plate 2346) on which a reflective aperture layer 2376 is deposited. To address this potential issue, the display apparatus 2370 includes an additional layer of light absorbing material 2377, deposited on the light modulator substrate 2372. The light absorbing material 2377 may be part of a black mask, though at least some of the light absorbing material 2377 is preferably located in the interior of a pixel to which the shutter assembly 2371 corresponds. The light absorbing material 2377 absorbs light 2378 that would otherwise pass through the light modulator substrate 2372 while the shutter 2382 is in the closed state. Additional light absorbing material 2377 may be deposited on the front side of reflective aperture layer 2376 to absorb light, for example light 2380 deflected from a shutter 2382.

Figure 7D:
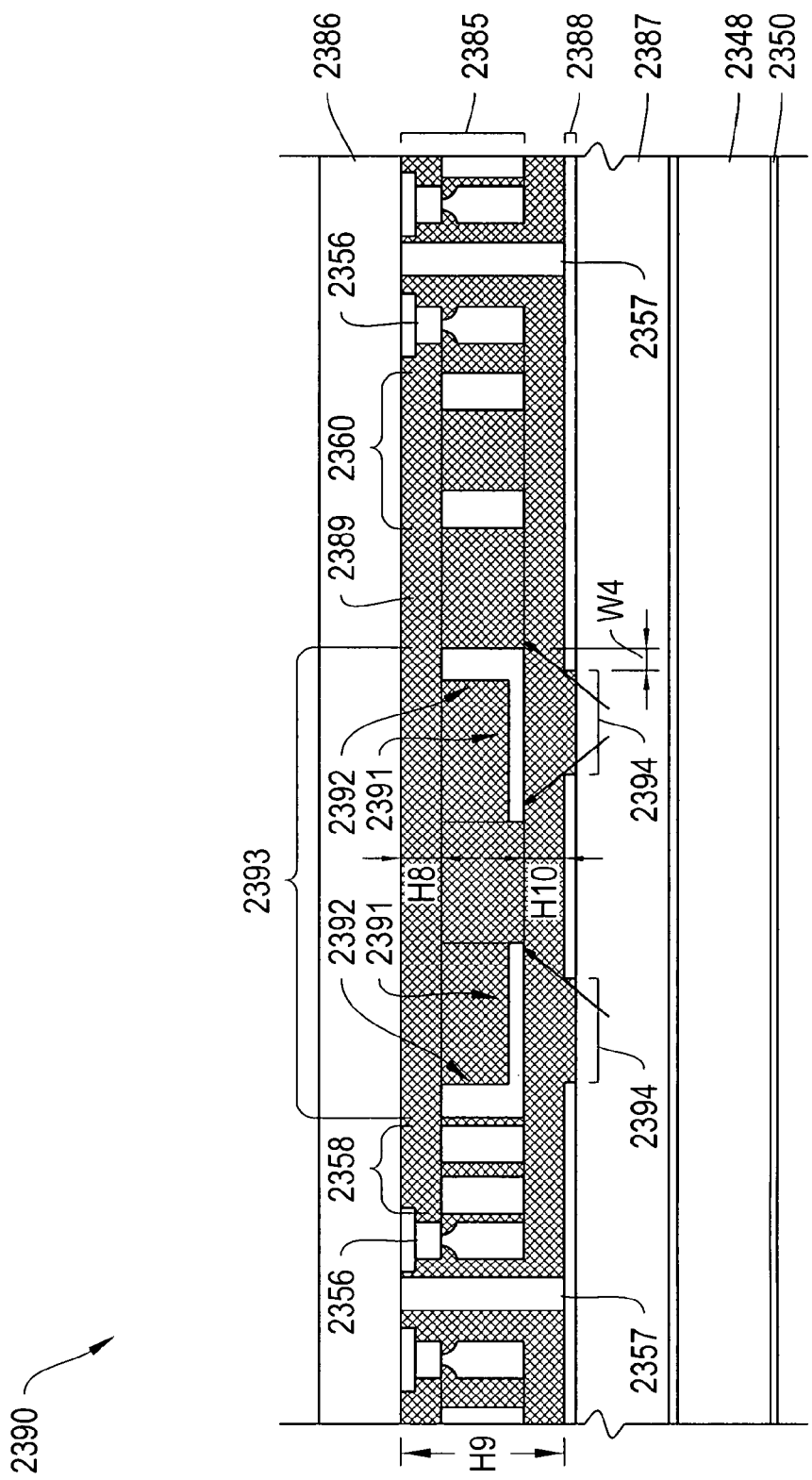

FIG. 7D is a cross section of a fourth configuration of a display apparatus 2390 including a shutter assembly 2385 similar to that depicted in FIG. 6 in the closed state, according to an illustrative embodiment of the invention. In comparison to the second configuration of shutter assembly 2354 described above, the shutter assembly 2385 is fabricated according to a different process resulting in different cross sectional thicknesses for some of its members. The resulting shutter 2393 is referred to herein as a corrugated shutter. The design guidelines for gap distances, e.g. H8 and H10, and for the overlap parameter W4, however, are preferably unchanged from the corresponding gap distances and the overlap parameters described above. The display apparatus 2390 includes a transparent light modulator substrate 2386, oriented in the MEMS down configuration, and to which the shutter assembly 2385 is attached. The display apparatus 2390 also includes a transparent aperture plate 2387 on which a rear-facing reflective aperture layer 2388 is deposited. The display apparatus 2390 includes a fluid 2389 which fills the gap between substrates 2386 and 2387. The fluid 2389 preferably has a refractive index higher than that of the aperture plate 2387. The display apparatus also includes a backlight 2348 along with front-facing reflective layer 2350.

The shutter assembly 2385 is in the closed state. Light blocking portions 2391 of the corrugated shutter 2393 overlap the edges of apertures 2394 formed in the reflective aperture layer 2388. The corrugated shutter 2393 is comprised of two connected flat plate sections: section 2391 which is oriented horizontally and section 2392 which is oriented vertically.

Each flat plate 2391 and 2392 is comprised of thin film materials with thicknesses in the range of 0.2 to 2.0 pm. In a particular embodiment the thickness of the horizontal section 2391 is 0.5 pm. The vertical section 2392 provides a stiffness to the corrugated shutter 2393 and a height which matches that of actuator 2358 without requiring the deposition of a bulk materials thicker than about 2 p.m. Methods and materials for formation of shutters with a corrugated and/or three dimensional structures are disclosed in co-owned U.S. patent application Ser. No. 11/361,785, filed Feb. 23, 2006, incorporated herein by reference.

Similar to dimensions described for display apparatus 2340, in a particular example the dimensions of H8, H9, and H 10 of display apparatus 2390 can be 2, 8, and 2 pm respectively. The overlap W4 is preferably greater than or equal to the distance H 10. In another example, the distance H 10 and the overlap W4 can be >=1 pm. Using the materials and methods for a corrugated shutter 2393, however, the thickness of section 2391 can be as thin as 0.5 pm. By having the overlap W4 greater than or equal to H 10, if the shutter assembly 2385 is in the closed state as depicted in FIG. 7A, most light having a sufficient angle to escape the backlight 2348 through the apertures 2394 impacts the light blocking portions 2391 of the shutter 2393, thereby improving the contrast ratio of the display apparatus 2390.

Figure 8:
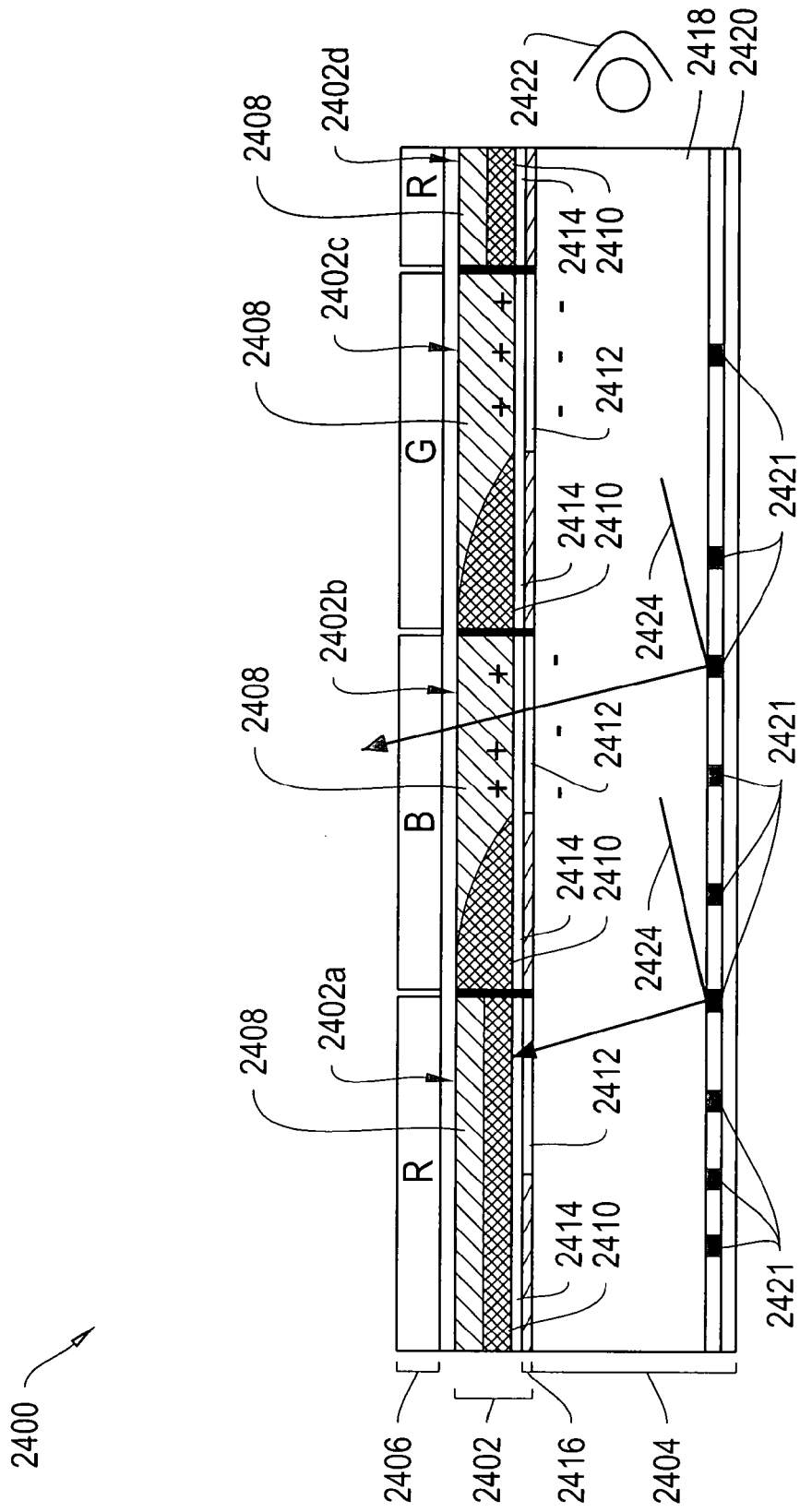
FIG. 8 is a cross sectional view of a first electrowetting-based light modulation array, according to an illustrative embodiment of the invention.

FIG. 8 is a cross sectional view of a first electrowetting-based light modulation array 2400, according to an illustrative embodiment of the invention. The light modulation array 2400 includes a plurality of electrowetting-based light modulation cells 2402a-2402d (generally "cells 2402") formed on an optical cavity 2404. The light modulation array 2400 also includes a set of color filters 2406 corresponding to the cells 2402.

Each cell 2402 includes a layer of water (or other transparent conductive or polar fluid) 2408, a layer of light absorbing oil 2410, a transparent electrode 2412 (made, for example, from indium-tin oxide) and an insulating layer 2414 positioned between the layer of light absorbing oil 2410 and the transparent electrode 2412. Illustrative implementation of such cells are described further in U.S. Patent Application Publication No. 2005/0104804, published May 19, 2005 and entitled "Display Device," incorporated herein by reference. In the embodiment described herein, the transparent electrode 2412 takes up only a portion of a rear surface of a cell 2402.

The remainder of the rear surface of a cell 2402 is formed from a reflective aperture layer 2416 that forms the front surface of the optical cavity 2404. The rear-facing reflective layer 2416 is patterned to form apertures, which in the embodiment of cell 2402 are coincident with the transparent electrode 2412. Preferably, when in the closed position, the layer of light absorbing oil 2410 overlaps one or more edges of its corresponding aperture in the reflective aperture layer 2416. The reflective aperture layer 2416 is formed from a reflective material, such as a reflective metal or a stack of thin films forming a dielectric mirror. For each cell 2402, an aperture is formed in the reflective aperture layer 2416 to allow light to pass through. In an alternate embodiment, the electrode 2412 for the cell is deposited in the aperture and over the material forming the reflective aperture layer 2416, separated by another dielectric layer.

The remainder of the optical cavity 2404 includes a light guide 2418 positioned proximate the reflective aperture layer 2416, and a second reflective layer 2420 on a side of the light guide 2418 opposite the reflective aperture layer 2416. A series of light redirectors 2421 are formed on the rear surface of the light guide, proximate the second reflective layer. The light redirectors 2421 may be either diffuse or specular reflectors. One of more light sources 2422 inject light 2424 into the light guide 2418.

In an alternate implementation the light sources 2422 can include lamps of different colors, for instance, the colors red, green, and blue. A color image can be formed by sequentially illuminating images with lamps of different colors at a rate sufficient for the human brain to average the different colored images into a single multi-color image. The various color-specific images are formed using the array of electrowetting modulation cells 2402. In another implementation, the light source 2422 includes lamps having more than three different colors. For example, the light source 2422 may have red, green, blue and white lamps or red, green, blue, and yellow lamps.

In an alternative implementation, the cells 2402 and the reflective aperture layer 2416 are formed on an additional light modulator substrate which is distinct from light guide 2418 and separated from it by a gap. (See for example the light modulator substrate 2513 of FIG. 9.) In yet another implementation, a layer of material with a refractive index less than that of the light guide 2418 is interposed between the reflective aperture layer 2416 and the light guide 2418. The layer of material with lower refractive index may help to improve the uniformity of light emitted from the light guide 2418.

In operation, application of a voltage to the electrode 2412 of a cell (for example, cell 2402b or 2402c) causes the light absorbing oil 2410 in the cell to collect in one portion of the cell 2402. As a result, the light absorbing oil 2410 no longer obstructs the passage of light through the aperture formed in the reflective aperture layer 2416 (see, for example, cells 2402b and 2402c). Light escaping the backlight at the aperture is then able to escape through the cell and through a corresponding color (for example, red, green, or blue) filter in the set of color filters 2406 to form a color pixel in an image. When the electrode 2412 is grounded, the light absorbing oil 2410 covers the aperture in the reflective aperture layer 2416, absorbing any light 2424 attempting to pass through it (see for example cell 2402a).

The area under which oil 2410 collects when a voltage is applied to the cell 2402 constitutes wasted space in relation to forming an image. This area cannot pass light through, whether a voltage is applied or not, and therefore, without the inclusion of the reflective portions of reflective apertures layer 2416, would absorb light that otherwise could be used to contribute to the formation of an image. However, with the inclusion of the reflective aperture layer 2416, this light, which otherwise would have been absorbed, is reflected back into the light guide 2420 for future escape through a different aperture.

Figure 9:
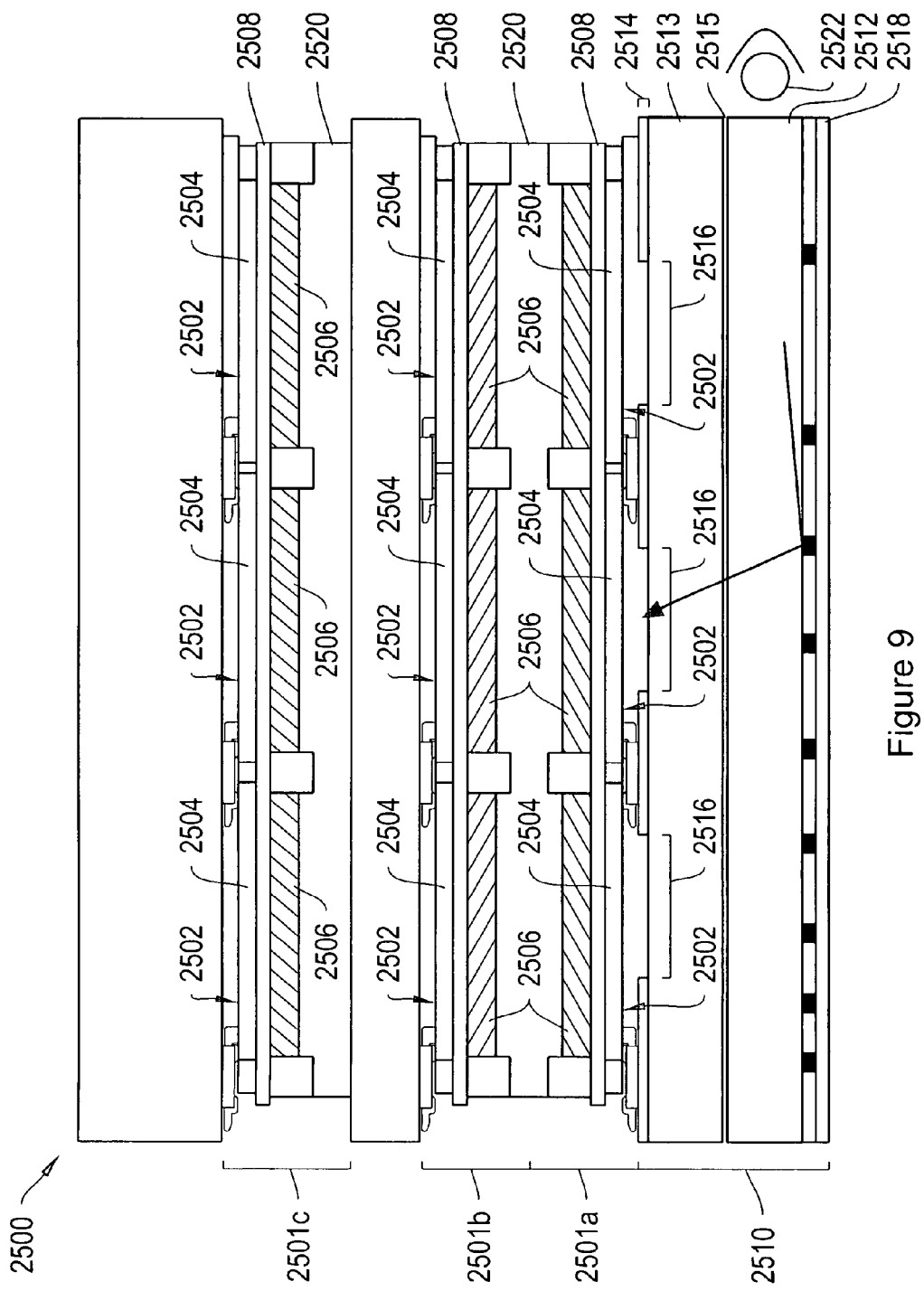
FIG. 9 is a cross sectional view of a second electrowetting-based light modulation array, according to an illustrative embodiment of the invention.

FIG. 9 is a cross sectional view of a second electrowetting-based light modulation array 2500, according to an illustrative embodiment of the invention. The second electrowetting based light modulation array 2500 includes three sub-arrays 2501a, 2501b, and 2501c of colored electrowetting-based light modulation cells 2502 (generally "cells 2502"), positioned on top of one another. Each cell 2502 includes a transparent electrode 2504, and a colored oil 2506 separated by an insulator 2508. In one implementation, the oil 2506 in the cells 2502 of sub-array 2501a is colored cyan, the oil 2506 in the cells 2502 of sub-array 2501b is colored yellow, and the oil 2506 in the cells 2502 of sub-array 2501c is colored magenta. The cells 2502 in sub-array 2501a and the cells 2502 of sub-array 2501b share a common layer of water 2520. The cells 2502 of sub-array 2501c include their own layer of water 2520.

The electrowetting-based light modulation array 2500 includes a light-recycling optical cavity 2510 coupled to the three sub-arrays 2501a-2501c. The optical cavity 2510 includes a light guide 2512 and a light modulator substrate 2513, separated from the light guide 2512 by a gap 2515. The front surface of the light modulator substrate 2513 includes a rear-facing reflective aperture layer 2514. The reflective aperture layer 2514 is formed from a layer of metal or a stack of thin films forming a dielectric mirror. Apertures 2516 are patterned into the reflective aperture layer beneath the cells 2502 of the sub-arrays 2501a-2501c to allow light to escape the light guide and pass through the sub-arrays 2501a-2501c to form an image. The transparent electrodes 2504 of cells 2502 are formed over the top of the reflective aperture layer 2514.

The substrates, i.e., light guide 2512 and modulator substrate 2513, are separated by a gap 2515 filled with a fluid, such as air. The refractive index of the fluid is less than that of the light guide 2512. A front-facing reflective layer 2518 is formed on, or positioned proximate to, the opposite side of the light guide 2512. The light modulation array 2500 includes at least one light source 2522 for injecting light into the light guide 2512. Suitable light guides 2618 for display apparatus 2600 are described further in U.S. patent application Ser. No. 11/528,191, the entirety of which is herein incorporated by reference.

Figure 10:
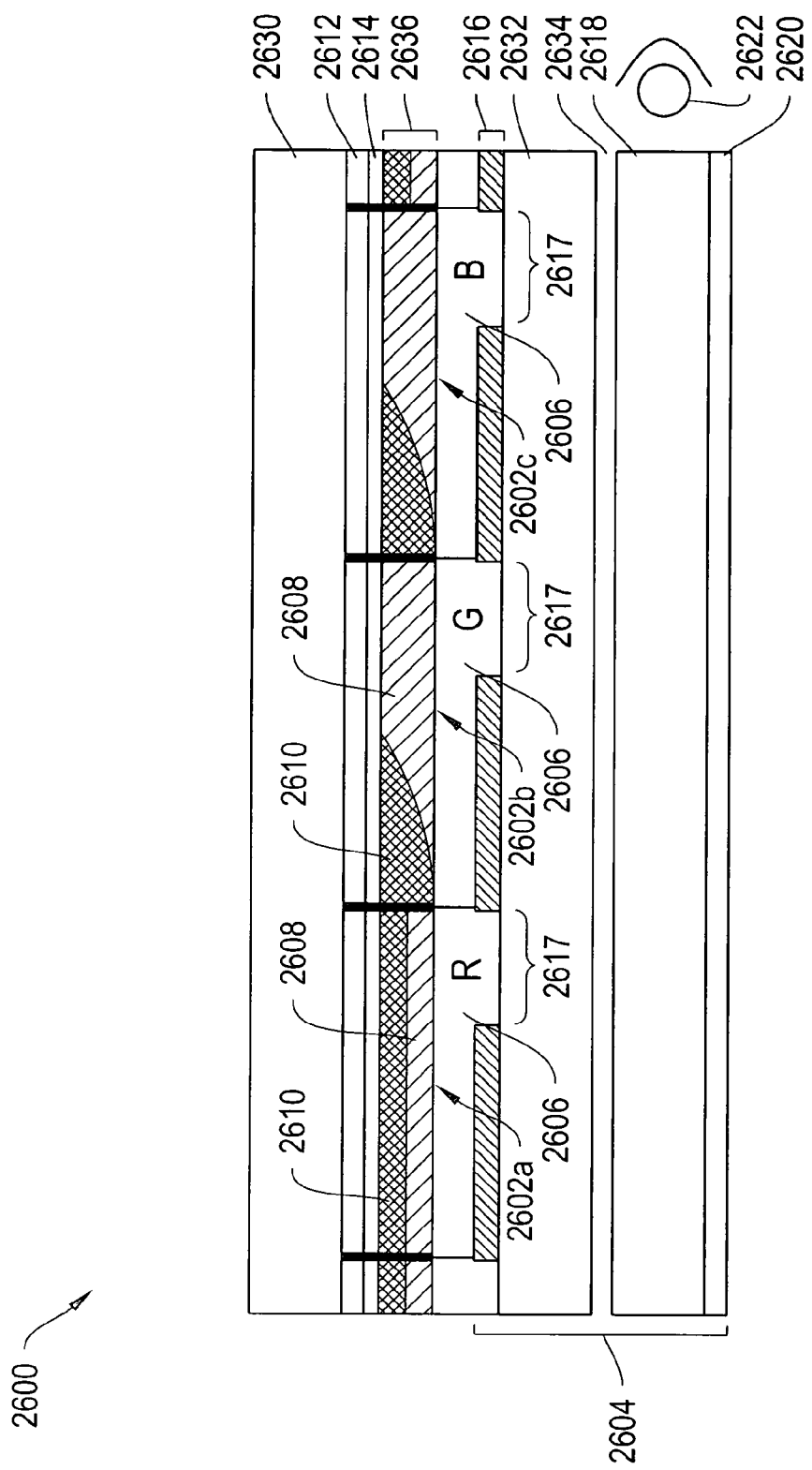
FIG. 10 is a cross sectional view of a third electrowetting-based light modulation array, according to an illustrative embodiment of the invention.

FIG. 10 is a cross sectional view of a third electrowetting-based light modulation array 2600, according to an illustrative embodiment of the invention. The light modulation array 2600 includes a plurality of electrowetting-based light modulation cells 2602a-2602c (generally "cells 2602") formed on an optical cavity 2604. The light modulation array 2600 also includes a set of color filters 2606 corresponding to the cells 2602.

While the array 2400 might be considered an example of an array in a MEMS-up configuration, the array 2600 is an example of an electrowetting-based array assembled in a MEMS-down configuration. Each cell 2602 includes a layer of water (or other transparent conductive or polar fluid) 2608, a layer of light absorbing oil 2610, a transparent electrode 2612 (made, for example, from indium-tin oxide) and an insulating layer 2614 positioned between the layer of light absorbing oil 2610 and the transparent electrode 2612. In the MEMS-down configuration of light modulator array 2600, however, both the insulating layer 2614 and the transparent electrode 2612 are disposed on a light modulator substrate 2630 distinct from an aperture plate 2632. Like the light modulator substrate 2630, the aperture plate 2632 is also a transparent substrate. The light modulator substrate 2630 is the topmost substrate and is oriented such that control electrodes such as transparent electrode 2612 are disposed on the rear surface of substrate 2630, i.e. the surface that faces away from the viewer and toward the light guide. In addition to transparent electrode 2612, the rear surface of light modulator substrate 2630 can carry other common components of a switching or control matrix for the modulator array, including without limitation, row electrodes, column electrodes, transistors for each pixel and capacitors for each pixel. The electrodes and switching components formed on light modulator substrate 2630, which govern the actuation of light modulators in the array, are disposed opposite to and across a gap 2636 from a reflective aperture layer 2616, disposed on the front surface of aperture plate 2632. The gap 2636 is filled with the electrowetting fluid components water 2608 and oil 2610.

The reflective aperture layer 2616 is deposited on transparent substrate 2632, preferably formed from plastic or glass. The reflective aperture layer 2616 can be formed from a film of metal deposited on the substrate, a dielectric mirror, or other highly reflective material or combination of materials. The reflective aperture layer 2616 is a rear-facing reflective layer, forming the front surface of optical cavity 2604. The reflective aperture layer 2616 has a set of apertures 2617 formed in it to allow light to pass through the apertures toward the electrowetting fluid components 2608 and 2610. Optionally, the aperture plate 2632 includes a set of color filters 2606 deposited on the top surface of reflective aperture 2616 and filling the apertures 2617.

The aperture plate 2632 is positioned between the light modulator substrate 2630 and the light guide 2618. The substrates 2632 and 2618 are separated from each other by a gap 2634 filled with a fluid (such as air). The refractive index of the fluid is less than that of the light guide 2618. Suitable light guides 2618 for display apparatus 2600 are described further in U.S. patent application Ser. No. 11/528,191, the entirety of which is herein incorporated by reference. The optical cavity 2604 also includes substrates 2632, 2618, and the front-facing rear reflective layer 2620 positioned adjacent the rear side of the light guide 2618. One or more light sources 2622 inject light into the light guide 2618.

The reflective aperture layer 2616 has one aperture 2617 corresponding to each light modulator cell 2602 in the array 2600. Similarly, the light modulator substrate 2630 has one transparent electrode 2612 or one set of pixel transistors and capacitors for each light modulator cell 2602. The substrates 2630 and 2632 are aligned during assembly to ensure that corresponding apertures 2617 are positioned where light will not be obstructed by the oil 2610 when cells are actuated or held in the open state, e.g. cell 2602b.

Fabrication of an Aperture Plate

The aperture plate 2700 of FIG. 11 illustrates the detailed structures within one implementation of an aperture plate, such as aperture plate 2346, 2374, 2387, or 2632 according to an illustrative embodiment of the invention. The aperture plate 2700 includes a substrate 2702, a dielectrically enhanced metal mirror 2704, a light absorbing layer 2706, and a spacer post 2708. The dielectrically enhanced metal mirror and the light absorbing layer have been patterned into apertures 2709.

The substrate 2702 is preferably a transparent material, for example glass or plastic. The dielectrically enhanced metal mirror 2704 is comprised of a 5-layer stack of materials including, in order from the substrate up, a thin film of $Si_3N_4$ 2710, a thin film of $SiO_2$ 2712, another thin film of $Si_3N_4$ 2710, another thin film of $SiO_2$ 2712, and a thin film of aluminum 2714. The relative thicknesses and preferred refractive indices of these layers are given in Table 1.

TABLE 1

Film Thicknesses and Refractive Indices for a Dielectrically Enhanced Metal Mirror.

| Thin film material | Thickness | Refractive index |
|---|---|---|
| 5. Aluminum | 200 nm or less | NA |
| 4. $SiO_2$ | 88 nm | 1.46 |
| 3. $Si_3N_4$ | 64 nm | 2.0 |
| 2. $SiO_2$ | 88 nm | 1.46 |
| 1. $Si_3N_4$ | 64 nm | 2.0 |

The light absorbing layer 2706 can be formed from a thin film of black chrome, which is a composite of chromium metal particles suspended in an oxide or nitride matrix. Examples include Cr particles in a $Cr_2O_3$ matrix or Cr particles in an SiO$_2$ matrix. In other implementations black chrome can be formed from a thin metal film of chromium upon which a thin film of CrOx (a sub-oxide of chromium) has been either grown or deposited. A preferred thickness for the black chrome is 150 nm.

The aperture windows 2709 can be patterned from the thin film stack of materials 2704 and 2706 by processes known in the art such as photolithography and etch or by photolithography and lift-off. In the etch process a layer of photoresist is added to the top of the thin film stack and then exposed to UV light through a mask. After developing the aperture pattern in the exposed layer of photoresist, the whole stack is etched in the region of apertures 2709 down to the substrate 2702. Such etching may be accomplished by immersion in wet chemicals, by a dry plasma or ion beam etch, or any combination of the above. In the lift-off process the layer of photoresist is added to the glass before deposition of the thin film stack, the resist being developed into a pattern that is a reverse of the etch mask pattern. The thin film stack is then deposited over the top of the photoresist, such that the thin film stack makes contact to the glass everywhere except in the regions of the apertures 2709. After deposition of the thin film stack is complete, the substrate is dipped into a bath of chemicals that dissolves or lifts-off the photoresist as well as any thin film materials that were deposited on top of the photoresist.

The spacer post 2708 is formed from a photo-imageable polymer such as such as a photo-imageable epoxy (in particular a novolac epoxy) or a photo-imageable polyimide material. Other polymer families that can be prepared in photo-imageable form and are useful for this application include polyarylene, parylene, benzocyclobutane, perfluorocyclobutane, silsequioxane, and silicone polymers. A particular photo-imageable resist useful for the spacer application is the Nano SU-8 material available from Microchem Corporation, headquartered in Newton, Mass.

The polymer spacer material is initially deposited as a thick film on top of the thin film stack 2704 and 2706 after the apertures 2709 have been patterned. The photo-imageable polymer is then exposed to UV light through a mask. Alignment marks help to ensure that the resultant spacers 2708 are located correctly with respect to apertures 2709. For instance, alignment fiducials can be formed on the periphery of the display during the process of etching the apertures 2709. These fiducials are then aligned to a corresponding set of fiducials on the exposure mask to ensure a correct location of spacers 2708. A developing process is then effective at removing all of the polymer except where it was exposed to the UV light. In an alternate method, the features on the exposure mask may be aligned directly to display features on the substrate 2702, such as the apertures 2709.

In the particular implementation described with respect to display apparatus 2340, the spacer posts can be 8 microns tall. In other implementations spacer heights may range from about 2 microns to about 50 microns. When cross sectioned in the plane of the substrate 2702, the spacers may take regular shapes such as a cylinder or a rectangle with widths in the range of 2 to 50 microns. Alternately, they can have complex irregular cross sections which are designed to maximize the contact area of the spacer while fitting between other structures on the substrate, such as apertures 2709. In a preferred implementation the spacer size, shape and placement is determined so that the spacers do not interfere with the movement of the shutters, such as shutters 2354 or other MEMS components, such as actuators 2358 in display apparatus 2340.

In another embodiment, the spacer post 2708 is not provided as a polymer material but is instead composed of a heat reflowable joining material, such as a solder alloy. Exemplary heat reflowable materials are described below with respect to FIG. 13B. The solder alloy can pass through a melting or reflow step which allows the solder alloy to wet or bond to a mating surface on the opposing substrate. The solder alloy therefore performs an additional function as a joining material between an aperture plate, such as aperture plate 2346 and a modulator substrate, such as substrate 2342. Because of the reflow process, the solder alloy typically relaxes to an oblate shape referred to as the solder bump. A predetermined spacing between substrates can be maintained through control over the average volume of material in the solder bump. Solder bumps can be applied to aperture plate 2700 by means of thin film deposition, by thick film deposition through a stencil mask, or by electroplating.

In another embodiment, the aperture plate 2700 can be subjected to a sandblasting treatment after the steps of forming the optical layers 2704 and 2708. The sandblasting has the effect of roughening the substrate surface selectively in the regions of the aperture 2709. A roughened surface at aperture 2709 behaves as an optical diffuser which can provide the benefits of a wider viewing angle for the display. In another embodiment, a diffusing surface at aperture 2709 is provided by means of an etching process, where the etch is selectively applied in the regions of apertures 2709 after exposure of photoresist to a photomask. Etch pits or trenches can be created through proper design of the photomask, and the sidewall angles or depths of the pits or trenches can be controlled by means of either a wet or dry etch process. In this fashion optical structures with controlled degrees of diffusive broadening can be created. In this fashion anisotropic diffusers can be created at the substrate surface which deflect light along a preferred optical axis, creating elliptical and/or multi-directional cones of emitted light.

In another embodiment, an etched trench can be provided in substrate 2702 that substantially surrounds the display along the periphery of the array of apertures 2709 (i.e. around the periphery of the active display region). The etched trench performs as a mechanical locating structure for restricting the motion or flowing of an adhesive, such as adhesive 528, used to seal aperture plate 2700 to an opposing substrate.

Further details regarding the materials and processes described above can be found in U.S. patent application Ser. No. 11/361,785, filed Feb. 23, 2006, incorporated herein by reference. For example, that application includes additional materials and processing methodologies regarding the formation of dielectrically enhanced metal mirrors with apertures, light absorbing layers, and spacer posts. Although dielectric mirrors and spacers are described in that application in the context of an integrated (for example MEMS-up) display design, it will be understood that similar processes can be adapted to the fabrication of an aperture plate, such as aperture plate 2700.

In some implementations of the aperture plate 2700, it is desirable to employ a transparent plastic material for the substrate 2702. Applicable plastics include, without limitation, polymethylmethacrylate (PMMA) and polycarbonate. When plastic materials are used, it also becomes possible to utilize an injection molding or stamping process for the formation of spacer posts 2708. In such a process the spacer posts are formed in a mold or a stamper first, before the application of the dielectrically enhanced metal mirror 2704. All of the layers of the dielectrically enhanced metal mirror 2704 would be then be deposited in sequence on top of the substrate which already includes spacer posts 2708. The light absorbing layer 2706 is deposited on top of the dielectric mirror 2704. In order to pattern the aperture window 2709 a special photoresist is applied that uniformly coats the surfaces of the thin films without being disrupted by the presence of spacer posts 2708. Suitable photoresists include spray-on photoresists and electroplated photoresists. Alternately, a spin-on resist is applied followed by a reflow step that provides an even resist thickness across the thin film surfaces in the areas of apertures 2709. The exposure of the resist, developing, and etching of the thin film layers then proceeds as described above. After the removal of the photoresist, the process is complete. A liftoff process can also be employed to pattern the dielectrically enhanced mirror as described above. The use of a molding or stamping process for the formation of spacer posts 2708 helps to reduce the material costs required in the fabrication of aperture plate 2700.

In some display implementations, aperture plate 2346 is combined with light guide 2348 into one solid body, referred to herein as a unitary or composite backlight, described further in U.S. patent application Ser. Nos. 11/218,690 and 11/528,191, respectively. Both applications are incorporated herein by reference. All of the processes described above for the formation of the dielectrically enhanced metal mirror 2704, for the light absorbing layer 2706, and/or for the spacer posts 2708 can be similarly applied to a substrate which is bonded to or otherwise indistinguishable from the light guide. The surface of the unitary backlight onto which the thin films are applied can be glass, or it could be plastic, including a plastic which has been molded to form spacer posts, such as spacers post 2357.

In one implementation, the spacer posts 2708 are formed or attached to aperture plate 2700 before the aperture plate is aligned to a modulator substrate, such as modulator substrate 2342. In an alternative implementation of display apparatus 2340, the spacer posts 2357 are fabricated on top of and as a part of the modulator substrate 2342, before the modulator substrate is aligned to the aperture plate 2346. Such an implementation was described with respect to FIG. 20 within the aforementioned U.S. patent application Ser. No. 11/361,785.

Figure 12:
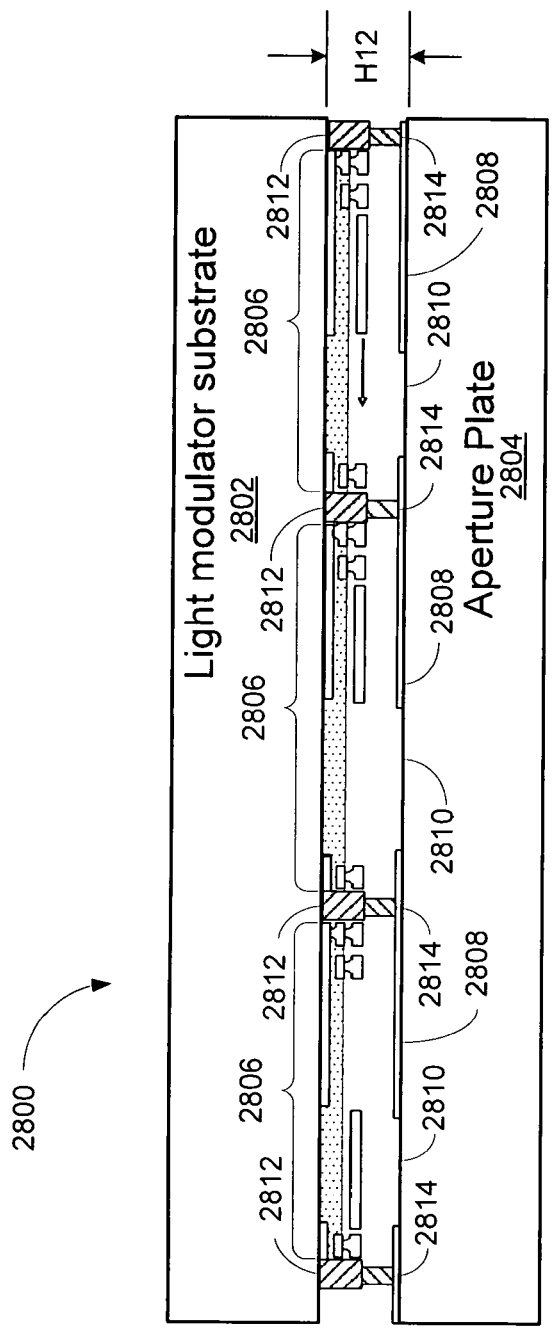
FIG. 12 is a cross sectional view of a display assembly, according to an illustrative embodiment of the invention.

FIG. 12 is a cross sectional view of a display according to an illustrative embodiment of the invention. The display assembly 2800 comprises a modulator substrate 2802 and an aperture plate 2804. The display assembly 2800 also includes a set of shutter assemblies 2806 and a reflective aperture layer 2808. The reflective aperture layer 2805 includes apertures 2810. A predetermined gap or separation I-112 between the substrate 2802 and 2804 is maintained by the opposing set of spacers 2812 and 2814. The spacers 2812 are formed on or as part of the modulator substrate 2802. The spacers 2814 are formed on or as part of the aperture plate 2804. During assembly, the two substrates 2802 and 2804 are aligned so that spacers 2812 on the modulator substrate 2802 make contact with their respective spacers 2814.

The separation or distance H12 of this illustrative example, is 8 microns. To establish this separation, the spacers 2812 are 2 microns tall and the spacers 2814 are 6 microns tall. Alternately, both spacers 2812 and 2814 can be 4 microns tall, or the spacers 2812 can be 6 microns tall while the spacers 2814 are 2 microns tall. In fact, any combination of spacer heights can be employed as long as their total height establishes the desired separation H 12.

Providing spacers on both of the substrates 2802 and 2804, which are then aligned or mated during assembly, has advantages with respect to materials and processing costs. The provision of a very tall (e.g. 8 micron) spacer, such as spacer 2708, can be costly as it can require relatively long times for the cure, exposure, and development of a photo-imageable polymer. The use of mating spacers as in display assembly 2800 allows for the use of thinner coatings of the polymer on each of the substrates.

In another implementation, the spacers 2812 which are formed on the modulator substrate 2802 can be formed from the same materials and patterning steps that were used to form the shutter assemblies 2806. For instance, the anchors employed for shutter assemblies 2806 (similar to anchors 2356) can also perform a function similar to spacer 2812. In this implementation a separate application of a polymer material to form a spacer would not be required and a separate exposure mask for the spacers would not be required.

Figure 13A:
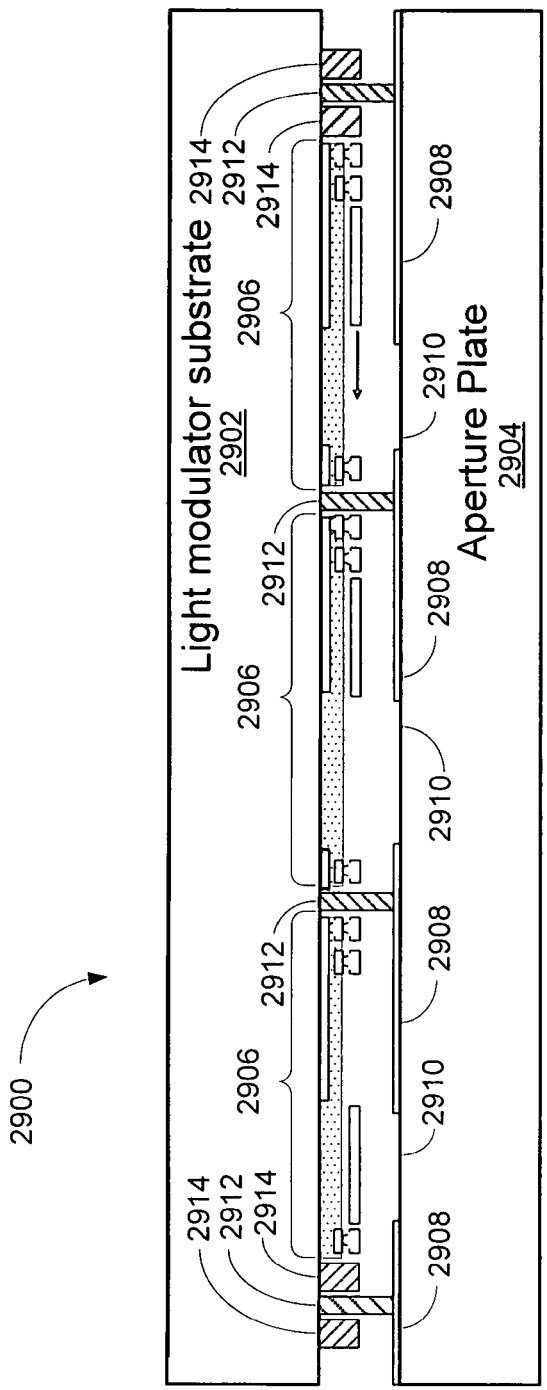
FIG. 13A is a cross sectional view of a display assembly, according to an illustrative embodiment of the invention.

The display assembly 2900 of FIG. 13A illustrates one methodology for aligning a modulator substrate and an aperture plate, according to an illustrative embodiment of the invention. The display assembly 2900 comprises modulator substrate 2902 and aperture plate 2904. The display assembly 2900 also comprises a set of shutter assemblies 2906 and a reflective aperture layer 2908, including apertures 2910. A predetermined gap or separation between the substrate 2902 and 2904 is maintained by the spacers 2912. The spacers 2912 are formed on or as part of the aperture plate 2904. The display assembly 2900 also includes a set of alignment guides 2914. These alignment guides are formed on or as part of the modulator substrate 2902. When the modulator substrate 2902 and aperture plate 2904 are assembled together, the gap between the alignment guides 2914 and the spacers 2912 is quite close, in some cases less than 1 micron. By capturing the spacer posts between the closely spaced alignment guides, sideways motion between the modulator substrate 2902 and the aperture plate 2904 is restricted, thereby maintaining the alignment between the shutters 2906 and the aperture 2910.

In various implementations, the alignment guides 2914 are ring or doughnut-shaped. In other implementations, the alignment guide 2914 is a simple slot which captures a wall like shape from the aperture plate 2904. The alignment slots can be oriented parallel to either or both edges of the modulator substrate 2903. Having alignment slots with different, and preferably perpendicular, orientations helps to prevent motion in any direction parallel to the plane of the substrate 2902, though other orientations may also be employed. The alignment guides 2914 can be placed either between pixels, within pixels, or external to the array of pixels along the periphery of the display.

Alternate means of maintaining alignment between modulator substrates and aperture plates are possible. In one implementation an adhesive, such as adhesive 528 in FIG. 5, is provided for holding two substrates together in lateral alignment. In this implementation an alignment device, for example, a mechanical platform equipped with translational motor drives and an alignment camera, is utilized to hold the two substrates in their proper orientation while an adhesive, such as adhesive 528, is dried or cured in place. Epoxies that are partially or totally cured by means of UV radiation are particularly useful as adhesives in this implementation. In implementations where the adhesive is applied at the periphery of the display assembly, it is referred to as an edge seal or gasket seal. In some implementations the edge seal adhesive contains glass or polymer beads which act as spacers for maintaining a predetermined gap or spacing between the opposing substrates.

Figure 13B:
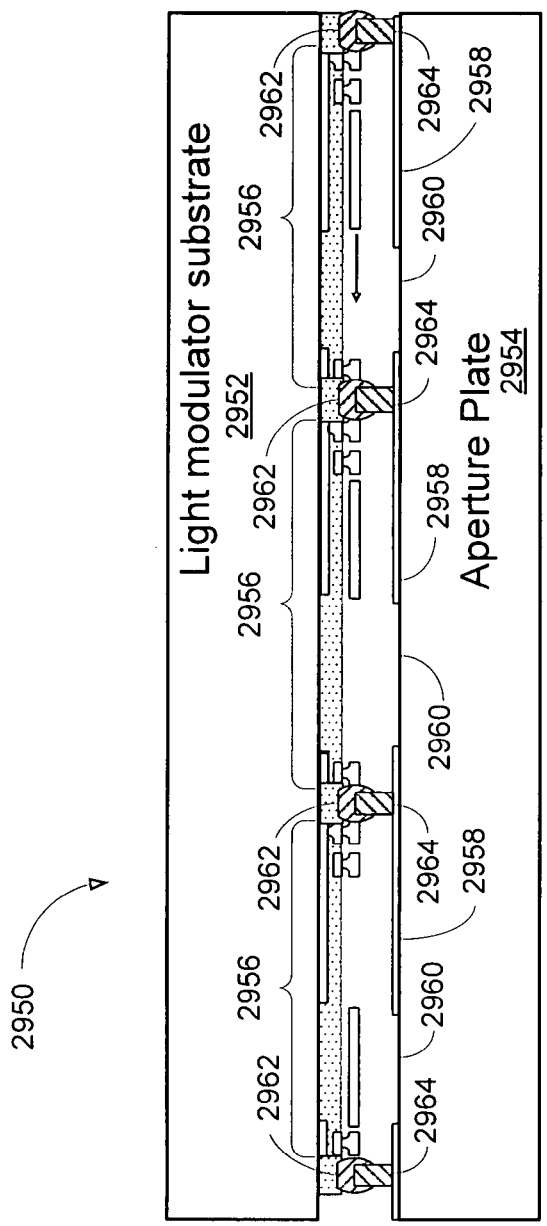
FIG. 13B is a cross sectional view of a display assembly, according to an illustrative embodiment of the invention.

The display assembly 2950 of FIG. 13B illustrates another means for aligning a modulator substrate to an aperture plate, according to an illustrative embodiment of the invention. The display assembly 2950 comprises modulator substrate 2952 and aperture plate 2954. The display assembly 2950 also comprises a set of shutter assemblies 2956 and a reflective aperture layer 2958, including apertures 2960. A predetermined gap or separation between the substrate 2952 and 2954 is maintained by the opposing set of spacers 2962 and 2964.

The spacers 2962 are formed on or as part of the modulator substrate 2952. The spacers 2964 are formed on or as part of the aperture plate 2954.

The spacers 2962 and 2964 are made of different materials. For the embodiment of display assembly 2950 the spacers 2962 are made of a heat reflowable material such as solder while the spacers 2964 are made of a material which is substantially solid or has a melting or softening point considerably higher than that of spacer 2962. The material in use for substantially solid spacer 2964 can be any of the materials described above with respect to spacer post 2708, including the materials listed in the incorporated U.S. patent application Ser. No. 11/361,785, or it can be any of the materials described below with respect to conductive spacer 3112.

The spacer 2962, also referred to as a solder bump, can be made of a number of different•metals or metal alloys commonly used for the soldering of electrical connections. Exemplary alloys include, without exclusion, Pb—Sn alloys, Pb—In alloys, In—Sn alloys, In—Cu—Sn alloys, Au—Sn alloys, Bi—Sn alloys, or the substantially pure metals In, Sn, Ga or Bi. Such alloys are designed to liquefy or reflow at temperatures in the range of 150 to 400 Centigrade and to wet the surfaces of two opposing contact materials. After cooling and solidification the solder materials join together (and optionally electrically connect) the two opposing contact materials, acting as an adhesive. For the application illustrated by display assembly 2950 the solder material 2962 acts as an adhesive link between spacer post 2964 and the modulator substrate 2952. Non-metallic reflow materials are also applicable for use as spacer 2962. These materials include glass fit materials, such as mixtures of barium-silicate or lead-silicate glasses or thermoplastic polymers, such as polyethylene, polystyrene, or polypropylene, and/or natural and synthetic waxes such as carnauba wax, paraffin, or olefin waxes.

The assembly process for display 2950 would proceed as follows. First the spacer materials 2962 and 2964 would be fabricated onto their respective substrates. Next the two substrates 2952 and 2954 would be assembled together with roughly the correct lateral alignment. Next the two substrates would be heated so as to liquefy or reflow the solder material 2962. Once molten, the material 2962 would proceed to wet the surface of the substantially solid and opposing spacer post 2964. Simultaneously, the surface tension of the now liquid material 2962 will act to minimize its surface area. The resulting capillary forces have the effect of pulling or sliding the two substrates 2952 and 2954 laterally into a more perfect alignment. After cooling and solidification the two substrates are locked into alignment by the adhesive properties of the solder material 2962.

In an alternate implementation the substantially solid material can be fabricated onto the modulator substrate while the heat reflowable material is fabricated onto the aperture plate. In another implementation both the solid and reflow materials are formed sequentially onto one or the other of the modulator substrate or the aperture plate. For that implementation the solder material is designed to wet and join to a bonding pad located on the opposing substrate.

There are other bonding geometries where a heat reflowable material can be used to ensure the alignment between opposing substrates. In one implementation solder bumps are fabricated on both of the substrates, and the bumps or beads of solder material are merged or joined during the reflow process. In this implementation a substantially solid spacer material, such as spacer 2964 is not employed. The gap between the two substrates is determined by the average volume of the solder bumps after solidification, which can be controlled by means of the fabricated dimensions for the solder bumps prior to assembly. In another implementation the spacer post 2964 is replaced with a detent or solder receptacle structure, such as a ring or a square frame formed on one of the two substrates with an indent at the center. The molten solder tends to wet and fill the gap at the center of the ring, thereby pulling the opposing substrates into alignment. Similar processes related to the alignment of semi-conductor packages are described in further detail in U.S. Pat. No. 5,477,086, the entirety of which is incorporated herein by reference.

In some implementations the heat reflowable material is disposed within or between each of the pixels in the array. In other implementations the pairing of reflow materials to corresponding posts, receptacles, or bond pads on the opposing substrate can be arranged at the periphery of the display or at the outside corners of the display assembly. When the reflow material is disposed at the periphery of the display it can, in some implementations, serve a further purpose similar to epoxy 528 (see FIG. 5) as a sealing or gasket material.

Figures 14A, 14B:
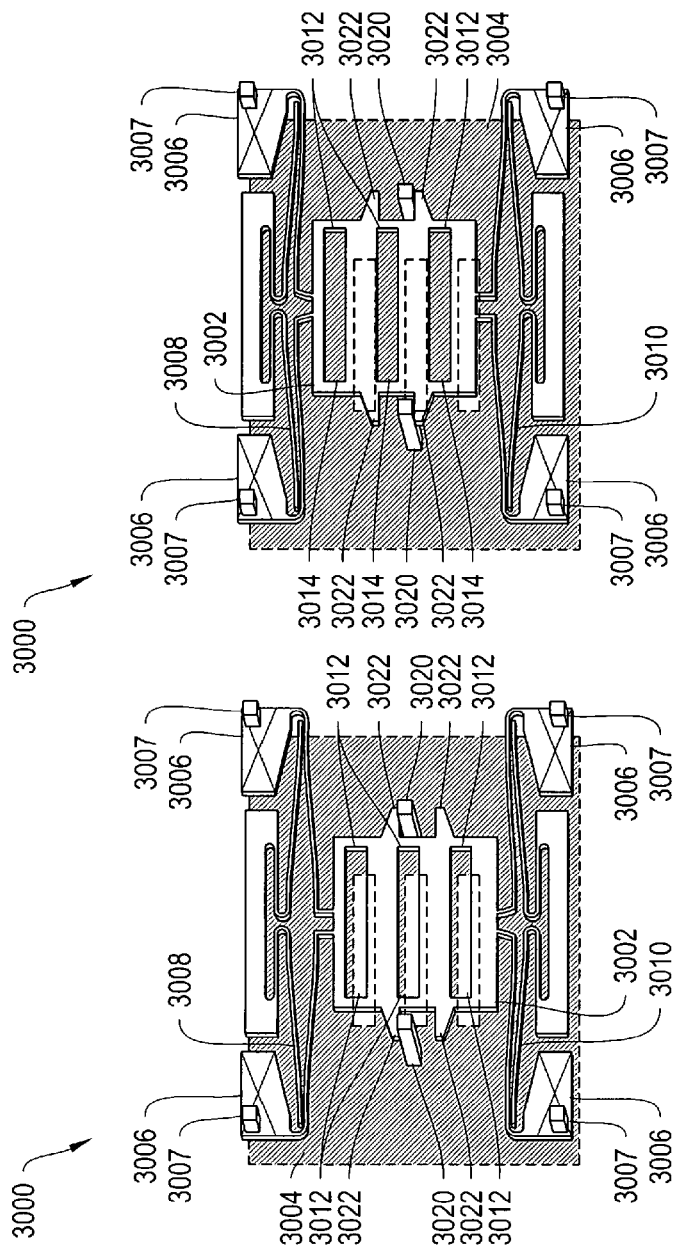
FIGS. 14A and 14B are perspective views of a shutter assembly in open and closed states, respectively, according to an illustrative embodiment of the invention.

FIGS. 14A and 14B are top views of a display assembly 3000, similar to the shutter assembly 2200 of FIGS. 6A and 6B, in opened and closed positions, respectively, according to an illustrative embodiment of the invention. The display assembly 3000 includes a shutter assembly, including shutter 3002, supported over a reflective aperture layer 3004. The shutter assembly also includes portions of opposing actuators 3008 and 3010. In display assembly 3000 the shutter is connected to the modulator substrate (not shown), such as modulator substrate 2342 via the actuators 3008 and 3010 and the anchors 3006 and 3007. The reflective aperture layer 3004 is formed on a separate substrate, such as aperture plate 2346. The shutter assembly 3001 is suitable for inclusion in an array of light modulators included in a display apparatus.

The shutter 3002 includes three shutter apertures 3012, through which light can pass. The remainder of the shutter 3002 obstructs the passage of light. The reflective aperture layer 3004 includes apertures 3014 which also allow the passage of light. In FIG. 14A, where the shutter is in the open position, the apertures 3012 and 3014 are aligned to allow passage of light. In FIG. 14B, where the shutter is in the closed position, the shutter 3002 obstructs the passage of light through apertures 3014.

The display apparatus 3000 includes spacer posts 3020 which function in a manner similar to spacer posts 2357 of display apparatus 2340 for maintaining a predetermined gap or spacing between opposing substrates. The spacer posts 3020, however, provide an additional function of ensuring the proper alignment between the shutter 3002 and the apertures 3014 by fitting between motion stops 3022, which are solid extensions of the shutter 3002. When in the open position, the shutter 3002, via one set of motion stops, comes into hard contact with the spacer post 3020. When in the closed position the shutter 3002, via another set of motion stops 3022, contacts the spacer post 3020 again. The amount of motion allowed for the shutter 3002 between each of the stop positions, in various implementations, ranges from about 5 to about 50 microns.

The alignment control methodology of display assembly 3000 is effective for the case where both apertures 3014 and spacer posts 3020 are attached to one substrate, e.g. the aperture plate, while the shutter 3002 is attached by means of anchors 3007 to another substrate, e.g. the modulator substrate. In such implementations, despite misalignments of as much as 5 or 10 microns during assembly of the two substrates, a proper alignment between the shutters 3002 and the apertures 3014 can be provided. Thus, a shutter/aperture overlap, e.g. overlap W1 in display apparatus 2300, of as narrow as 1 micron can be maintained.

Figure 15:
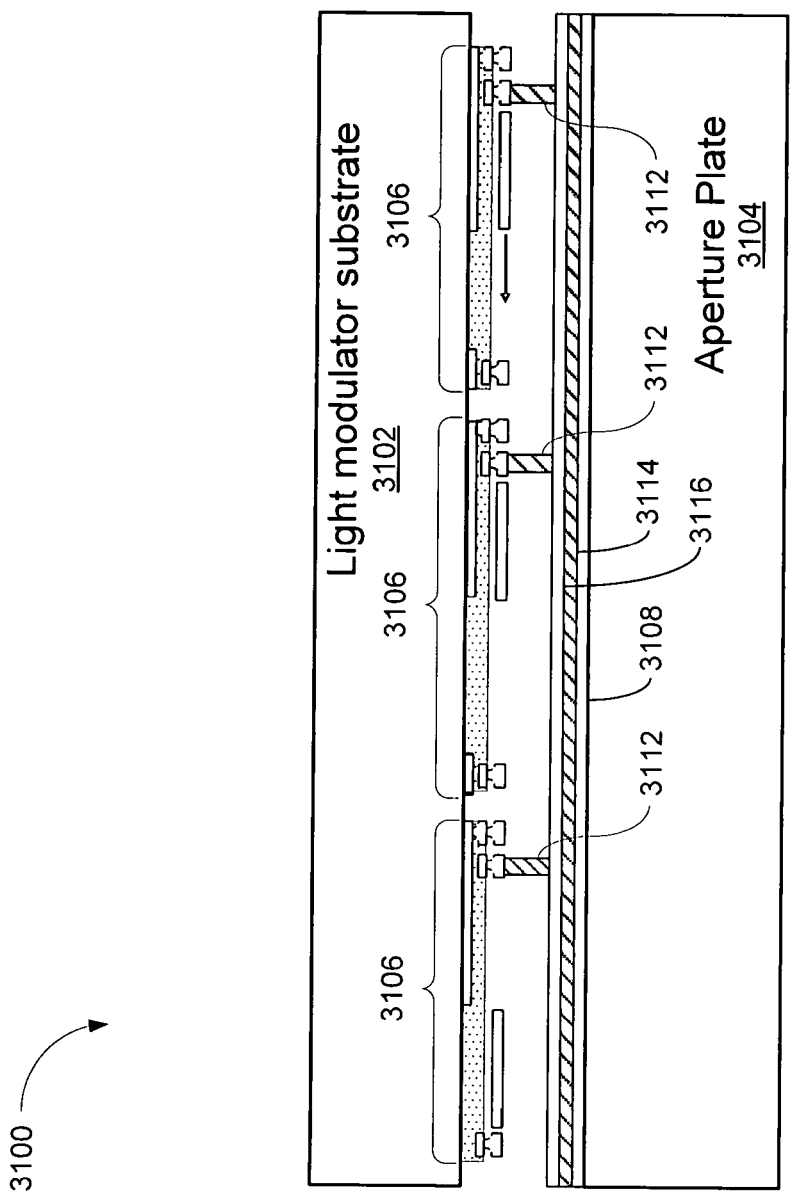
FIG. 15 is a cross sectional view of a display assembly, according to an illustrative embodiment of the invention.

FIG. 15 is a cross sectional view of a display assembly 3100, according to another illustrative embodiment of the invention. The display assembly 3100 includes a modulator substrate 3102 and an aperture plate 3104. The display assembly 3100 also includes a set of shutter assemblies 3106 and a reflective aperture layer 3108. Additionally, the aperture plate 3104 includes a dielectric isolation layer 3114 and an electrically conductive interconnect 3116. The cross sectional view in FIG. 15 is taken along a line where these are no aperture holes in the reflective layer 3108. A predetermined gap or separation between the substrate 3102 and 3104 is maintained by a set of spacers 3112.

The spacers 3112 of display assembly 3100 include an electrically conductive material. For example, they can be formed from metal posts that are formed by either an electroplating process, an etching process, or a lift-off process. The metals copper, nickel, aluminum, gold, or titanium, without exclusion, are useful for this application. Alternately the posts 3112 can be formed from a composite material, for example, a polymer or epoxy material that is impregnated with metal particles to render it conductive. Alternatively the posts 3112 can be formed from polymer materials that are coated with thin metal films such that the surface is made conductive.

The electrically conductive spacers 3112 are disposed to provide an electrical contact between one electrode of the shutter assemblies 3106 and the electrically conductive interconnect 3116. For instance, as shown in FIG. 15, the interconnect 3116 can be patterned as a metal line that is parallel to one of the row or columns in the display. The spacers 3112 and the interconnect 3116 provide, then, a common electrical connection between electrodes in all of the shutter assemblies 3106 for the given row or column. In this fashion, some of the metal layers used to form an addressing or control matrix for a display, such as display apparatus 2340, can be fabricated on top of the aperture plate 3104 instead of on the modulator substrate 3102. The spacers 3112 can be configured to provide a distinct electrical connection between the light modulators 3106 within each of the pixels in the array to an electrical circuit on the opposing substrate. In an extreme case each of the electrodes for each of the shutter assemblies can be connected to a circuit on the opposing substrate by means of electrically conductive spacer posts, such that the complete control circuit, including transistors and capacitors, can be formed on a substrate that is distinct from or separate from that of the light modulators.

The electrically conductive spacer posts 3112 can be formed onto either the modulator substrate 3102 or the aperture plate 3104 prior to assembly In one implementation the conductive spacers are formed from gold-alloy studs that are individually placed and bonded by machine onto one or the other of substrates 3102 or 3104 as part of the assembly process. In another implementation the spacers are formed from solder bumps which are either electroplated or stenciled onto one or the other or both of substrates 3102 or 3104 as part of the assembly process. Any of the solder materials listed above with respect to solder bump 2962 can be employed for spacer posts 3112.

The process of matching or making electrical connection between a spacer posts and a landing zone on the opposing substrate can include a reflow process, such as an interdiffusion or a soldering process, so that a good electrical contact is made between the two surfaces.

Although the display assembly 3100 is illustrated as part of a MEMS-down configuration, an analogous use for electrically conductive spacer posts can also be found in the MEMS-up configuration as with, for example, the display apparatus 2300. For a MEMS-up configuration both the light modulators and the reflective aperture layer are formed on the same substrate, while the electrically conductive interconnects, such as interconnects 3116 are formed on an opposing substrate, such as a cover plate. Conductive spacers, such as spacers 3112, would then make electrical connection between the modulator substrate and the cover plate. The invention is particularly useful for applications where the cover plate also acts as a touch-screen input device. Electrical connections between substrates, especially where connections are provided for each pixel in the array, are useful for providing electrical communication between a touch screen sensor array and a separate substrate that includes a control matrix for the array of pixels.

Figure 16:
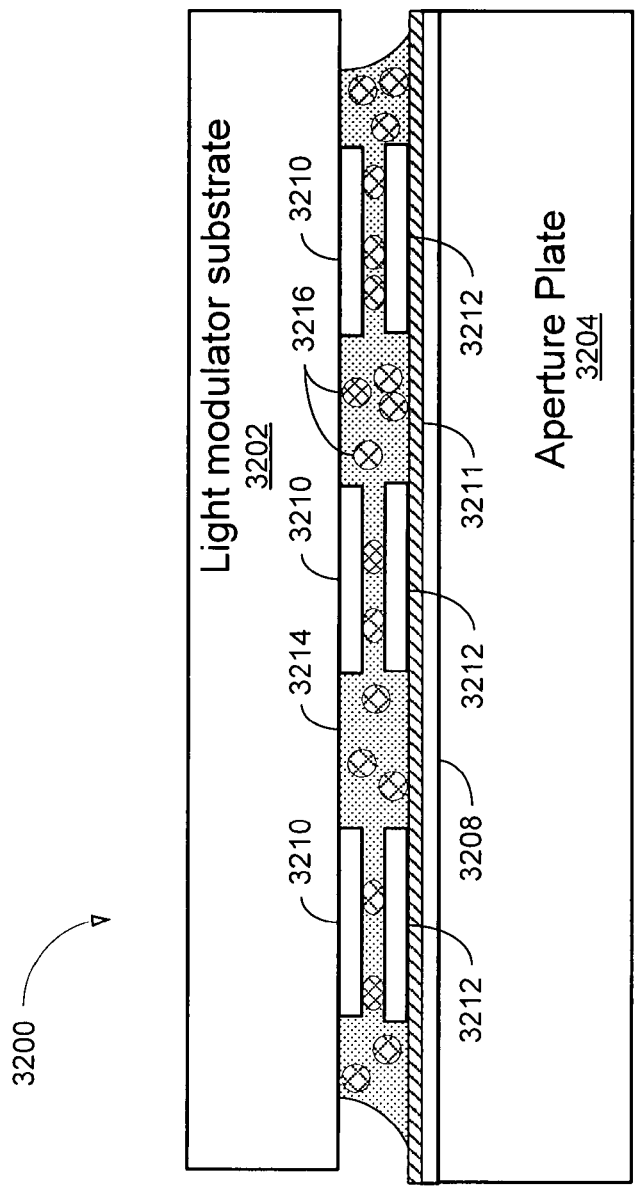
FIG. 16 is a cross sectional view of a display assembly, according to an illustrative embodiment of the invention.

FIG. 16 is a cross sectional view of another display assembly 3200, according to an illustrative embodiment of the invention. The display assembly 3200 includes a modulator substrate 3202 and an aperture plate 3204. The display assembly 3200 also includes a set of electrical interconnects 3210 formed on the modulator substrate and a set of electrical interconnects 3212 formed on the aperture plate 3204. The two substrates make electrical connections between the interconnects 3210 and 3212 by means of an anisotropic conductive adhesive 3214. The aperture plate also includes a dielectric isolation layer 3211 and a reflective aperture layer 3208. Not shown in this view are shutter assemblies formed on substrate 3202 or any aperture windows in the reflective layer 3208, since this cross sectional view is taken along a line closer to the periphery of the display, outside the array of pixels.

The anisotropic conductive adhesive (i.e. "ACA") 3214 is a polymer adhesive that is impregnated with a collection of solid conducting spheres 3216. When the two substrates 3202 and 3204 are compressed together the conducting spheres become trapped between the contact areas of interconnects 3210 and 3212. An electrical connection is thereby established between the interconnects 3210 and 3212 on opposing substrates. The electrical connection becomes locked in place after the polymer matrix of the ACA is cured or polymerized. The conducting spheres 3216 can range in size from 5 to 50 microns in diameter. The spheres 3216 can be made of a metal, such as nickel, or from alloys such as Ni—Au, Ni—Ag, or Cr—Au. Nickel has sufficient hardness to maintain it's geometry under compressive loading. The conducting spheres can also be fabricated from dielectric materials, such as glass or polymer, which are then coated with a conducting layer such as gold. In an alternate embodiment, metal spheres such as nickel can be coated with another metal with a higher conductivity and resistance to oxidation, such as gold, to reduce contact resistance.

When the conducting spheres are selected for uniform diameter, then the squeezing of the contacts 3210 and 3212 to the conducting spheres 3216 establishes a fixed spacing or gap between the contacts. The conducting spheres 3216 can therefore perform the same function as the spacers 2312 or 2357.

The conducting spheres do not make a continuous contact along an axis parallel to the plane of the substrates. As a result, an electrical connection is generally not established between neighboring pairs of conductors 3210 or pairs of conductors 3212. Therefore a single application of the ACA 3214 can be sufficient to make multiple independent electrical connections between independent sets of interconnects 3210 or 3212. This particular interconnection medium is referred to as an anisotropic conductive medium.

The ACA 3214 is generally applied by means of a tape or needle dispense over multiple independent electrical contacts. It is particularly useful for making multiple connections along the periphery of a display. For instance it can connect together a series of row interconnects on one substrate to a parallel set of row interconnects on another substrate. This might be useful, perhaps, where the control matrix is built onto the modulator substrate 3202 while driver chips are attached to a parallel set of interconnects on the aperture plate 3204. The functions of the substrates 3202 and 3206 can also be reversed, so that the modulator substrate is on the bottom, closest to the backlight and the substrate on the other side of the ACA 3214 functions as a cover plate.

The electrically conductive spacers 3112 in display assembly 3100 are preferably used in each and every pixel in the array, although they can be applied on the periphery of the array. The electrically conductive spheres 3216, which are also spacers, in display assembly 3200 are preferably applied along the periphery of the array of pixels. The spacers 3020 of display assembly 3100, which perform as motion stops, are preferably used at every pixel in the array. The spacers 2312 or 2357 of display apparatus 2300 and 2340, respectively, can be placed either within or between each pixel of the array. Similarly the spacers depicted in FIGS. 20 and 21 of U.S. patent application Ser. No. 11/361,785, may also be included with each and every pixel in the array.

The association of a spacer with each and every pixel is not, however, necessary to maintain a desired gap between substrates. A spacer can be associated, for instance, with each group of four pixels or with each group of 16 pixels. In other embodiments the spacers might be restricted to the periphery of the display. Alternatively, as depicted in display assembly 3000, a display assembly can include multiple spacers per pixel.

The spacers 2357 in display apparatus 2340, for instance, are responsible for maintaining an aperture to shutter spacing H6 that can be as small as 1 micron. Denser spacer placing becomes particularly useful when display resolutions exceed 200 pixels per row or column, or when display diagonals exceed 2 inches. A dense array of spacers is also useful in display apparatus 2300, for example, for maintaining a uniform pressure on the lubricating fluid 2322, which might otherwise be disrupted by local pressures, such as finger pressure, applied to the front surface of the display.

The spacers described with respect to this invention can be usefully applied to maintain the gap between substrates in an electrowetting display, such as display apparatus 2500 or 2600. Any display that employs MEMS-based light modulators, in fact, can benefit from spacers applied within the interior of the array of light modulators. Examples of alternate MEMS-based light modulators include digital mirror devices (DMDs), interference modulation displays (IMODs), and light tap displays or frustrated internal reflection displays.

Alignment Apparatus and Techniques

Figure 17:
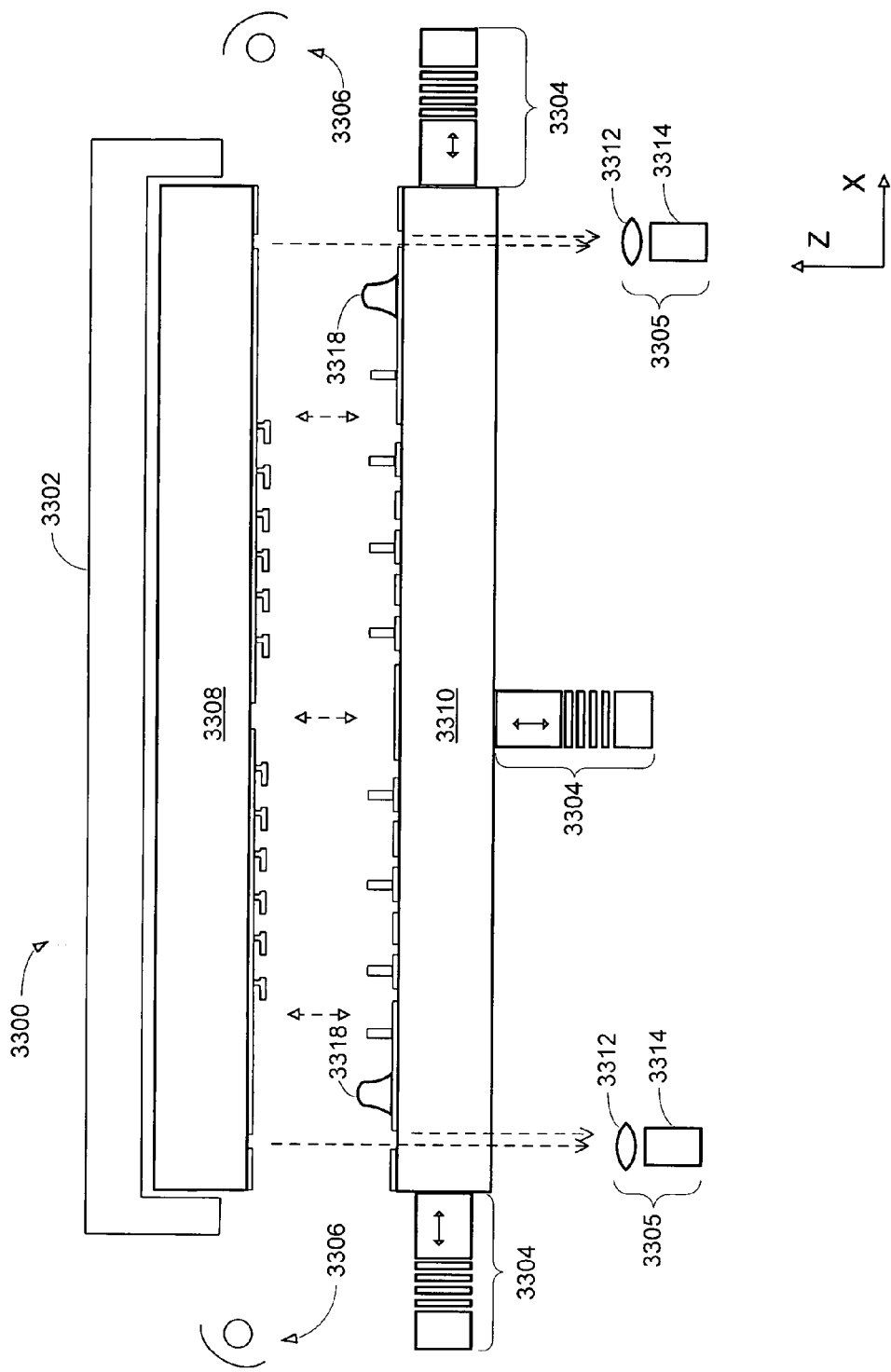
FIG. 17 is a conceptual view of a precision substrate alignment apparatus, according to an illustrative embodiment of the invention.

As indicated in the discussions of display apparatus 2300 and 2340 and for the shutter assembly 2200, the alignment of a shutter assembly to its corresponding aperture is an important design feature for the MEMS light modulator. The overlap, indicated as overlap 2216 or as overlaps W1 and W2, reduces or eliminates light leakage while the MEMS light modulator is in its closed state, a state which is also referred to as a light obstructing state or a dark state. For the MEMS-down display apparatus 2340 the overlap W2 is established during the cell assembly process, when the two substrates, 2342 and 2346 are aligned and mechanically attached to each other. For display apparatus 2340 the apertures 2347 are formed on the aperture plate 2346 while the shutter assemblies 2341 are formed on or supported from the modulator substrate 2342. The proper spatial relationship between apertures 2347 and shutter assemblies 2341 can be achieved with precision if a means for accurate alignment of the two substrates 2342 and 2346 can be provided. One method for alignment of the two substrates is made possible by an alignment apparatus 3300, as illustrated in FIG. 17, according to an illustrative embodiment of the invention.

The alignment apparatus 3300 comprises a stationary chuck 3302, a set of translational drives or motors 3304, a vision system 3305, and a set of UV exposure lamps 3306. A modulator substrate 3308 is rigidly attached to the chuck 3302. An aperture plate 3310 is held in place and guided by the motors 3304. The motors 3304 provide the ability to translate the substrate 3310 in three translational directions, for instance along x and y coordinates within the plane of substrate 3310 and additionally along the z coordinate establishing and varying the distance between the two substrates 3308 and 3310. Additionally, not shown in FIG. 17, an additional and optional set of three rotational motors can be provided, which ensure both the co-planarity of the substrates 3308 and 3310 and also their proper rotational relationship in the x-y plane. Although all translational motors 3304 are shown attached to the aperture plate 3310, in other embodiments the motors can be arranged differently between the two substrates. For instance the x-y translation motors can be attached to the aperture plate 3310 while the z-axis translation motor and theta rotation motor (about the z-axis) can be attached to the chuck 3302.

A variety of motor types are available for the motors 3304. In some embodiments these motors can be digitally controlled stepper motors, in some cases they can be linear screw drives, and in other cases they can be magnetically-driven solenoid drives. The motors need not be arranged to directly move a substrate, such as substrate 3310. They can instead be designed to move a stage or platter onto which the working piece or substrate 3310 is rigidly attached. The use of a moving stage is advantageous, since an additional optical measuring system (in some cases a laser interference system) can be provided for the stage which is capable of continuously measuring its translational position to a precision of better than 1 pm. Feedback electronics can then be employed between the motors 3304 and the optical measurement system to improve both the accuracy and stability of the stage position.

In some embodiments of apparatus 3300 both the chuck 3302 and the optional moving stage can be equipped with heaters and/or temperature control devices, to ensure uniform temperature across the substrates 3308 and 3310. Uniform temperatures help to ensure proper alignment between patterns on the two substrates, particularly for substrates whose diagonals exceed about 20 centimeters.

The alignment apparatus 3300 incorporates a vision system 3305 for detecting the relative positions of the two substrates 3308 and 3310. In a preferred embodiment, alignment marks are patterned into thin films on each of the substrates 3308 and 3310 (see, for example, the alignment marks 3408 and 3412 in FIG. 18). The vision system is capable of simultaneously imaging alignment marks on each of the two substrates, despite the fact that the marks are located on different surfaces, i.e. at different positions on the z axis.

For the illustrated embodiment, the vision system 3305 incorporates two imaging lenses 3312 and 3313 and either a microscope capable of split-field imaging or two cameras 3314 and 3315. The vision system 3305 is therefore capable of imaging, substantially simultaneously, two separated sets of alignment marks. The two sets of alignment marks are preferably located at the far sides or corners of the modulation array or panel.

In operation, an operator uses the vision system 3305 to view the relative positions of alignment marks, such as marks 3408 and 3412, and thereby judge the direction and degree of misalignment between the two substrates. The operator can then adjust the alignment between substrates 3308 and 3310, using drive motors 3304, until the alignment marks on the two substrates indicate misalignment below an acceptable degree of error. After sufficiently reducing the misalignment, the operator drives the z-axis motor until the spacers, such as any of the spacers 2357, 2708, or 2812 and 2814, on one of the substrates, 3308 or 3310, contact the opposing substrate, 3308 or 3310, or opposing spacers. In many instances, due to mis-orientation or non-planarity of the substrates, the operator will need to continually refine the x-y alignment between the substrates as the z-axis distance between the two substrates is decreased. In some embodiments, a final x,y, and theta correction can be made even after contact is established between the substrates. After contact is made, an adhesive 3318 will also make contact between the two substrates. In some embodiments, as the last step in the method 3301, the adhesive is at least partially cured while the alignment apparatus 3300 holds the two substrates in position. The UV exposure lamps 3306 can be used to initiate or accelerate the curing of the adhesive, thereby bonding the two substrates together. In some embodiments the substrate stage or the chuck 3302 is equipped with heaters to affect a thermal curing of adhesive 3318. The alignment marks, e.g. marks 3408 and 3412, are usually patterned and etched at the same time and are printed from the same photomask as the masks used to pattern the apertures, such as apertures 2347, and the shutter assemblies, such as shutter assembly 2341, respectively. The alignment marks are therefore designed for a fiducial function, i.e. the operator who achieves sufficient alignment between the alignment marks has confidence that the shutters and apertures in the neighboring array will also be in properly aligned.

According to the discussion of display apparatus 2340, the overlap W2 is preferably greater than or equal to 2 pm. In practice an overlap W2, which is reliably achieved during manufacture, is determined by a safety margin, designed into the masks, and by an alignment precision or tolerance. The precision or achievable tolerance is based on the design of alignment apparatus 3300, the design of the alignment marks, and process variables such as temperature, pressure, and the viscosity or plasticity of seal materials. Two examples are provided below for acceptable tolerance design: In the first example, which is tolerant of relatively wide variations in alignment during manufacture, an array of shutters and apertures is designed with a nominal overlap of 22 pm, i.e. if perfectly aligned, the shutters are designed to overlap the apertures by 22 pm. If the apparatus 3300 then enables an alignment repeatability of +/−20 tim, the designer can be assured that all (or 99.99% depending on how reliability is specified) of the shutters will have an overlap of at least 2 gm. However, for a dense array of pixels, i.e. for a high resolution display, there is not usually room available in an array design for 22 pm of overlap. Therefore a more precise alignment capability is desired.

In the second example, a nominal overlap of only 1 p.m is provided for in the masks, and the apparatus 3300 is designed to provide an alignment precision within +/−1 pm between patterns on the first and second substrates. To achieve this precision a) the vision system 3305 a resolution smaller than 1, b) the motors 3304 (or associated translation stages) stably drive to and resolve position differences with a resolution smaller than 1 pm, and c) the alignment marks are patterned and etched with edges, dimensions, and/or placements that are precise to a resolution of better than 1 p.m. Automated alignment systems with sub-micron precision are available today for purposes of semiconductor mask alignment, optoelectronic component assembly, and micro-medical devices. Representative suppliers of these systems include the Automation Tooling Systems Corp. of Cambridge, Ontario, Canada and the Physik Instrumente LP of Karlsruhe, Germany.

Generally, if attention is paid to the design of the vision system, the drive motors, and the design of the alignment marks, then it possible to provide an alignment apparatus 3300 and an alignment method which is capable of ensuring an overlap W2 between shutters 2341 and apertures 2347 that is greater than 0 vim and less than 20 i_tm. In a preferred design, the alignment method is capable of ensuring and overlap W2 that is greater than 0 microns and less than 2 microns The alignment method described above was provided as one example of an alignment method that assigns active control of the motors 3304 to a human operator. In other methods the intervention of an operator is not required to achieve alignment. Intelligent vision (machine vision) systems are available, for example, from the vendors identified above, for the apparatus 3300 (i.e. systems which include digital cameras and computer image processing) that can measure the direction as well-as the amount of misalignment between fiducials on two substrates and then can automatically drive the motors 3304 until the measured misalignment becomes less than a pre-specified level.

The alignment marks or fiducials employed by apparatus 3300 can take many forms, other than those shown or discussed with respect to FIG. 18 below. In some embodiments the operator or the machine vision system is capable of recognizing specific functional patterns on the substrates, such as the shapes of shutter assemblies (e.g. shutters 2202) or apertures (e.g. apertures 2214). The vision system thereby measures and minimizes directly the misalignment between shutters and apertures. In another embodiment, the display edges are cut or diced to a precise position with respect to the positions of the shutters and apertures. The vision system thereby measures and minimizes the misalignment between the edges of the two substrates.

After either a human operator or the automatic alignment system brings the substrates into alignment and establishes contact between the two substrates, the UV exposure lamps 3306 can be employed to at least partially cure the adhesive 3318. The adhesive bonding material 3318 prevents the subsequent relative movement between substrates 3308 and 3310 after alignment has been achieved in apparatus 3300. Alternate means are available for maintaining alignment between the two substrates after alignment. These alternate means include the use of alignment guides, such as alignment guides 2914, and heat reflowable spacer materials such as spacer 2962.

Although the functioning of alignment apparatus 3300 was with the example of display 2340 in the MEMS-down configuration, similar alignment techniques can be useful when applied to the MEMS-up configuration, as illustrated by display apparatus 500. In display assembly 500 the shutter assemblies 502 are formed on substrate 504 while the black matrix and associated apertures 524 are formed on substrate 522. The two substrates 504 and 522 can be aligned using alignment apparatus 3300 such that an overlap exists between at least one edge of the shutters 503 and the edge of a corresponding aperture in black matrix 524. The alignment apparatus 3300 ensures an overlap between edges of between 0 and 20 microns. In a preferred design, the alignment method ensures an overlap that is greater than 0 microns and less than 5 microns, or in some cases, less than 2 microns.

Although the functioning of alignment apparatus 3300 was described for a display incorporating transverse-shutter-based light modulators, such as shutter assembly 2341, it will be understood that the alignment apparatus 3300 and alignment method described above can be usefully applied to alternate MEMS light modulator technologies. For instance, the electrowetting modulator array 2600 benefits when the aperture plate 2632 is aligned to the modulator substrate 2630 such that an overlap is established between the edge of the oil 2610 and the edge of apertures 2617 in the light-obstructing, filtered, or dark state. Similarly rolling actuator light modulators, such as light modulator 220 can be fabricated and aligned in similar fashion, wherein an overlap is provided between the light obstructing edge of the roller-actuator-modulator on a first substrate and the edge of a corresponding aperture which has been patterned on a second substrate.

Other non-shutter-based modulators can benefit from the alignment apparatus 3300 and method described above. For instance, a MEMS interference modulator or a MEMS light tap modulator, such as light modulator 250, fabricated on a first substrate can be aligned to the edge of a black matrix fabricated on a second substrate. Details of these light modulators can be found in U.S. Pat. Nos. 6,674,562 and 5,771,321, incorporated herein by reference.

Panel Fabrication Processes

Manufacturing productivity is increased whenever the modulator arrays for multiple displays can be built in parallel fashion on the same glass or plastic substrate. Large glass substrates, referred to as panels, and associated fabrication equipment, are now available in sizes up to 2 meters square. FIG. 18 illustrates how multiple arrays of MEMS light modulators can be formed onto one large modulator substrate 3402 while multiple arrays of aperture holes can be formed on a large aperture plate 3404, according to an illustrative embodiment of the invention. The panel 3402 includes a set of 6 modulator arrays 3406 plus a set of four modulator alignment marks 3408. The panel 3404 includes a set of six aperture arrays 3410 plus a set of four aperture alignment marks 3412. Each of the modulator arrays 3406 is designed to correspond to one of the aperture arrays 3410, such that when the panels 3402 and 3404 are aligned and sealed together, the corresponding modulator array—aperture array pairs will each form a display assembly, also referred to as a cell assembly. A single alignment and sealing operation between substrates 3402 and 3404, then, suffices to simultaneously align and seal 6 cell assemblies. For the example shown in 18, the glass panels 3402 and 3704 are 30 cm in diagonal while each of the cell assemblies or display areas would be 10 cm in diagonal. In other embodiments, panels as large as or larger than 50 cm in diagonal may be employed to fabricate up twenty five 10 cm diagonal displays per panel.

Also shown are the epoxy adhesive lines (one type of seal material) 3414, and spacer posts 3416 added to each of the arrays on the aperture plate 3404. A variety of spacers are applied to the interior of each array on aperture plate 3404, as described with respect to display assemblies 2340, 2700, 2800, 2900, and 3000 and 3100, and 3200 above. The process for applying the adhesive will be described below with respect to the cell assembly step 3614.

Figure 19:
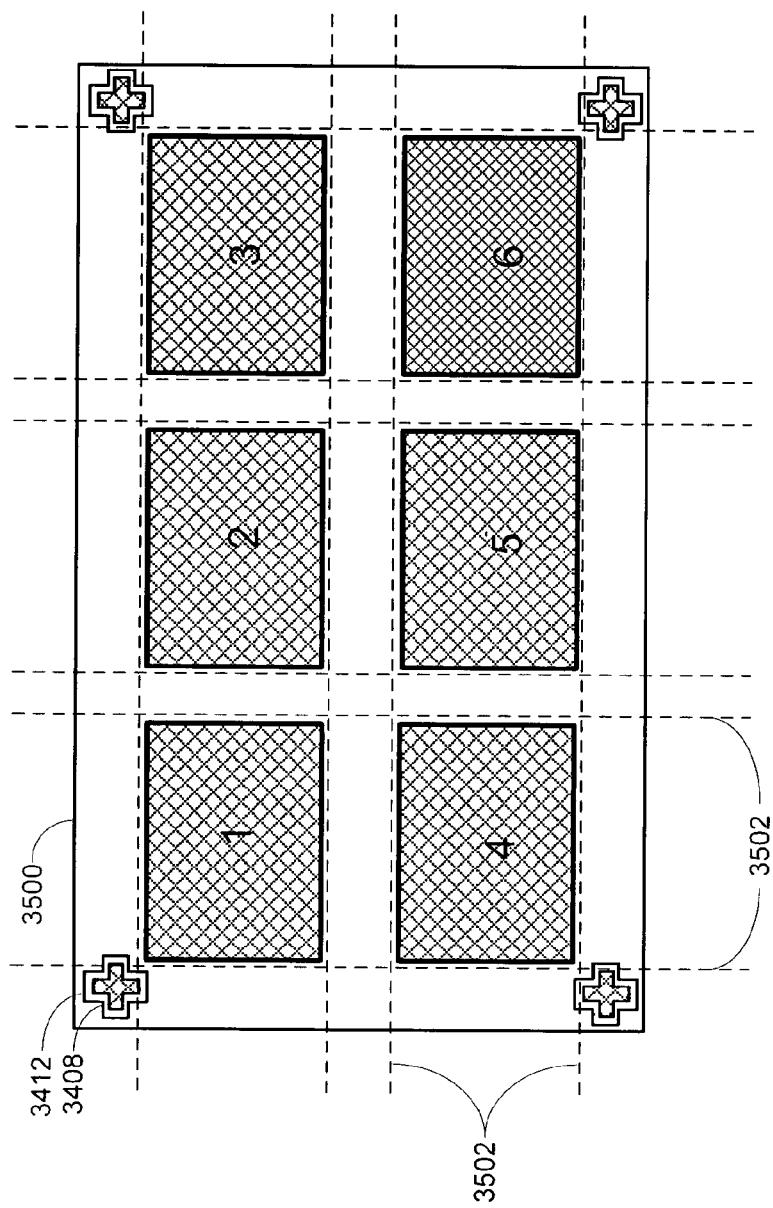
FIG. 19 is a plan view of a panel assembly after alignment, according to an illustrative embodiment of the invention.

A panel assembly 3500, after completion of alignment and seal of panels 3402 and 3404, is illustrated in the FIG. 19, according to an illustrative embodiment of the invention. Successful alignment of the two substrates is indicated by the nesting of the modulator alignment marks 3408 within the aperture alignment marks 3412. The alignment marks can be designed such that a nominal 1 p.m gap is allowed between the inner edge of the mark 3412 with the outer edge of the mark 3408 (the magnitude of these gaps is exaggerated in FIG. 19 for purposes of illustration). In this alignment design, the operator and/or automatic alignment system adjusts the relative position of the substrates in the tool 3300 until appropriate gaps are visible in both the x and y directions for the nested alignment marks, e.g., until none of the lines are crossed or touching. When the appropriate gaps are visible the alignment is considered successful, i.e. misalignment has been reduced to within an acceptable error and the expected overlap between modulators and apertures in each of the arrays 3406 and 3410 has been achieved. The nominal gap between alignment marks can be designed to match the anticipated precision of the alignment process, e.g. the gap can be 10 microns, or 2 microns, or 1 micron depending on the alignment precision desired. In an alternate design, one alignment mark is a circular dot while the other mark is shaped as a ring. A gap can be designed between the dot and the ring corresponding to the desired alignment precision. In some alignment machine designs, a gap between alignment marks is not required; instead the machine uses a digital camera to estimate the center points of both dot and ring. The alignment software then seeks to align the center-points of dot and ring.

The two panels 3402 and 3404 are bonded in place by an adhesive. The curing of this adhesive is described below with respect to the cell assembly step 3620.

FIG. 19 also illustrates a set of dicing lines 3502 superimposed upon the panel assembly 3500. The dicing lines 3502 mark the lines along which the panel will be cut so that individual arrays, also referred to as displays or cell assemblies, can be separated from panel. The separation process, also referred to a singulation, can be accomplished by means of a scribe and break method. In this process a diamond or carbide tip is used to scratch a line along the surface of the glass panels at lines 3502. A simple bending process can then be used to break the panels along the scribe lines. In another embodiment the separation or singulation process is accomplished by means of a dicing saw. It is not necessary that both substrates 3402 and 3408 be cut along the same dicing lines. It is often advantageous that the modulator substrate be diced to a perimeter width that is wider than that prescribed for the aperture substrate This allows room for the bonding of driver chips, after cell assembly is complete, on the edge of the modulator substrate.

Cell Assembly Methods Including Fluid Fill

Figure 20:
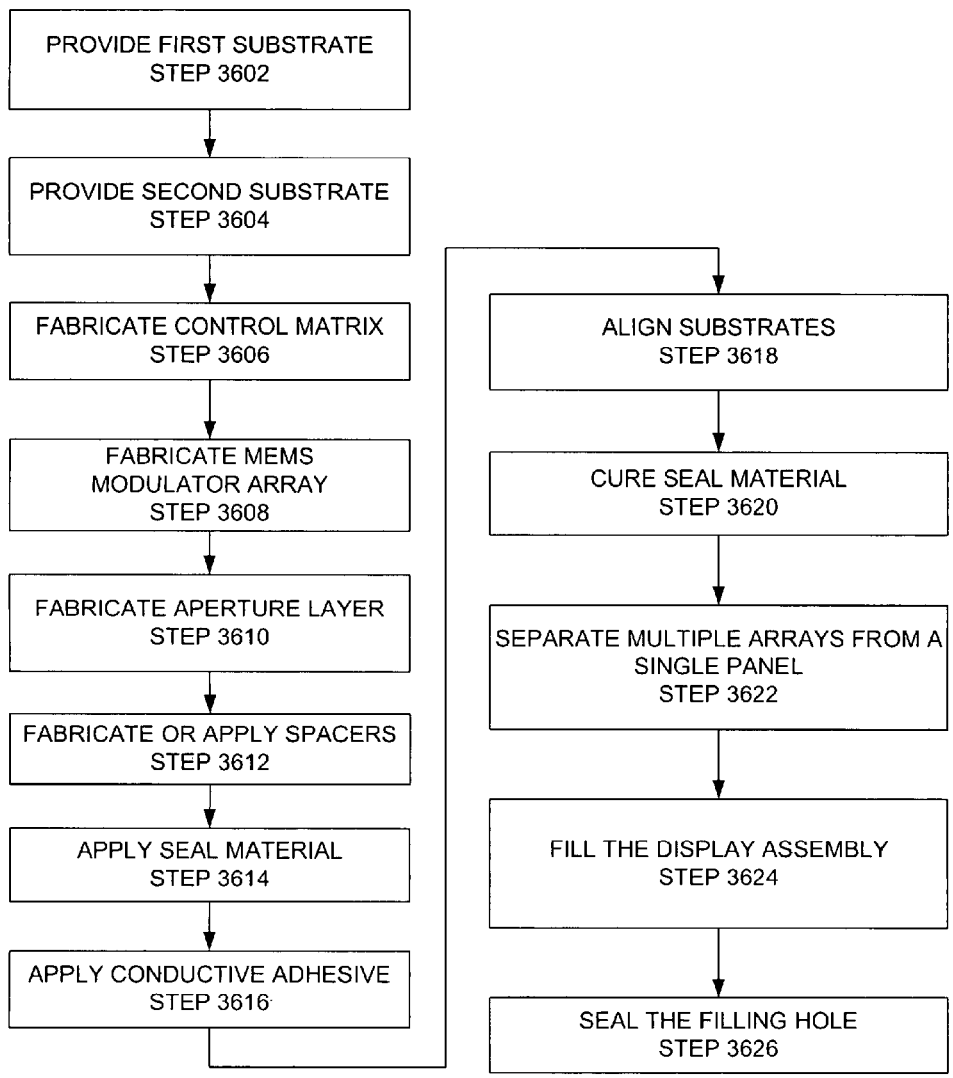
FIG. 20 is a flow chart of a cell assembly method, according to an illustrative embodiment of the invention.

FIG. 20 illustrates a first method 3600 for assembling a display apparatus (also referred to as cell assembly method 3600) incorporating MEMS light modulators, according to an illustrative embodiment of the invention. The method 3600 begins with the provision of two substrates (steps 3602 and 3604) upon which the display components are fabricated (steps 3606, 3608, and 3610). The method continues with the application of spacers (step 3612) and sealing materials (step 3614) to one or the other of the two substrates; the substrates are then aligned and bonded together. The method includes the separation or singulation of individual displays from a larger panel assembly (step 3622) and the filling of the gap between the two substrates with a fluid or lubricant (step 3624). Finally, a filling hole is sealed (step 3626).

A first embodiment of method 3600 will be described with respect to a MEMS-down display assembly, as illustrated by display apparatus 2340 or 2600. A second embodiment, for assembly of displays in the MEMS-up configuration, will be described thereafter.

The cell assembly method 3600 for MEMS-down displays begins with provision of two substrates at steps 3602 and 3604. Both of these substrates are transparent, made from glass or plastic. The assembly method continues with the fabrication of a control matrix, at step 3606, and the fabrication of the MEMS modulator array, at step 3608. In a preferred embodiment both the control matrix and the modulator array are fabricated onto the first substrate, referred to as the modulator substrate. Examples include substrates 2342 and 2630 of FIGS. 7 and 10, respectively. As discussed with respect to display assembly 3100, however, there are embodiments where the control matrix can be fabricated on a substrate distinct from the modulator substrate and be electrically connected to it by means of electrically conductive spacers. Further detail on the fabrication of the modulator substrate can be found in the U.S. patent application Ser. No. 11/361,785 referenced above.

The MEMS-down assembly method 3600 proceeds at step 3610 with the fabrication of an aperture layer. The aperture layer is fabricated onto the second substrate, which is preferably made of a transparent material, e.g. plastic or glass. In the MEMS-down configuration the second substrate is referred to as the aperture plate. Illustrative operative plates include aperture plates 2346 or 2632 of FIGS. 7 and 10. In other MEMS-down embodiments the second substrate, on which the aperture layer is fabricated, is also be utilized as a light guide. In some embodiments, the aperture layer is composed of a light absorbing material which is patterned into a series of apertures. In a preferred embodiment, described with respect to aperture plate 2700, the aperture layer is designed to reflect light incident from the substrate back toward the substrate. Illustrative reflective aperture layers include reflective aperture layers 2616 or 2704 of FIGS. 10 and 11, respectively.

The method 3600 continues at step 3612 with the application of spacers. Any of the spacers illustrated by the spacers 2357, 2708, 2812, 2814, 2912, 2914, 2962, 2964, 3020, or 3112 including the fabrication methods described therefore can be incorporated at step 3612. The spacers may be formed onto either or both of the first and second substrates.

The method 3600 continues at step 3614 with the application of a seal material, such as the epoxy seal material 528. The seal material can be applied to either or both of the first and second substrates employed by the method 3600. The seal material is an adhesive bonding material, which will maintain the position of the first and second substrates after the alignment step. The seal material is also used to contain the fluid, to be added at step 3624, within the gap between the two substrates. Applicable seal materials can be a polymer material such as an epoxy, an acrylate, or a silicone material or the seal material can be formed from a heat-reflowable solder metal such as solder bump 2962. In some embodiments the seal material can be a composite material, such as the anisotropic conductive adhesive 3214. The seal material can be dispensed from a nozzle, which moves along the periphery of each of the modulator or aperture arrays, as shown for display panel 3404 in FIG. 18. The seal material 3414 does not completely encircle the periphery of each display area on display panel 3404. A gap 3418, referred to as the filling hole, is intentionally left in the peripheral seal to accommodate the filling of the cell with fluid at step 3624.

After dispense, a seal material undergoes a cure step to become relatively hard and rigid. Although seal material may be partially cured as part of the step 3614, in many embodiments a final cure does not occur until one of the later steps 3618 or 3620. The seal material may be formulated to allow for many alternate types of curing, including desiccation curing, UV or ultraviolet curing, thermal curing, or microwave curing. When employing an alignment tool, such as the apparatus 3300, a UV-cured epoxy can be preferred.

Figure 18:
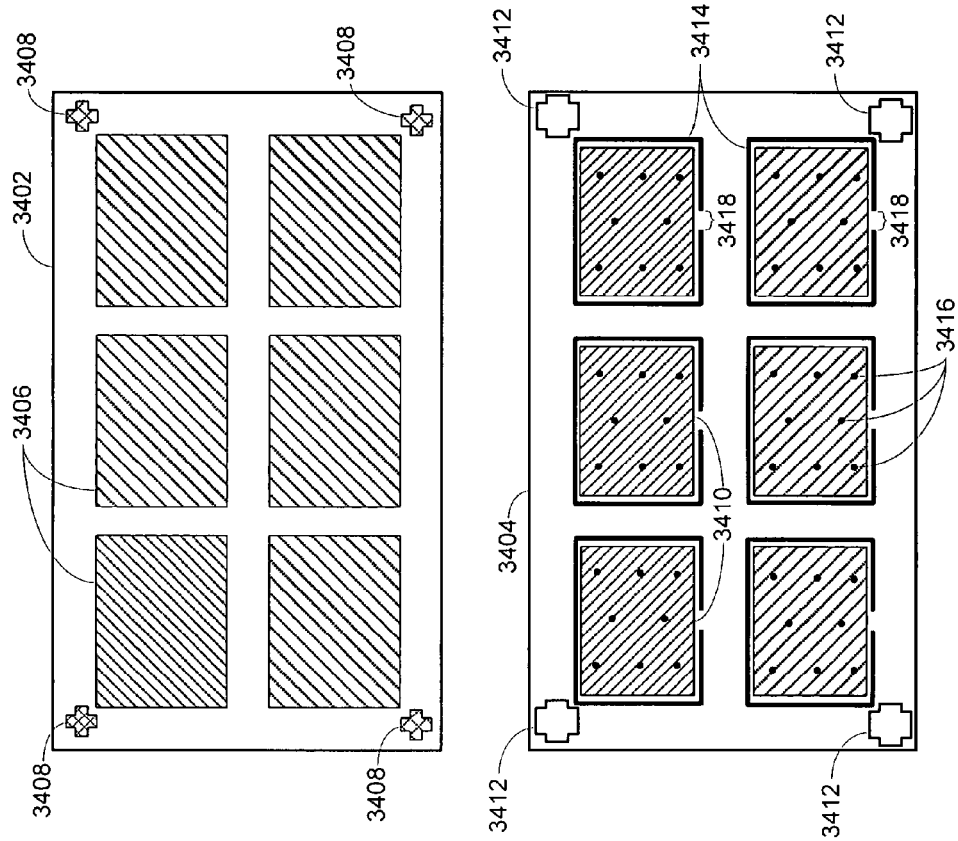
FIG. 18 is a plan view of a modulator substrate and an aperture plate comprising multiple modulator and aperture arrays respectively, according to an illustrative embodiment of the invention.

As indicated in FIGS. 18 and 19, the steps for fabrication of the control matrix 3606, fabrication of MEMS modulators 3608, fabrication of the aperture layer 3610, application of spacers 3612, and application of seal material 3614 can all be performed at the panel level where multiple displays are fabricated simultaneously on a large glass or plastic panel. Alternately, these steps may be performed for individual displays on smaller substrates. Further fabrication details for assembly steps 3606, 3608, 3610, and 3612 can be found in the U.S. patent application Ser. No. 11/361,785, referenced above.

The method 3600 continues at step 3616 with the optional dispense of a conductive adhesive. If the spacers or the seal material added at steps 3612 and 3614 do not have a conducting property, then it is often advantageous to add an additional adhesive with this property. The conductive adhesive added at step 3616 allows for an electrical connection between the control matrix on the first substrate and the aperture layer on the second substrate. The adhesive added at step 3616 is usually located at some point along the periphery of the display area.

The method 3600 continues at step 3618 with the alignment of the first and second substrates, as was described with respect to the alignment apparatus 3300 in FIG. 17. The alignment apparatus 3300 includes a camera and/or microscope system for confirming that the alignment is accurate to within an acceptable degree of error. The first and second substrates are brought into contact by means of the spacers as part of the alignment step 3618.

As part of the alignment step 3618 the adhesive bonding material is at least partially cured to bond or maintain the relative positions of the two substrates. The alignment apparatus 3300 includes heaters and/or UV exposure lamps to affect cure of the adhesive. In some embodiments the whole perimeter seal, such as seal 3414, is at least partially cured as part of step 3618. In other embodiments a plurality of uv-curable adhesive dots is provided on the substrates prior to alignment, in addition to a thermally-curable seal material 3414. For this embodiment only the epoxy dots are cured as part of the alignment step 3618, while the remainder of the seal material is cured later, at step 3620.

The method 3600 continues at step 3620 with the cure of the seal material. In many embodiments the proper alignment between first and second substrates can only be maintained when the seal material behaves as a relatively rigid adhesive. The adhesive cure at step 3620 ensures the rigidity of the seal. The cure at step 3620 can be carried out as either a thermal, a UV, or a microwave cure. In some embodiments the seal is cured at step 3620 by placing the assembly into an oven, or UV or microwave exposure system, under pressure or between the plates of a press. The press helps to minimize bending or warping in the substrates while the adhesive is being cured. The press helps to ensure that the gap, such as gap H5 or H9 (shown with respect to display assemblies 2340 and 2390), are maintained by ensuring a rigid contact of each substrate to the spacers, such as spacers 2357.

The method 3600 continues at step 3622 with the optional separation of individual display arrays from a large panel containing multiple arrays. Such separation is only required if the cell assembly steps, up until this point, have proceeded according a large panel process, as described in FIGS. 18 and 19. If the modulation substrate and aperture plates are fabricated as individual displays at steps 3606 to 3614, then no singulation or separation step is necessary. The separation may be accomplished by either a scribe and break process or by a dicing saw.

The method 3600 continues at step 3624 with the filling of the display assembly with fluid. As indicated in the discussions of display apparatus 500 and 2340, the two substrates of a display apparatus are preferably separated by a gap, such as the gap H5, and the gap is filled by a fluid, such as working fluid 530 or 2352. For many displays the fluid acts as a lubricant which substantially surrounds the MEMS light modulators. The fluid also has defined electrical and optical properties as discussed above.

For many applications it is desirable to fill the display assembly with liquid while avoiding the entrapment of gas bubbles in the gap formed between the two substrates. Gas bubbles which form on surfaces of the MEMS light modulators will interfere with the actuation of those modulators. A bubble-free filling process can be accomplished by utilizing a vacuum atmosphere at some point during the fluid fill process.

Figure 21:
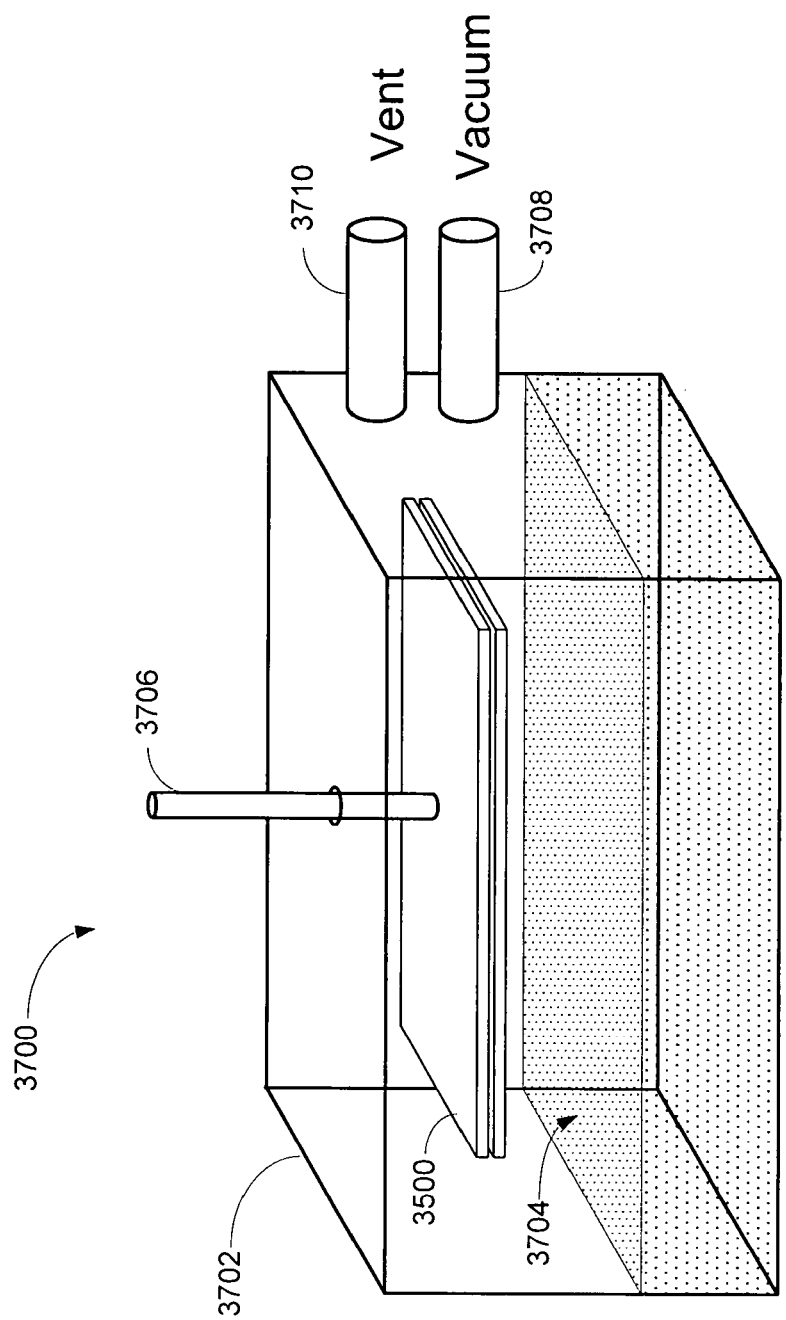
FIG. 21 is conceptual view of a fluid filling apparatus, according to an illustrative embodiment of the invention.

The details of the fluid filling process (step 3624) will be described with respect to the fluid filling apparatus 3700 which is illustrated in FIG. 21, according to an illustrative embodiment of the invention. The fluid fill apparatus is formed from a vacuum chamber 3702 which is partially filled with a reservoir of the working fluid 3704. An aligned and partially sealed cell assembly or panel assembly, such as panel assembly 3500, is suspended above the fluid reservoir by a wand 3706, or alternately by a moveable platter. Attached to the vacuum chamber is a port 3708 leading to a vacuum pump and a port 3710 used to vent the interior of the vacuum chamber to atmospheric pressure. Valves are associated with each of the ports 3708 and 3710, although not shown in FIG. 21.

In operation, the process for filling the gap between the substrates in a panel assembly, such as assembly 3500, is a two-step process. First the air or other gas is removed from between the two plates and, second, the gap is filled by the fluid. Air is removed from between the plates when the valve to the vacuum pump is opened and the whole chamber 3702 is reduced to a pressure substantially below 1 torr. Next the vacuum valve is closed and the wand 3706 is used to immerse the panel assembly 3500 into the reservoir 3704 of the working fluid. Once immersed, the vent valve is opened to the air, or to clean nitrogen or argon gas from a bottle. The returning air brings the pressure on all fluids back to atmospheric pressure (or pressures greater than 600 torr). Under pressure, the working fluid is then forced into the gap between the substrates of cell assembly 3500. When the cell assembly is removed from the chamber 3702 the cell assembly is filled by the fluid, thus completing the assembly step 3624.

In an alternate design, the panel assembly 3500 need not be suspended by a moveable wand, such as wand 3706. Instead the panel assembly can be fixed in place and the lubricant 3705 can be moved into or out of the vacuum chamber 3702 by means of a series of valves. The chamber is evacuated while fluid is largely absent from the chamber. After evacuation, the fluid level in the chamber is increased by flowing additional fluid into the chamber. Fluid is added until the assembly 3500 is immersed in fluid. After immersing the panel in fluid the system is vented to atmospheric pressure to fill the gap with fluid.

In another embodiment the chamber 3702 is not filled with a liquid, as in liquid 3704, but is instead backfilled with a gas after evacuating the chamber. Examples of backfill gases include inert gases (argon, nitrogen), vapor phase lubricants, certain reactive gases, or any combination of the above. The reactive gases are those that can react with or be deposited onto the moving surface of the MEMS modulators. They can chemically pacify or reduce the stickiness of moving surfaces by reducing its surface energy. Examples include, without limitation, dimethyldichlorosilane (DDMS), tridecafluoro-1, 1,2,2-tetrahydrooctyltrichlorosilane (FOTS), and heptadecafluoro-1,1,2,2-tetrahydrodecyltrichlorosilane (FDTS). Vapor phase lubricants are gases that remain in the vapor phase substantially throughout the operation of the device, and are similarly capable of pacifying surfaces. Examples include, without limitation, sulphur hexafluoride, and the vapor phase forms of methanol, ethanol, acetone, ethylene glycol, glycerol, silicone oils, fluorinated silicone oils, dimethylsiloxane, polydimethylsiloxane, hexamethyldisiloxane, and diethylbenzene, or any mixture of the above.

The fluid filling process within chamber 3702 can be executed on either the cell level or the panel level. In assembly process 3600 the singulation step 3622 precedes the fluid filling step 3624, meaning that the cell assemblies for individual displays are loaded into vacuum chamber 3702 for fluid filling. The vacuum fill chamber 3702 can include a platter capable of holding and immersing multiple individual displays in a single pump-down operation—so that multiple displays can be filled with fluid at the same time. Alternately it is possible to reverse the orders of these steps and load a complete panel assembly, such as assembly 3500, into the vacuum chamber. The gaps within each of the displays on the panel are then evacuated and filled at the same time. The dicing or singulation process 3622 then occurs after the fluid filling step 3624 is complete.

A cell assembly is completed in the method 3600 with the sealing of the filling hole, at step 3626. The fluid was allowed or forced into the space between substrates at step 3624 through the filling hole 3418 that was left in the perimeter seal at step 3614. This hole is filled with an adhesive at the end of the assembly process to prevent leakage of the fluid out of the display assembly. As part of step 3626 and prior to sealing the fill hole, pressure can be applied to the cell via a press. The press compresses the two substrates, forcing the spacers fabricated on one substrate, into intimate contact with the other substrate. This establishes a uniform gap or spacing between the two substrates. The fill hole 3418 is then sealed with adhesive prior to removal of pressure from the display. Once sealed, the closed and fluid-filled chamber within the cell prevents the substrates from separating under ambient conditions. The adhesive employed at step 3626 may be a polymer adhesive that is cured using either thermal curing, UV curing, or microwave curing. The final steps for assembling a display, after completion of the method 3600, are often referred to collectively as the module assembly process. The module assembly incorporates the steps of attaching a silicon chip or chips comprising control and drive circuitry directly to the glass substrate, bonding flexible circuits for interconnecting the display to external devices, bonding optical films such as contrast filters, affixing a backlight, and mounting the display into a support structure or enclosure. The flexible circuit may be comprised of simple interconnects or may contain additional electrical elements such as resistors, capacitors, inductors, transistors or integrated circuits.

The cell assembly method 3600 will now be reviewed for its application to the MEMS-up display configuration, examples for which are given by display assemblies 500 and 2400 of FIGS. 5 and 8. For the MEMS-up display configuration both the control matrix and the MEMS modulator array are fabricated on the first substrate at steps 3606 and 3608.

Examples are given as modulator substrates 504 or 2418. An aperture layer is deposited on the second substrate at step 3610.

As discussed with respect to display assembly 3100 there are embodiments where the MEMS modulator array is fabricated on the first substrate while the control matrix can be fabricated on the second substrate. The two substrates are in electrical communication by means of conductive spacers.

For the MEMS-up display configuration the second substrate is referred to as a cover plate, such as cover plate 522. The aperture layer, fabricated at step 3610, is referred to as a black matrix layer, such as black matrix 524, and is patterned into an array of apertures. The black matrix layer is preferably comprised of a light absorbing material to improve the ambient contrast of the display. After assembly, the black matrix apertures preferably overlap the MEMS light modulators which are located on the modulator substrate.

For the MEMS-up display assembly method 3600 the cover plate, i.e. the second substrate provided at step 3604, is preferably made of a transparent material, i.e. plastic or glass. For the MEMS-up assembly method, however, the modulator substrate provided at step 3602 can be made from an opaque material, such as silicon. For instance, for a reflective MEMS-up display, the first substrate, e.g. silicon, can be coated with a reflective layer at one of steps 3606 or 3608. For a transmissive MEMS-up display, an opaque material employed for the first substrate can be etched with an array of through-holes at the positions of apertures, such as apertures 508.

For the MEMS-up display assembly 3600, spacers are applied at step 3612, and seal material is applied at step 3614 to either of the first or second substrates, i.e. either the modulator substrate or the cover plate.

The subsequent steps in a MEMS-up display assembly method 3600 are similar to the MEMS-down display assembly method 3600, including the alignment step 3618, the cure of seal material, step 3620, the separation of individual displays from the panel, step 3622, and fluid filling at step 3624.

As described with respect to the alignment apparatus 3600, the assembly method 3600 in either the MEMS-up or the MEMS-down configuration is applicable to a number of alternate MEMS light modulator technologies, including electrowetting displays and rolling-actuator displays. The MEMS-up display assembly method 3600 is particularly applicable to interference modulator displays and MEMS light tap modulator displays.

Figure 22:
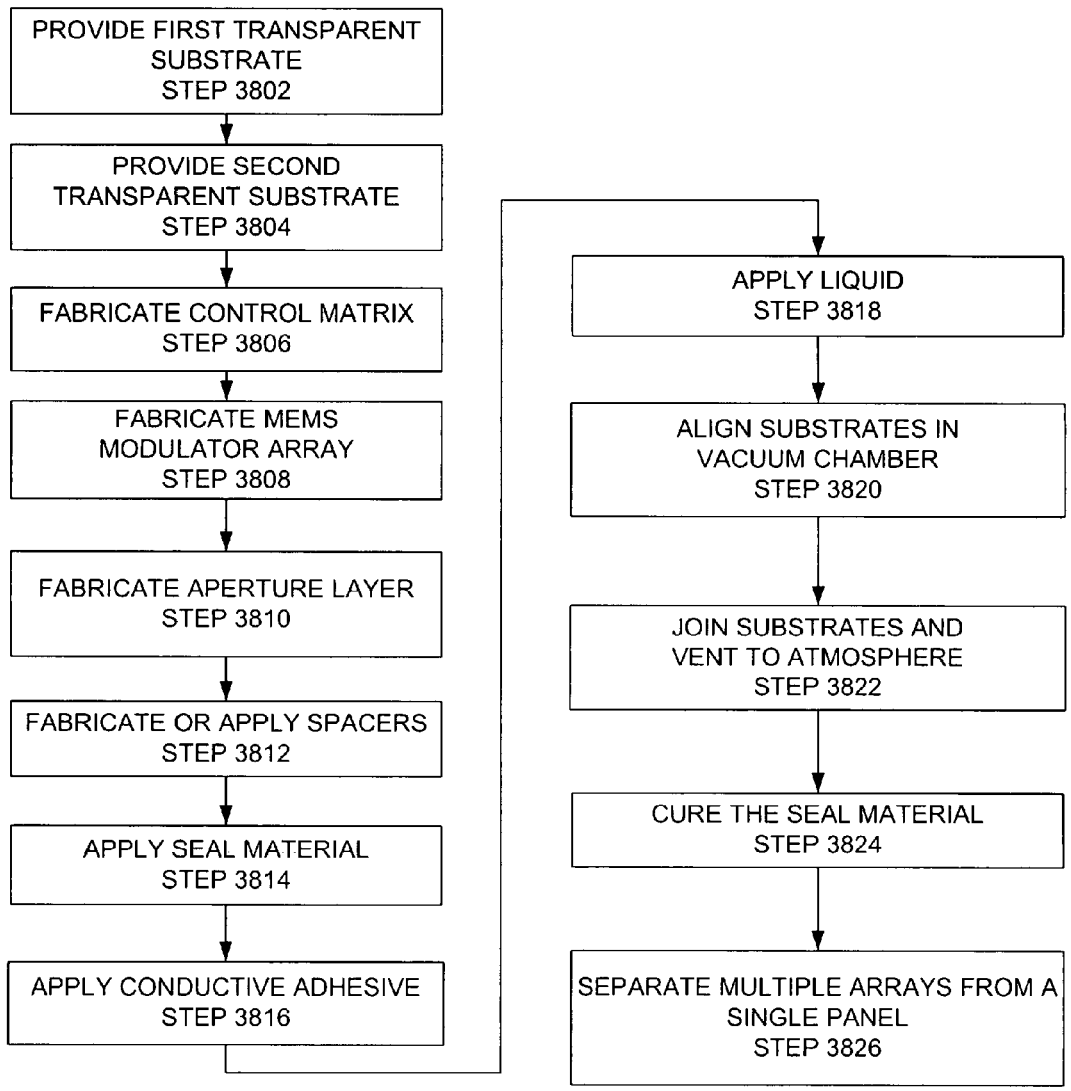
FIG. 22 is a flow chart of a cell assembly method, according to an illustrative embodiment of the invention.

FIG. 22 illustrates an alternative method for assembling a display apparatus incorporating MEMS light modulators. The method 3800 can be employed for assembling displays into either the MEMS-down configuration or the MEMS-up configurations as described with respect to the method 3600. Similar to method 3600, the assembly method 3800 begins with the provision of two substrates (steps 3802 and 3804) upon which the display components are fabricated (steps 3806, 3608, and 3810). The method 3800 continues with the application of spacers (step 3812) and sealing materials (step 3814) to one or the other of the two substrates. The method 3800 also includes filling the gap in a display assembly with fluid (step 3118). However, in contrast to the method 3600, the order of fluid filling (step 3818) and display assembly (steps 3820, 3822, and 3824) are reversed. The assembly method 3800 is sometimes referred to as the one-drop fill method.

The assembly method 3800 begins with the provision of first and second substrates, steps 3802 and 3804 and continues with the fabrication of the control matrix (step 3806), the fabrication of a MEMS modulator array (step 3808), the fabrication of an aperture layer (step 3810), and the application of spacers (step 3812). These steps comprise substantially the same assembly processes as were used for corresponding steps in the assembly method 3600.

The method 3800 continues at step 3814 with the application of a seal material. Similar seal materials and similar dispense methods can be applied at step 3814 as were used for the seal application step 3612. For the step 3814, however, no gap or filling hole is left in the seal material around the periphery of the active areas of the display.

An optional conductive adhesive application, step 3816, follows which is similar to the adhesive application step 3616.

The method 3800 continues at step 3818 with the application of a liquid. The applicable liquids, comprising lubricating and other electrical, mechanical, and optical properties were described above with respect to display apparatus 500. For a liquid filling step (step 3800), a vacuum filling apparatus, such as apparatus 3700 is not necessary. A correct volume of fluid can be dispensed directly onto the open face of one of the first or second substrates. The fluid is preferably dispensed on the second substrate on which the aperture layer is formed, as this substrate generally has no MEMS components with cavities or re-entrant surfaces where air bubbles might collect. When the substrates are large panels incorporating multiple displays, as in panel 3404, a correct volume of fluid is dispensed into the active area of each array. Generally, the fluid will spread over the face of the substrate until confined by the perimeter of seal material 3414. A correct volume of fluid will completely fill the cavity defined by the perimeter seal. In some embodiments an optical measurement tool is used to determine an accurate volume for each cavity before filling—by measuring actual perimeter dimensions for individual arrays on the panel.

The method 3800 continues at step 3820 with the alignment of the two substrates. As the lubricating fluid has already been applied to one of the substrates, the alignment apparatus required for step 3800 will differ from that shown by apparatus 3300. As a primary difference, the alignment operation is preferably carried out under reduced pressure or vacuum conditions. This means that the first and second substrates, as well as many of the moving parts and parts of the vision system provided for alignment are now operated within a vacuum chamber, referred to as an alignment chamber.

In operation the two substrates would be introduced to the alignment chamber and the chamber would be evacuated. To prevent evaporation of the fluid (already dispensed as at step 3818), the chamber may be backfilled to an equilibrium vapor pressure of the lubricating fluid. After the two substrates are aligned and brought together, the lubricating fluid will make contact with the surface of each of the two substrates and will substantially surround each of the moving parts of the MEMS light modulators. After the substrates are in contact and the fluid has wet all surfaces, the alignment chamber is vented back to atmospheric pressure (at step 3822). A partial cure can also be applied to the adhesive after the substrates have been brought into contact. The adhesive can be cured by either thermal means or by means of UV lamps installed within the vacuum chamber.

In some embodiments, where the lubricating fluid has a high vapor pressure, i.e. where it can evaporate quickly at ambient temperatures, it may not be practical to dispense the fluid at step 3818 before the panels are introduced into the alignment chamber. For this embodiment, after the alignment chamber has been evacuated and backfilled with a vapor pressure of the lubricant, a nozzle can be provided which dispenses the lubricating fluid onto one of the substrates immediately before the step of aligning of the two substrates.

To the extent that the seal material was not completely cured during the alignment operation at step 3820, a further curing step is applied at step 3824. The cure at step 3824 can be carried out as either a thermal, a UV, or a microwave cure.

The method 3800 is completed at step 3826 with the optional separation of individual display arrays from a large panel containing multiple arrays. Such separation is only required if the cell assembly steps up to this point have proceeded according a large panel process, as described in FIGS. 18 and 19. If the modulation substrate and aperture plates where fabricated in the form of individual displays at steps 3806 to 3814, then no final separation step is necessary. The separation may be accomplished by means of either a scribe and break process or by use of a dicing saw.

The final steps for assembling a display, after completion of the method 3600, are often referred to collectively as the module assembly process. The module assembly incorporates the steps of attaching a silicon chip or chips comprising control and drive circuitry directly to the glass substrate, bonding flexible circuits for interconnecting the display to external devices, bonding optical films such as contrast filters, affixing a backlight, and mounting the display into a support structure or enclosure. The flexible circuit may be comprised of simple interconnects or may contain additional electrical elements such as resistors, capacitors, inductors, transistors or integrated circuits.

The invention may be embodied in other specific forms without departing from the spirit or essential characteristics thereof. The forgoing embodiments are therefore to be considered in all respects illustrative, rather than limiting of the invention.

What is claimed is:

1. A display comprising:
   a first layer of material including a plurality of apertures, each aperture having at least one side;
   a first substrate being separated from the first layer of material by a gap, the first substrate arranged to pass through a portion of light emitted from a light source into the gap; and
   a plurality of movable shutters arranged within the gap between the first layer of material and the first substrate, the shutters movable to at least a first position and a second position, to obstruct passage of the portion of light through respective ones of the plurality of apertures at the first position, the movable shutters each having a first edge and a second edge, and in the first position, a respective movable shutter being aligned with a respective one of the apertures such that its first edge extends about a first length past a first side of the respective aperture and its second edge extends about the first length past a second side of the respective aperture;
   wherein the first length is greater than or equal to a distance between the movable shutter and the first layer of material.

2. The display of claim 1, further comprising a second layer of material arranged over a surface of the first substrate, the second layer of material having an additional aperture with at least one side, one of the movable shutters being aligned with the additional aperture.

3. The display of claim 2, wherein the first edge of the one of the movable shutters in the first position extends a second length past at least one side of the additional aperture.

4. The display of claim 3, wherein the first length is substantially the same as the second length.

5. The display of claim 2, wherein the portion of light passes through the additional aperture and into the gap.

6. The display of claim 1, wherein the first substrate is substantially transparent.

7. The display of claim 1, wherein the first length is more than 0 microns and less than about 5 microns.

8. The display of claim 1, wherein the first length is more than 0 microns and less than about 20 microns.

9. The display of claim 1, wherein a side of one of the shutters facing away from its respective aperture includes at least one of a reflective material and a light-absorbing material.

10. The display of claim 1, wherein a side of one of the shutters facing toward its respective aperture includes a light-absorbing material.

11. The display of claim 2, wherein the second layer of material includes at least one of a mirror, a dielectric mirror, a metallic film, a metal, and a reflective material.

12. The display of claim 2, wherein a side of the second layer of material facing toward the gap includes a light-absorbing material.

13. The display of claim 2, wherein a side of the second layer of material facing away from the gap includes a reflective material.

14. The display of claim 2, wherein the second layer of material includes both a reflective layer and a light-absorbing layer.

15. The display of claim 1, wherein a side of the first layer of material facing toward the gap includes a light-absorbing material.

16. The display of claim 1, further comprising a second substrate, the first layer of material being arranged over a surface of the second substrate.

17. The display of claim 1, further comprising an actuator for moving the shutter between the first position and the second position, a portion of the actuator being arranged adjacent to the first layer of material.

18. The display of claim 2, further comprising an actuator for moving the one of the shutters between the first position and the second position, a portion of the actuator being arranged adjacent to the second layer of material.

* * * * *